United States Patent
Zhang et al.

(10) Patent No.: US 11,502,693 B2
(45) Date of Patent: Nov. 15, 2022

(54) CHIP FREQUENCY MODULATION METHOD AND APPARATUS OF COMPUTING DEVICE, HASH BOARD, COMPUTING DEVICE AND STORAGE MEDIUM

(71) Applicant: CANAAN CREATIVE CO., LTD., Beijing (CN)

(72) Inventors: Nangeng Zhang, Beijing (CN); Yingtao Xu, Beijing (CN)

(73) Assignee: CANAAN CREATIVE CO., LTD., Beijing (CN)

( * ) Notice: Subject to any disclaimer, the term of this patent is extended or adjusted under 35 U.S.C. 154(b) by 58 days.

(21) Appl. No.: 17/250,071

(22) PCT Filed: Apr. 24, 2019

(86) PCT No.: PCT/CN2019/084064
§ 371 (c)(1),
(2) Date: Nov. 18, 2020

(87) PCT Pub. No.: WO2019/233206
PCT Pub. Date: Dec. 12, 2019

(65) Prior Publication Data
US 2021/0203328 A1    Jul. 1, 2021

(30) Foreign Application Priority Data
Jun. 6, 2018    (CN) .......................... 201810576556.3

(51) Int. Cl.
G06F 1/06    (2006.01)
H03L 7/085    (2006.01)
(Continued)

(52) U.S. Cl.
CPC ............... *H03L 7/085* (2013.01); *G06F 1/06* (2013.01); *G06F 1/08* (2013.01); *G06F 1/3228* (2013.01); *G06F 7/58* (2013.01); *G06F 9/5044* (2013.01)

(58) Field of Classification Search
CPC ... H03L 7/085; G06F 1/06; G06F 1/08; G06F 1/3228; G06F 7/58; G06F 9/5044
See application file for complete search history.

(56) References Cited

U.S. PATENT DOCUMENTS 7,353,421 B1 * 4/2008 Smithson .................. G06F 1/06
  713/320
7,671,627 B1    3/2010 Somani et al.
(Continued)

FOREIGN PATENT DOCUMENTS

CN    103426453 A    12/2013
CN    104360822 A    2/2015
(Continued)

OTHER PUBLICATIONS

International Search report dated Jul. 25, 2019 in related PCT Application No. PCT/CN2019/084064.
(Continued)

*Primary Examiner* — Aurel Prifti

(57) ABSTRACT

The invention provides a chip frequency modulation method and apparatus of a computing device, a hash board, a computing device and a storage medium. The chip frequency modulation method comprises: setting a plurality of working frequencies for the operational chip and causing the plurality of cores work at the respective working frequencies; analyzing a computing performance indicator of each core at its current working frequency; and modulating the current working frequency of the core up or down according to the computing performance indicator of the core modulating the frequency of a core with high computing perfor- (Continued)

mance up and modulating the frequency of a core with low computing performance down. Therefore, the invention can automatically modulate a frequency corresponding to each core according to the actual computing performance of each core in the operational chip of the computing device, thereby maximizing the computing performance of the cores.

26 Claims, 15 Drawing Sheets

(51) Int. Cl.
*G06F 7/58* (2006.01)
*G06F 9/50* (2006.01)
*G06F 1/08* (2006.01)
*G06F 1/3228* (2019.01)

(56) References Cited

U.S. PATENT DOCUMENTS

| | | | | |
|---|---|---|---|---|
| 8,484,498 B2* | 7/2013 | Branover | G06F 1/3203 | 713/323 |
| 9,479,029 B2* | 10/2016 | Fukase | H02K 9/28 | |
| 9,660,799 B1* | 5/2017 | Gendler | G06F 1/10 | |
| 2002/0124178 A1* | 9/2002 | Kocher | H04L 9/003 | 713/193 |
| 2006/0026447 A1* | 2/2006 | Naveh | G06F 1/324 | 713/322 |
| 2006/0090161 A1* | 4/2006 | Bodas | G06F 9/5044 | 718/100 |
| 2007/0049133 A1* | 3/2007 | Conroy | G06F 1/30 | 439/894 |
| 2008/0189569 A1* | 8/2008 | Chu | G06F 1/3203 | 718/100 |
| 2009/0132844 A1* | 5/2009 | Allarey | G06F 15/82 | 713/340 |
| 2009/0150695 A1* | 6/2009 | Song | G06F 1/28 | 713/323 |
| 2010/0083021 A1* | 4/2010 | Allarey | G06F 1/30 | 712/32 |
| 2011/0154089 A1* | 6/2011 | Wolfe | G06F 1/04 | 713/501 |
| 2012/0185703 A1* | 7/2012 | Machnicki | G06F 1/3203 | 713/300 |
| 2013/0007413 A1* | 1/2013 | Thomson | G06F 1/3296 | 712/30 |
| 2013/0043917 A1* | 2/2013 | de Cesare | H03L 7/07 | 327/150 |
| 2013/0111236 A1* | 5/2013 | Ananthakrishnan | G06F 1/3234 | 713/320 |
| 2013/0151877 A1* | 6/2013 | Kadri | G06F 1/3203 | 713/320 |
| 2014/0281612 A1* | 9/2014 | Varma | G06F 1/3203 | 713/322 |
| 2014/0281657 A1* | 9/2014 | Wolfe | G06F 11/34 | 713/501 |
| 2015/0058650 A1* | 2/2015 | Varma | G06F 9/4893 | 713/320 |
| 2015/0113304 A1* | 4/2015 | Kim | G06F 1/324 | 713/322 |
| 2015/0186185 A1* | 7/2015 | Zaroo | G06F 9/5055 | 718/104 |
| 2015/0309897 A1 | 10/2015 | Shan et al. | | |
| 2016/0048181 A1* | 2/2016 | Rosenzweig | G01K 13/00 | 713/322 |
| 2016/0070327 A1* | 3/2016 | Nemani | G06F 1/3206 | 713/300 |
| 2016/0179173 A1* | 6/2016 | Eastep | G06F 1/3234 | 713/320 |
| 2016/0327999 A1* | 11/2016 | Chang | G06F 1/206 | |
| 2016/0328209 A1* | 11/2016 | Pape | G06F 7/582 | |
| 2018/0039324 A1* | 2/2018 | Lee | G06F 1/324 | |
| 2018/0088647 A1* | 3/2018 | Suryanarayanan | G06F 1/3243 | |
| 2018/0136937 A1* | 5/2018 | Yang | G06F 9/3001 | |
| 2018/0232034 A1* | 8/2018 | DiBene, II | G06F 1/3206 | |
| 2019/0163229 A1* | 5/2019 | Fahim | G06F 1/324 | |
| 2021/0157381 A1* | 5/2021 | Goffman-Vinopal | G06F 1/324 | |
| 2021/0263575 A1* | 8/2021 | Liu | G11C 5/147 | |
| 2021/0373961 A1* | 12/2021 | Syed | G06F 9/5061 | |

FOREIGN PATENT DOCUMENTS

| | | |
|---|---|---|
| CN | 105898405 A | 8/2016 |
| CN | 106774767 A | 5/2017 |
| CN | 106855838 A | 6/2017 |
| CN | 109086130 A | 12/2018 |
| WO | WO-2019120295 A1 * | 6/2019 ............ G06F 1/26 |

OTHER PUBLICATIONS

European Search Report for European Patent Application No. 19814964.3 dated Feb. 2, 2022.
First Search for Chinese Application No. 201810576556.3 dated Jul. 13, 2020.
International Preliminary Report on Patentability Chapter I for PCT Application No. PCT/CN2019/084064 dated Dec. 17, 2020.
Written Opinion of the International Search Authority for PCT Application No. PCT/CN2019/084064 dated Jul. 25, 2019.

* cited by examiner

CHIP FREQUENCY MODULATION METHOD AND APPARATUS OF COMPUTING DEVICE, HASH BOARD, COMPUTING DEVICE AND STORAGE MEDIUM

BACKGROUND OF THE INVENTION

1. Field of the Invention

The invention relates to the technical field of chip frequency modulation of a computing device, and particularly to a chip frequency modulation method and apparatus of a computing device, a hash board, a computing device and a storage medium.

2. Related Art

Generally, in the computing device for mass data operation, a large number of operational chips are integrated, and due to limitation of manufacturing process of the operational chips, working performances, hash rates and frequencies of different operational chips are different. Meanwhile, the single operational chip is often formed of a plurality of separate cores, and differences such as process variation and voltage drop at different positions of the operational chip also allow actual working performances of the respective cores to be different. With respect to differences of working performances of different operational chips and cores, how to dynamically modulate actual desired frequencies of the operational chips, and set self-adaptive schemes of the respective cores are urgent problems to be solved. Frequencies supplied for each operational chip and core in the current computing device are consistent, so it is impossible to play computing advantages of the core with good performance, and the core with poor performance has influence on the operational performance of the operational chips, thereby influencing the operational performance of the overall computing device.

In addition, the Chinese patent application CN201611169618.6 discloses a series power supply chip and system, a virtual digital mining machine and a server, comprising a regulator circuit connected to the series power supply chips, respectively, and regulating voltages, temperatures or frequencies of the series power supply chips. When regulating the frequencies of the respective series power supply chips, the regulator circuit detects whether a working state of units to be powered in the series power supply chips is normal according to a preset cycle with respect to the series power supply chips, and if the working state of units to be powered is abnormal, improves or reduces working frequencies of the units to be powered in the abnormal working state according to a preset frequency step within the range of a preset frequency. According to a state indicated by a state register of the unit to be powered, whether the working state of the unit to be powered is normal is judged, and the state indicated by the state register includes a voltage state, a temperature state and a working frequency state; or according to feedback data of data sent from the units to be powered to the unit to be powered, whether the working state of the unit to be powered is normal is judged.

In one embodiment disclosed by the Chinese patent application CN201611169618.6, when regulating the frequencies of the respective series power supply chips, the regulator circuit, as a frequency regulator circuit, can particularly detect whether a working state of units to be powered in the series power supply chips is normal through a detector according to a preset cycle with respect to the series power supply chips, and if the working state of units to be powered is abnormal, can particularly improve or reduce working frequencies of the units to be powered in the abnormal working state through a detector according to a preset frequency step within the range of a preset frequency. As can be seen, CN201611169618.6 discloses that the regulator can regulate frequencies of the chips, but only regulate the working frequencies of the chips according to working states such as whether the units to be powered send and receive data normally, the voltage state, the temperature state and the frequency state, and the frequency regulation mechanism lacks accuracy, and cannot fully play the operational performance of the chips.

To sum up, the prior art obviously has inconveniences and deficiencies in practical use, so it is necessary to make improvement.

SUMMARY OF THE INVENTION

With respect to the above deficiencies, an object of the invention is to provide a chip frequency modulation method and apparatus of a computing device, a hash board, a computing device and a storage medium, which can automatically modulate a frequency corresponding to each core according to the actual computing performance of each core in the operational chip of the computing device, thereby maximizing the computing performance of the cores and improving the operational performance of the operational chip and the overall operational device.

The invention provides a chip frequency modulation method of a computing device, the computing device provided with at least one operational chip, and the operational chip provided with a plurality of cores, comprising steps of:

setting a plurality of working frequencies for the operational chip of the computing device and causing the plurality of cores in the operational chip to work at the respective working frequencies;

analyzing a computing performance indicator of each core at its current working frequency; and modulating the current working frequency of the core up or down according to the computing performance indicator of the core.

According to the chip frequency modulation method of the invention, the step of setting a plurality of working frequencies for the operational chip of the computing device and causing the plurality of cores in the operational chip to work at the respective working frequencies further comprises:

setting the plurality of working frequencies for the operational chip through a plurality of phase locked loops, the working frequencies and the phase locked loops being in a one-to-one correspondence relationship;

the step of modulating the current working frequency of the core up or down according to the computing performance indicator of the core further comprises:

modulating the current working frequency of the core up or down through the phase locked loops according to the computing performance indicator of the core.

According to the chip frequency modulation method of the invention, the phase locked loops are provided inside or outside the operational chip.

According to the chip frequency modulation method of the invention, a frequency difference between the adjacent working frequencies is from 1% to 10%.

According to the chip frequency modulation method of the invention, the step of analyzing a computing performance indicator of each core at its current working frequency further comprises:

analyzing whether the computing performance indicator of the core reaches predetermined first, second and/or third indicator thresholds within a predetermined modulation period, the first indicator threshold being the same as or different from the second indicator threshold;

the step of modulating the current working frequency of the core up or down according to the computing performance indicator of the core further comprises:

if the computing performance indicator of the core reaches the first indicator threshold, modulating the current working frequency of the core up to the upper working frequency;

if the computing performance indicator of the core does not reach the second indicator threshold, modulating the current working frequency of the core down to the lower working frequency; and/or if the computing performance indicator of the core reaches the third indicator threshold, modulating the current working frequency of the core down to the lower working frequency.

According to the chip frequency modulation method of the invention, it further comprises:

if the cores worked at the predetermined at least one optimized working frequency exceed a predetermined first ratio, stopping modulating the frequencies of the cores; or if the number of cores worked at the at least one optimized working frequency is maximum, stopping modulating the frequencies of the cores.

According to the chip frequency modulation method of the invention, the step of analyzing a computing performance indicator of each core at its current working frequency further comprises:

analyzing whether a computing correct ratio of the core reaches predetermined first and/or second correct ratio thresholds within a predetermined modulation period, the first correct ratio threshold being the same or different from the second correct ratio threshold;

the step of modulating the current working frequency of the core up or down according to the computing performance indicator of the core further comprises:

if the computing correct ratio of the core reaches the first correct ratio threshold, modulating the current working frequency of the core up to the upper working frequency; and/or if the computing correct ratio of the core does not reach the second correct ratio threshold, modulating the current working frequency of the core down to the lower working frequency.

According to the chip frequency modulation method of the invention, the step of analyzing whether a computing correct ratio of the core reaches predetermined first and/or second correct ratio thresholds within a predetermined modulation period further comprises:

analyzing whether random numbers submitted by the core are correct within the modulation period;

counting the number of correct random numbers and the number of wrong random numbers of the core within the modulation period;

computing a computing correct ratio of the random numbers of the core within the modulation period according to the number of correct random numbers and the number of wrong random numbers, and judging whether the computing correct ratio of the random numbers reaches the predetermined first and/or second correct ratio thresholds;

the step of modulating the current working frequency of the core up or down according to the computing performance indicator of the core further comprises:

if the computing correct ratio of the random numbers of the core reaches the first correct ratio threshold, modulating the current working frequency of the core up to the upper working frequency; and/or if the computing correct ratio of the random numbers of the core does not reach the second correct ratio threshold, modulating the current working frequency of the core down to the lower working frequency.

According to the chip frequency modulation method of the invention, the step of analyzing whether random numbers submitted by the core are correct within the modulation period further comprises:

computing, via the core, a first result from the random numbers through a predetermined algorithm every time when the core submits one random number within the modulation period, the first result including a first feature;

computing, via a verification unit of the operational chip, a second result from the random numbers through the same algorithm, the second result including a second feature;

if the first feature is the same as the second feature, judging, via the verification unit, that the random numbers are the correct random numbers, or the random numbers are the wrong random numbers.

According to the chip frequency modulation method of the invention, the step of analyzing whether a computing correct ratio of the core reaches predetermined correct ratio thresholds within a predetermined modulation period further comprises:

real-time analyzing whether the computing correct ratio of the core within the modulation period reaches the first correct ratio threshold and the second correct ratio threshold according to a preset real-time modulating instruction;

analyzing whether the computing correct ratio of the core within the modulation period reaches the first correct ratio threshold and the second correct ratio threshold according to a preset timed modulating instruction within a modulation time period set by the timed modulating instruction; or analyzing whether the computing correct ratio of the core within the modulation period reaches the first correct ratio threshold and the second correct ratio threshold according to a received immediate modulating instruction;

the step of modulating the current working frequency of the core up or down according to the computing performance indicator of the core further comprises:

if the computing correct ratio of the core within the modulation period reaches the first correct ratio threshold, real-time modulating the current working frequency of the core up to the upper working frequency; if the computing correct ratio of the core within the modulation period does not reach the second correct ratio threshold, real-time modulating the current working frequency of the core down to the lower working frequency;

if the computing correct ratio of the core within the modulation period reaches the first correct ratio threshold in the modulation time period, modulating the current working frequency of the core up to the upper working frequency; if the computing correct ratio of the core within the modulation period does not reach the second correct ratio threshold in the modulation time period, modulating the current working frequency of the core down to the lower working frequency; or according to the received immediate modulating instruction, if the computing correct ratio of the core within the modulation period reaches the first correct ratio threshold, modulating the current working frequency of the core up to the upper working frequency; if the computing correct ratio of the core within the modulation period does not reach the second correct ratio threshold, modulating the current working frequency of the core down to the lower working frequency; according to a received stop modulating instruction, stopping modulating the current working frequency of the core.

According to the chip frequency modulation method of the invention, the step of analyzing a computing performance indicator of each core at its current working frequency further comprises:

presetting a reference node value, a computing correct weight value, a computing wrong weight value, a computing correct threshold and a computing wrong threshold of the core;

analyzing whether each computation of the core is correct;

adding one computing correct weight value to the reference node value every time when the core computes correctly at least once, and reducing one computing wrong weight value from the reference node value every time when the core computes wrongly at least once;

judging whether the current reference node value of the core reaches the computing correct threshold or the computing wrong threshold;

the step of modulating the current working frequency of the core up or down according to the computing performance indicator of the core further comprises:

if the current reference node value of the core reaches the computing correct threshold, modulating the current working frequency of the core up to the upper working frequency;

if the current reference node value of the core reaches the computing wrong threshold, modulating the current working frequency of the core down to the lower working frequency.

According to the chip frequency modulation method of the invention, the step of analyzing whether each computation of the core is correct further comprises:

analyzing whether the random numbers submitted every time by the core are correct;

the step of adding one computing correct weight value to the reference node value every time when the core computes correctly at least once, and reducing one computing wrong weight value from the reference node value every time when the core computes wrongly at least once further comprises:

adding one computing correct weight value to the reference node value every time when the core submits at least one correct random number, and reducing one computing wrong weight value from the reference node value every time when the core submits at least one wrong random number.

According to the chip frequency modulation method of the invention, the step of analyzing whether the random numbers submitted every time by the core are correct further comprises:

computing, via the core, a first result from the random numbers through a predetermined algorithm after the core submits one random number, the first result including a first feature;

computing, via a verification unit of the operational chip, a second result from the random numbers through the same algorithm, the second result including a second feature;

if the first feature is the same as the second feature, judging, via the verification unit, that the random numbers are the correct random numbers, or the random numbers are the wrong random numbers.

According to the chip frequency modulation method of the invention, the method further comprises:

setting and adjusting the reference node value, the computing correct weight value, the computing wrong weight value, the computing correct threshold and/or the computing wrong threshold of the core according to actual requirements, the computing correct weight value being the same as or different from the computing wrong weight value, the computing correct threshold being the same as or different from the computing wrong threshold;

controlling an expected tolerant resident error ratio of the core by controlling a ratio of the computing correct weight value to the computing wrong weight value;

controlling a modulation period by controlling an absolute value of the computing correct weight value and the computing wrong weight value;

controlling the modulation period by controlling an absolute value of the computing correct threshold and the computing wrong threshold.

According to the chip frequency modulation method of the invention, a computing formula of the resident error ratio is: the resident error ratio=the computing correct weight value divided by the computing correct weight value and the computing wrong weight value.

According to the chip frequency modulation method of the invention, the step of judging whether the current reference node value of the core reaches the computing correct threshold or the computing wrong threshold further comprises:

real-time judging whether the current reference node value of the core reaches the computing correct threshold or the computing wrong threshold according to a preset real-time modulating instruction;

judging whether the current reference node value of the core reaches the computing correct threshold or the computing wrong threshold according to a preset timed modulating instruction within a modulation time period set by the timed modulating instruction; or analyzing whether the current reference node value of the core reaches the computing correct threshold or the computing wrong threshold according to a received immediate modulating instruction;

the step of modulating the current working frequency of the core up or down according to the computing performance indicator of the core further comprises:

if the current reference node value of the core reaches the computing correct threshold, real-time modulating the current working frequency of the core up to the upper working frequency; if the current reference node value of the core reaches the computing wrong threshold, real-time modulating the current working frequency of the core down to the lower working frequency;

if the current reference node value of the core reaches the computing correct threshold in the modulation time period, modulating the current working frequency of the core up to the upper working frequency; if the current reference node value of the core reaches the computing wrong threshold in the modulation time period, modulating the current working frequency of the core down to the lower working frequency; or according to the received immediate modulating instruction, if the current reference node value of the core reaches the computing correct threshold, modulating the current working frequency of the core up to the upper working frequency; if the current reference node value of the core reaches the computing wrong threshold, modulating the current working frequency of the core down to the lower working frequency; according to a received stop modulating instruction, stopping modulating the current working frequency of the core.

According to the chip frequency modulation method of the invention, after the step of modulating the current working frequency of the core up or down according to the computing performance indicator of the core, the method further comprises:

counting current distribution state of the cores after frequency modulation at the respective working frequencies;

modulating a frequency in the working frequency according to the current distribution state and a predetermined frequency modulation mechanism of the cores, the frequency modulation mechanism being a correspondence relationship between the distribution state and the frequency modulation of the cores.

According to the chip frequency modulation method of the invention, the working frequency comprises at least one high-frequency working frequency, at least one middle working frequency and at least one low-frequency working frequency, the maximum frequency in the high-frequency working frequency is a maximum working frequency, the minimum frequency in the low-frequency working frequency is a minimum working frequency;

the step of modulating a frequency in the working frequency according to the current distribution state and a predetermined frequency modulation mechanism of the cores further comprises:

if the cores exceeding a predetermined second ratio are worked at the at least one high-frequency working frequency, modifying the at least one working frequency to at least one optimized high-frequency working frequency, a frequency in the optimized high-frequency working frequency being higher than a frequency in the maximum working frequency; and/or if the cores exceeding a predetermined third ratio are worked at the at least one low-frequency working frequency, modifying the at least one working frequency to at least one optimized low-frequency working frequency, a frequency in the optimized low-frequency working frequency being lower than a frequency in the minimum working frequency.

According to the chip frequency modulation method of the invention, the step of if the cores exceeding a predetermined second ratio are worked at the at least one high-frequency working frequency, modifying the at least one working frequency to at least one optimized high-frequency working frequency further comprises:

if the cores exceeding the second ratio are worked at the maximum working frequency, modifying the one working frequency to the one optimized high-frequency working frequency; and/or the step of if the cores exceeding a predetermined third ratio are worked at the at least one low-frequency working frequency, modifying the at least one working frequency to at least one optimized low-frequency working frequency further comprises:

if the cores exceeding the third ratio are worked at the minimum working frequency, modifying the one working frequency to the one optimized low-frequency working frequency.

According to the chip frequency modulation method of the invention, the working frequency comprises at least one high-frequency working frequency, at least one middle working frequency and at least one low-frequency working frequency, the maximum frequency in the high-frequency working frequency is a maximum working frequency, the minimum frequency in the low-frequency working frequency is a minimum working frequency;

the step of modulating a frequency in the working frequency according to the current distribution state and a predetermined frequency modulation mechanism further comprises:

if the number of cores worked at the at least one high-frequency working frequency is maximum, modifying the at least one working frequency to at least one optimized high-frequency working frequency, a frequency in the optimized high-frequency working frequency being higher than a frequency in the maximum working frequency; and/or if the number of cores worked at the at least one low-frequency working frequency is maximum, modifying the at least one working frequency to at least one optimized low-frequency working frequency, a frequency in the optimized low-frequency working frequency being lower than a frequency in the minimum working frequency.

According to the chip frequency modulation method of the invention, the step of if the number of cores worked at the at least one high-frequency working frequency is maximum, modifying the at least one working frequency to at least one optimized high-frequency working frequency further comprises:

if the number of cores worked at the maximum working frequency is maximum, modifying the one working frequency to the one optimized high-frequency working frequency; and/or the step of if the number of cores worked at the at least one low-frequency working frequency is maximum, modifying the at least one working frequency to at least one optimized low-frequency working frequency further comprises:

if the number of cores worked at the minimum working frequency is maximum, modifying the one working frequency to the one optimized low-frequency working frequency.

According to the chip frequency modulation method of the invention, the working frequency comprises at least one high-frequency working frequency, at least one middle working frequency and at least one low-frequency working frequency;

the step of modulating a frequency in the working frequency according to the current distribution state and a predetermined frequency modulation mechanism further comprises:

if the cores exceeding a predetermined fourth ratio are worked at the at least one middle working frequency, stopping modulating the frequency in the working frequency; or if the number of cores worked at the at least one middle working frequency is maximum, stopping modulating the frequency in the working frequency.

According to the chip frequency modulation method of the invention, the computing device is configured to operation of mining virtual digital currency.

The invention further provides a chip frequency modulation apparatus of a computing device, the computing device provided with at least one operational chip, and the operational chip provided with a plurality of cores, comprising:

a frequency setting module for setting a plurality of working frequencies for the operational chip of the computing device and causing the plurality of cores in the operational chip to work at the respective working frequencies;

a computational performance analysis module for analyzing a computing performance indicator of each core at its current working frequency; and a frequency modulation module for modulating the current working frequency of the core up or down according to the computing performance indicator of the core.

According to the chip frequency modulation apparatus of the invention, the frequency setting module sets the plurality of working frequencies for the operational chip through a plurality of phase locked loops, the working frequencies and the phase locked loops being in a one-to-one correspondence relationship;

the frequency modulation module modulates the current working frequency of the core up or down through the phase locked loops according to the computing performance indicator of the core.

According to the chip frequency modulation apparatus of the invention, the phase locked loops are provided inside or outside the operational chip.

According to the chip frequency modulation apparatus of the invention, a frequency difference between the adjacent working frequencies is from 1% to 10%.

According to the chip frequency modulation apparatus of the invention, the computational performance analysis module analyzes whether the computing performance indicator of the core reaches predetermined first, second and/or third indicator thresholds within a predetermined modulation period, the first indicator threshold being the same as or different from the second indicator threshold;

if the computing performance indicator of the core reaches the first indicator threshold, the frequency modulation module modulates the current working frequency of the core up to the upper working frequency;

if the computing performance indicator of the core does not reach the second indicator threshold, the frequency modulation module modulates the current working frequency of the core down to the lower working frequency; and/or if the computing performance indicator of the core reaches the third indicator threshold, the frequency modulation module modulates the current working frequency of the core down to the lower working frequency.

According to the chip frequency modulation apparatus of the invention, the frequency modulation module further comprises:

a frequency modulation sub-module for modulating the current working frequency of the core up or down according to the computing performance indicator of the core;

a stop frequency modulation sub-module for if the cores worked at the predetermined at least one optimized working frequency exceed a predetermined first ratio, stopping modulating the frequencies of the cores; or if the number of cores worked at the at least one optimized working frequency is maximum, stopping modulating the frequencies of the cores.

According to the chip frequency modulation apparatus of the invention, the computational performance analysis module analyzes whether a computing correct ratio of the core reaches predetermined first and/or second correct ratio thresholds within a predetermined modulation period, the first correct ratio threshold being the same or different from the second correct ratio threshold;

the frequency modulation module, if the computing correct ratio of the core reaches the first correct ratio threshold, modulates the current working frequency of the core up to the upper working frequency; and/or if the computing correct ratio of the core does not reach the second correct ratio threshold, modulates the current working frequency of the core down to the lower working frequency.

According to the chip frequency modulation apparatus of the invention, the computational performance analysis module further comprises:

a first analysis sub-module for analyzing whether random numbers submitted by the core are correct within the modulation period;

a counting sub-module for counting the number of correct random numbers and the number of wrong random numbers of the core within the modulation period; and a first judgment module for computing a computing correct ratio of the random numbers of the core within the modulation period according to the number of correct random numbers and the number of wrong random numbers, and judging whether the computing correct ratio of the random numbers reaches the predetermined first and/or second correct ratio thresholds;

the frequency modulation module for if the computing correct ratio of the random numbers of the core reaches the first correct ratio threshold, modulating the current working frequency of the core up to the upper working frequency; and/or if the computing correct ratio of the random numbers of the core does not reach the second correct ratio threshold, modulating the current working frequency of the core down to the lower working frequency.

According to the chip frequency modulation apparatus of the invention, the first analysis sub-module further comprises:

a first computing unit for computing a first result from the random numbers through a predetermined algorithm every time when the core submits one random number within the modulation period, the first result including a first feature, the first computing unit provided in the core; and a first verification unit for computing a second result from the random numbers through the same algorithm, the second result including a second feature, if the first feature is the same as the second feature, judging that the random number is the correct random number, or the random number is the wrong random number, the first verification unit provided in the operational chip.

According to the chip frequency modulation apparatus of the invention, the computational performance analysis module real-time analyzes whether the computing correct ratio of the core within the modulation period reaches the first correct ratio threshold and the second correct ratio threshold according to a preset real-time modulating instruction;

the computational performance analysis module analyzes whether the computing correct ratio of the core within the modulation period reaches the first correct ratio threshold and the second correct ratio threshold according to a preset timed modulating instruction within a modulation time period set by the timed modulating instruction; or the computational performance analysis module analyzes whether the computing correct ratio of the core within the modulation period reaches the first correct ratio threshold and the second correct ratio threshold according to a received immediate modulating instruction;

the frequency modulation module, if the computing correct ratio of the core within the modulation period reaches the first correct ratio threshold, real-time modulates the current working frequency of the core up to the upper working frequency; if the computing correct ratio of the core within the modulation period does not reach the second correct ratio threshold, real-time modulates the current working frequency of the core down to the lower working frequency;

the frequency modulation module, if the computing correct ratio of the core within the modulation period reaches the first correct ratio threshold in the modulation time period, modulates the current working frequency of the core up to the upper working frequency; if the computing correct ratio of the core within the modulation period does not reach the second correct ratio threshold in the modulation time period, modulates the current working frequency of the core down to the lower working frequency; or the frequency modulation module, according to the received immediate modulating instruction, if the computing correct ratio of the core within the modulation period reaches the first correct ratio threshold, modulates the current working frequency of the core up to the upper working frequency; if the computing correct ratio of the core within the modulation period does not reach the second correct ratio threshold, modulates the current working frequency of the core down to the lower working frequency; according to a received stop modulating instruction, stops modulating the current working frequency of the core.

According to the chip frequency modulation apparatus of the invention, the computational performance analysis module further comprises:

a setting sub-module for presetting a reference node value, a computing correct weight value, a computing wrong weight value, a computing correct threshold and a computing wrong threshold of the core;

a second analysis sub-module for analyzing whether each computation of the core is correct;

a counting sub-module for adding one computing correct weight value to the reference node value every time when the core computes correctly at least once, and reducing one computing wrong weight value from the reference node value every time when the core computes wrongly at least once; and a second judgment sub-module for judging whether the current reference node value of the core reaches the computing correct threshold or the computing wrong threshold;

the frequency modulation module for if the current reference node value of the core reaches the computing correct threshold, modulating the current working frequency of the core up to the upper working frequency; and if the current reference node value of the core reaches the computing wrong threshold, modulating the current working frequency of the core down to the lower working frequency.

According to the chip frequency modulation apparatus of the invention, the second analysis sub-module analyzes whether the random numbers submitted every time by the core are correct;

the counting sub-module adds one computing correct weight value to the reference node value every time when the core submits at least one correct random number, and reduces one computing wrong weight value from the reference node value every time when the core submits at least one wrong random number.

According to the chip frequency modulation apparatus of the invention, the second analysis sub-module further comprises:

a second computing unit for computing, via the core, a first result from the random number through a predetermined algorithm after the core submits one random number, the first result including a first feature; and a second verification unit for computing a second result from the random number through the same algorithm, the second result including a second feature; if the first feature is the same as the second feature, judging that the random number is the correct random number, or the random number is the wrong random number.

According to the chip frequency modulation apparatus of the invention, the setting sub-module sets and adjusts the reference node value, the computing correct weight value, the computing wrong weight value, the computing correct threshold and/or the computing wrong threshold of the core according to actual requirements, the computing correct weight value being the same as or different from the computing wrong weight value, the computing correct threshold being the same as or different from the computing wrong threshold;

the setting sub-module controls an expected tolerant resident error ratio of the core by controlling a ratio of the computing correct weight value to the computing wrong weight value;

the setting sub-module controls a modulation period by controlling an absolute value of the computing correct weight value and the computing wrong weight value;

the setting sub-module controls the modulation period by controlling an absolute value of the computing correct threshold and the computing wrong threshold.

According to the chip frequency modulation apparatus of the invention, a computing formula of the resident error ratio is: the resident error ratio=the computing correct weight value divided by the computing correct weight value and the computing wrong weight value.

According to the chip frequency modulation apparatus of the invention, the computational performance analysis module real-time judges whether the current reference node value of the core reaches the computing correct threshold or the computing wrong threshold according to a preset real-time modulating instruction;

the computational performance analysis module judges whether the current reference node value of the core reaches the computing correct threshold or the computing wrong threshold according to a preset timed modulating instruction within a modulation time period set by the timed modulating instruction; or the computational performance analysis module analyzes whether the current reference node value of the core reaches the computing correct threshold or the computing wrong threshold according to a received immediate modulating instruction;

the frequency modulation module, if the current reference node value of the core reaches the computing correct threshold, real-time modulates the current working frequency of the core up to the upper working frequency; if the current reference node value of the core reaches the computing wrong threshold, real-time modulates the current working frequency of the core down to the lower working frequency;

the frequency modulation module, if the current reference node value of the core reaches the computing correct threshold in the modulation time period, modulates the current working frequency of the core up to the upper working frequency; if the current reference node value of the core reaches the computing wrong threshold in the modulation time period, modulates the current working frequency of the core down to the lower working frequency; or the frequency modulation module, according to the received immediate modulating instruction, if the current reference node value of the core reaches the computing correct threshold, modulates the current working frequency of the core up to the upper working frequency; if the current reference node value of the core reaches the computing wrong threshold, modulates the current working frequency of the core down to the lower working frequency; according to a received stop modulating instruction, stops modulating the current working frequency of the core.

According to the chip frequency modulation apparatus of the invention, the apparatus further comprises:

a frequency counting module for counting current distribution state of the cores after frequency modulation at the respective working frequencies;

a frequency modulation module for modulating a frequency in the working frequency according to the current distribution state and a predetermined frequency modulation mechanism of the cores, the frequency modulation mechanism being a correspondence relationship between the distribution state and the frequency modulation of the cores.

According to the chip frequency modulation apparatus of the invention, the working frequency comprises at least one high-frequency working frequency, at least one middle working frequency and at least one low-frequency working frequency, the maximum frequency in the high-frequency working frequency is a maximum working frequency, the minimum frequency in the low-frequency working frequency is a minimum working frequency;

the frequency modulation module further comprises:

a first frequency modulation sub-module for if the cores exceeding a predetermined second ratio are worked at the at least one high-frequency working frequency, modifying the at least one working frequency to at least one optimized high-frequency working frequency, a frequency in the optimized high-frequency working frequency being higher than a frequency in the maximum working frequency; and/or a second frequency modulation sub-module for if the cores exceeding a predetermined third ratio are worked at the at least one low-frequency working frequency, modifying the at least one working frequency to at least one optimized low-frequency working frequency, a frequency in the optimized low-frequency working frequency being lower than a frequency in the minimum working frequency.

According to the chip frequency modulation apparatus of the invention, if the cores exceeding the second ratio are worked at the maximum working frequency, the first frequency modulation sub-module modifies the one working frequency to the one optimized high-frequency working frequency; and/or if the cores exceeding the third ratio are worked at the minimum working frequency, the second frequency modulation sub-module modifies the one working frequency to the one optimized low-frequency working frequency.

According to the chip frequency modulation apparatus of the invention, the working frequency comprises at least one high-frequency working frequency, at least one middle working frequency and at least one low-frequency working frequency, the maximum frequency in the high-frequency working frequency is a maximum working frequency, the minimum frequency in the low-frequency working frequency is a minimum working frequency;

the frequency modulation module further comprises:

a third frequency modulation sub-module for if the number of cores worked at the at least one high-frequency working frequency is maximum, modifying the at least one working frequency to at least one optimized high-frequency working frequency, a frequency in the optimized high-frequency working frequency being higher than a frequency in the maximum working frequency; and/or a fourth frequency modulation sub-module for if the number of cores worked at the at least one low-frequency working frequency is maximum, modifying the at least one working frequency to at least one optimized low-frequency working frequency, a frequency in the optimized low-frequency working frequency being lower than a frequency in the minimum working frequency.

According to the chip frequency modulation apparatus of the invention, if the number of cores worked at the maximum working frequency is maximum, the third frequency modulation sub-module modifies the one working frequency to the one optimized high-frequency working frequency; and/or if the number of cores worked at the minimum working frequency is maximum, the fourth frequency modulation sub-module modifies the one working frequency to the one optimized low-frequency working frequency.

According to the chip frequency modulation apparatus of the invention, the working frequency comprises at least one high-frequency working frequency, at least one middle working frequency and at least one low-frequency working frequency;

the frequency modulation module further comprises:

a first stop modulation module for if the cores exceeding a predetermined fourth ratio are worked at the at least one middle working frequency, stopping modulating the frequency in the working frequency; or a second stop modulation module for if the number of cores worked at the at least one middle working frequency is maximum, stopping modulating the frequency in the working frequency.

According to the chip frequency modulation apparatus of the invention, the chip frequency modulation apparatus is provided inside or outside the operational chip.

According to the chip frequency modulation apparatus of the invention, the computing device is configured to operation of mining virtual digital currency.

The invention further provides a hash board comprising any one of the chip frequency modulation apparatus.

The invention further provides a computing device comprising any one of the chip frequency modulation apparatus.

The invention further provides a computer program storage medium for storing a computer program, wherein when executed by a processor, the program implements a chip frequency modulation method of a computing device, the computing device provided with at least one operational chip, and the operational chip provided with a plurality of cores, wherein the method comprises:

setting a plurality of working frequencies for the operational chip of the computing device and causing the plurality of cores in the operational chip to work at the respective working frequencies;

analyzing a computing performance indicator of each core at its current working frequency; and modulating the current working frequency of the core up or down according to the computing performance indicator of the core.

The invention automatically modulates frequencies of the cores of the operational chip of the computing device, firstly sets a plurality of suitable working frequencies and causes the plurality of cores in the operational chip to work at the respective working frequencies, and then modulates the current working frequency of the core up or down according to the computing performance indicator of each core at the current working frequency, that is, modulating the core with high computing performance up, and modulating the core with low computing performance down. Therefore, the invention can automatically modulate a frequency corresponding to each core according to the actual computing performance of each core in the operational chip of the computing device, thereby maximizing the computing per-

DETAILED DESCRIPTION

This invention is hereinafter further described in details with reference to the accompanying drawings as well as the embodiments so as to make the object, technical solution and advantages thereof more apparent. It shall be understood that the detailed embodiments described herein are only to explain the invention, instead of limiting the invention.

It shall be noted that citations of "one embodiment", "embodiments", "an exemplary embodiment" and the like in the disclosure refer to that this embodiment may include specific features, structures or characteristics, but it is unnecessary for each embodiment to include these specific features, structures or characteristics. In addition, such expression does not refer to the same embodiment. Further, with reference to the specific features, structures or characteristics described in this embodiment, no matter whether clear descriptions are made or not, it has shown that combining the specific features, structures or characteristics into other embodiments falls into the knowledge range of those skilled in the art.

In addition, specific terms are used in the specification and the subsequent claims to refer to specific components or parts. Those skilled in the art shall understand that the manufacturer may give a different name to the same component or part. The specification and the subsequent claims distinguish components or parts from each other by different functions of the components, instead of different names "Comprise" and "include" mentioned in the whole specification and the subsequent claims are open words, and shall be explained as "include but is not limited to". In addition, "connection" herein includes any direct or indirect electrical connection means. Indirect electrical connection means comprises connection through other devices.

Figure 1:
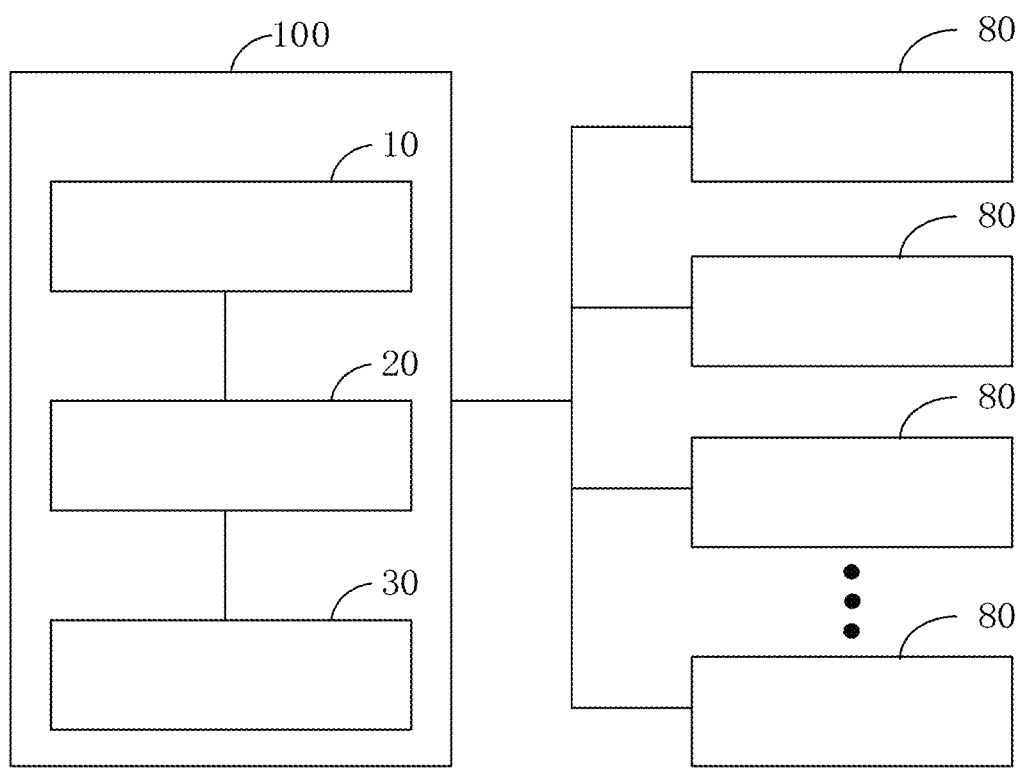
FIG. 1 is a structural diagram of a chip frequency modulation apparatus of a computing device according to the invention.

FIG. 1 is a structural diagram of a chip frequency modulation apparatus of a computing device according to the invention. The computing device is preferably for mass operation, such as, operation of mining virtual digital currency. The computing device is provided with at least one operational chip, and the operational chip is provided with a plurality of cores 80. Preferably, the computing device comprises a control board, and a hash board connected to the control board, the hash board is provided with at least one operational chip, and the operational chip is provided with a plurality of cores 80. Of course, the computing device also can comprise a radiator, a connection plate, a power module, and the like.

It shall be noted that chip frequency modulation technique of the invention actually relates to two levels of frequency modulation mechanism, i.e., a frequency modulation mechanism of the operational chip, and a frequency modulation mechanism on a level of the cores. The frequency modulation mechanism of the operational chip refers to setting a plurality of suitable working frequencies for each operational chip, and causing the respective cores 80 of the operational chip to work at the respective working frequencies, thereby fully play working performance of each core 80. The frequency modulation mechanism on a level of the cores refers to modulating the cores 80 to suitable working frequencies according to the actual computing performance of the core 80, modulating the frequency of the core 80 with high computing performance up, and modulating the frequency of the core 80 with low computing performance down, thereby fully playing the computing performance of each core 80.

The chip frequency modulation apparatus 100 at least comprises a frequency setting module 10, a computational performance analysis module 20 and a frequency modulation module 30.

The frequency setting module 10 sets a plurality of working frequencies for the operational chip of the computing device, and causes the plurality of cores 80 in the operational chip to work at the respective working frequencies, wherein frequencies at each working frequency are different.

That is, the plurality of different working frequencies are set for each operational chip, and the respective cores 80 of the operational chip are caused to work at the respective working frequencies according to the frequency modulation mechanism of the operational chip. For example, six working frequencies 500 MHz, 550 MHz, 600 MHz, 650 MHz, 700 MHz and 750 MHz are set. The number of working frequencies and a distance between the frequencies in the invention can be set according to actual needs, and the more the working frequencies are, the most likely the computing performance of the respective cores 80 will be fully played. When a frequency modulation switch is turned on (without modulating the frequencies of the cores 80), the cores 80 can be evenly distributed, unevenly distributed or randomly distributed to work at the working frequencies depending on a predetermined rule. Preferably, the frequency setting module 10 can set the plurality of working frequencies for the operational chip through a plurality of phase locked loops 70 shown in FIG. 2. Of course, the frequency setting module 10 also can set the plurality of working frequencies for the operational chip through other hardware or software.

The computational performance analysis module 20 analyzes a computing performance indicator of each core 80 at its current working frequency. The computing performance indicator represents the actual computing performance of the core 80 at the current working frequency, and includes, but is not limited to a computing correct ratio, a computing correct number, a computing speed and the like. If the computing performance indicator of the core 80 is high, it means that the computing performance of the core 80 may have room for improvement, and if the computing performance indicator of the core 80 is low, it means that the computing performance of the core 80 may be insufficient to work at the frequency corresponding to the current working frequency.

The frequency modulation module 30 modulates the current working frequency of the core 80 up or down according to the computing performance indicator of the core 80 at the current working frequency. That is, according to the frequency modulation mechanism on a level of the cores, the core 80 is modulated to the suitable working frequency according to the actual computing performance of the core 80, the frequency of the core 80 with high computing performance is modulated up, and the frequency of the core 80 with low computing performance is modulated down, thereby fully playing the computing performance of each core 80. Preferably, the frequency of the core 80 is modulated periodically, if the computing correct ratio of the core 80 within the modulation period of the frequency reaches a first correct ratio threshold, it shows that the core 80 does not reach the best computing performance, so the current working frequency of the core 80 is modulated up to the higher upper working frequency, and if the computing correct ratio of the core 80 within the modulation period of the frequency does not reach a second correct ratio threshold, it shows that the computing performance of the core 80 is insufficient to work at the current working frequency, so the current working frequency of the core 80 is modulated down to the lower working frequency.

The chip frequency modulation apparatus 100 of the invention can be provided inside or outside the operational chip. The invention evaluates the working frequency of the core 80, modulates the corresponding frequency of the core 80, fully plays computing advantages of the core 80 with good performance, avoids the core with poor performance from influencing on the operating performance of the operational chip, and maximizes the computing performance of the respective cores 80 according to the actual computing performance of the respective cores 80 in the operational chip, thereby improving the computing speed and the computing correct ratio of the operational chip and the overall computing device. Moreover, the core 80 of the operational chip in the invention does not jump among different frequencies, and the working frequency is relatively stable.

Figure 2:
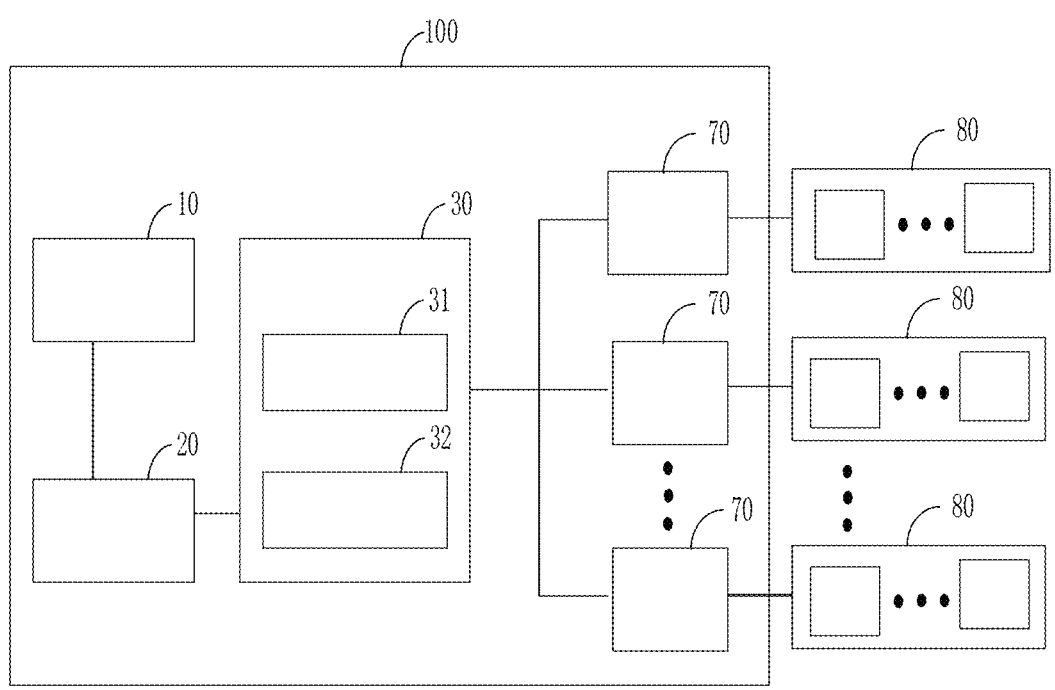
FIG. 2 is a structural diagram of a chip frequency modulation apparatus of a computing device in a first embodiment of the invention.

FIG. 2 is a structural diagram of a chip frequency modulation apparatus of a computing device in a first embodiment of the invention. The computing device is preferably for mass operation, such as, operation of mining virtual digital currency. Preferably, the computing device comprises a control board, and a hash board connected to the control board, the hash board is provided with at least one operational chip, and the operational chip is provided with a plurality of cores 80. Of course, the computing device also can comprise a radiator, a connection plate, a power module, and the like. The chip frequency modulation apparatus 100 at least comprises a frequency setting module 10, a computational performance analysis module 20 and a frequency modulation module 30.

The frequency setting module 10 sets a plurality of working frequencies for the operational chip through a plurality of phase locked loops 70, and causes the plurality of cores 80 in the operational chip to work at the respective working frequencies, wherein frequencies at the respective working frequencies are different, and the working frequencies and the phase locked loops 70 are in a one-to-one correspondence relationship. Preferably, the phase locked loops 70 are provided inside or outside the operational chip. The number of the respective working frequencies and a distance between the frequencies in the invention can be set according to actual needs, and the more the working frequencies are, the most likely the computing performance of the respective cores 80 will be fully played. For example, six working frequencies 500 MHz, 550 MHz, 600 MHz, 650 MHz, 700 MHz and 750 MHz are set. Therefore, the invention can set more phase locked loops 70 to provide more working frequencies, thereby fully playing the computing performance of the respective cores 80.

It shall be noticed that a frequency difference between the working frequencies in the invention shall be controlled within a reasonable range, because when the core 80 is improved by one working frequency, the working frequency of the core is improved by one frequency difference, thereby improving certain computing performance due to improvement of the computing speed. Meanwhile, improvement of the working frequency of the core may cause loss of certain computing performance due to reduction of the computing correct ratio. Therefore, the frequency setting module 10 shall reasonably control the frequency difference between the adjacent working frequencies, such that when the core 80 is modulated up from the current working frequency to the upper working frequency, benefit of the computing performance of the core 80 shall be greater than loss. Preferably, a frequency difference between the adjacent working frequencies is from 1% to 10%.

The computational performance analysis module 20 analyzes a computing performance indicator of each core 80 at its current working frequency. The computing performance indicator represents the actual computing performance of the core 80 at the current working frequency, and includes, but is not limited to a computing correct ratio, a computing correct number, a computing speed and the like. If the computing performance indicator of the core 80 is high, it means that the computing performance of the core 80 may have room for improvement, and if the computing performance indicator of the core 80 is low, it means that the computing performance of the core 80 may be insufficient to work at the frequency corresponding to the current working frequency. Preferably, the computational performance analysis module 20 analyzes whether the computing performance indicator of the core 80 reaches predetermined first, second and/or third indicator thresholds in a predetermined modulation period, wherein the first indicator threshold is the same as or different from the second indicator threshold.

The frequency modulation module 30 modulates the current working frequency of the core 80 up or down through the phase locked loops 70 according to the computing performance indicator of the core 80. Of course, the frequency modulation module 30 also can modulate the current working frequency of the core 80 up or down through other hardware or software. Preferably, if the computing performance indicator of the core 80 reaches the first indicator threshold, the frequency modulation module 30 modulates the current working frequency of the core 80 up to the upper working frequency; and/or, if the computing performance indicator of the core 80 does not reach the second indicator threshold, the frequency modulation module 30 modulates the current working frequency of the core 80 down to the lower working frequency; and/or if the computing performance indicator of the core 80 reaches the third indicator threshold, the frequency modulation module 30 modulates the current working frequency of the core 80 down to the lower working frequency.

For example, taking "for example, six working frequencies 500 MHz, 550 MHz, 600 MHz, 650 MHz, 700 MHz and 750 MHz are set", and the current working frequency of the core 80 to be 600 MHz for example, the computing performance indicator is the computing correct ratio of the core 80 within the modulation period, and the first indicator threshold and the second indicator threshold are both 90%. If the computing correct ratio of the core 80 within the modulation period reaches 90%, it means that the computing performance of the core 80 is good, so the current working frequency 600 MHz of the core 80 is modulated up to the upper working frequency 650 MHz. If the computing correct ratio of the core 80 within the modulation period does not reach 90%, it means that the computing performance of the core 80 is poor, so the current working frequency 600 MHz of the core 80 is modulated down to the lower working frequency 550 MHz. Those skilled in the art can understand that the upper working frequency is not limited to the upper adjacent working frequency, and one or more upper adjacent working frequencies also can be the upper working frequency; the lower working frequency is not limited to the lower adjacent working frequency, and one or more lower adjacent working frequencies also can be the lower working frequency. That is, the current working frequency 600 MHz of the core 80 is modulated up to the upper working frequency 700 MHz, the current working frequency 600 MHz of the core 80 is modulated down to the lower working frequency 500 MHz, and so on. Here, a spacing between the upper working frequency and the lower working frequency is not limited. Preferably, a frequency difference between the current working frequency and the upper working frequency is from 1% to 10%, and a frequency difference between the current working frequency and the lower working frequency is from 1% to 10%, such that the core 80 is modulated up from the current working frequency to the upper working frequency or the lower working frequency, and benefit of the computing performance of the core 80 shall be greater than loss.

For another example, the computing performance indicator is the computing correct ratio of the core 80 within the modulation period, the first indicator threshold is 90%, and the second indicator threshold is 80%. If the computing correct ratio of the core 80 within the modulation period reaches 90%, it means that the computing performance of the core 80 is good, so the current working frequency 600 MHz of the core 80 is modulated up to the upper working frequency 650 MHz. If the computing correct ratio of the core 80 within the modulation period does not reach 80%, it means that the computing performance of the core 80 is poor, so the current working frequency 600 MHz of the core 80 is modulated down to the lower working frequency 550 MHz.

For still another example, the computing performance indicator is the number of correct computations and the number of wrong computations of the core 80 within the modulation period, the first indicator threshold is 100, and the second indicator threshold is 10. If the number of correct computations of the core 80 within the modulation period reaches 100, it means that the computing performance of the core 80 is good, so the current working frequency 600 MHz of the core 80 is modulated up to the upper working frequency 650 MHz. If the number of wrong computations of the core 80 within the modulation period reaches 10, it means that the computing performance of the core 80 is poor, so the current working frequency 600 MHz of the core 80 is modulated down to the lower working frequency 550 MHz.

Preferably, the frequency modulation module 30 further comprises a frequency modulation sub-module 31 and a stop frequency modulation sub-module 32.

The frequency modulation sub-module modulates the current working frequency of the core 80 up or down according to the computing performance indicator of the core 80. Preferably, the frequency modulation sub-module 31 modulates the current working frequency of the core 80 up or down through phase locked loops 70 according to the computing performance indicator of the core 80. Of course, the frequency modulation sub-module 31 also can modulate the current working frequency of the core 80 up or down through other hardware or software.

The stop frequency modulation sub-module 32, if the cores 80 worked at the predetermined at least one optimized working frequency exceed a predetermined first ratio, stops modulating the frequencies of the cores 80; or if the number of cores 80 worked at the at least one optimized working frequency is maximum, stops modulating the frequencies of the cores 80.

For example, one or more optimized working frequencies can be selected and preset from the plurality of working frequencies, and if the working frequencies of most cores 80 have reached the optimized working frequencies, it shows that the working frequencies of the respective cores 80 in the operational chip have been in an optimized state, thereby fully playing the computing performance of the respective cores 80 without further frequency modulation, so the working frequencies of the cores 80 are stopped modulation. For example, six working frequencies 500 MHz, 550 MHz, 600 MHz, 650 MHz, 700 MHz and 750 MHz are set, two optimized working frequencies 600 MHz and 650 MHz are selected as optimized working frequencies, and if over 80% of the cores 80 are worked at the working frequencies 600 MHz and 650 MHz, the frequencies of the cores 80 are stopped modulation.

Figure 3:
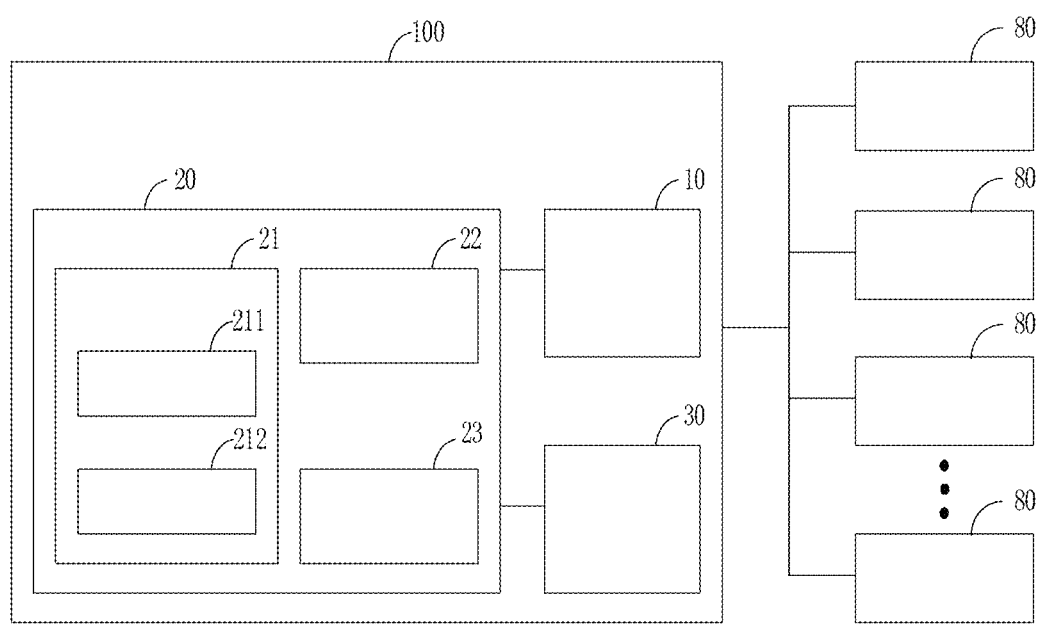
FIG. 3 is a structural diagram of a chip frequency modulation apparatus of a computing device in a second embodiment of the invention.

FIG. 3 is a structural diagram of a chip frequency modulation apparatus of a computing device in a second embodiment of the invention. The computing device is preferably for mass operation, such as, operation of mining virtual digital currency. Preferably, the computing device comprises a control board, and a hash board connected to the control board, the hash board is provided with at least one operational chip, and the operational chip is provided with a plurality of cores 80. Of course, the computing device also can comprise a radiator, a connection plate, a power module, and the like. The chip frequency modulation apparatus 100 at least comprises a frequency setting module 10, a computational performance analysis module 20 and a frequency modulation module 30.

The frequency setting module 10 sets a plurality of working frequencies for the operational chip of the computing device, and causes the plurality of cores 80 in the operational chip to work at the respective working frequencies, wherein frequencies at each working frequency are different. That is, according to the frequency modulation mechanism on a level of the operational chip, several different working frequencies are set for each operational chip, and the respective cores 80 of the operational chip are caused to work at the respective working frequencies. For example, six working frequencies 500 MHz, 550 MHz, 600 MHz, 650 MHz, 700 MHz and 750 MHz are set. The number of working frequencies and a distance between the frequencies in the invention can be set according to actual needs, and the more the working frequencies are, the most likely the computing performance of the respective cores 80 will be fully played. When a frequency modulation switch is turned on (without modulating the frequencies of the cores 80), the cores 80 can be evenly distributed, unevenly distributed or randomly distributed to work at the working frequencies depending on a predetermined rule. Preferably, the frequency setting module 10 sets the plurality of working frequencies for the operational chip through a plurality of phase locked loops 70 shown in FIG. 2, and causes the plurality of cores 80 in the operational chip to work at the respective working frequencies, and the working frequencies and the phase locked loops 70 are in a one-to-one correspondence relationship. Therefore, the invention can set more phase locked loops 70 to provide more working frequencies, thereby fully playing the computing performance of the respective cores 80. Of course, the frequency setting module 10 also can set the plurality of working frequencies for the operational chip through other hardware or software.

It shall be noticed that a frequency difference between the working frequencies in the invention shall be controlled within a reasonable range, because when the core 80 is improved by one working frequency, the working frequency of the core is improved by one frequency difference, thereby improving certain computing performance due to improvement of the computing speed. Meanwhile, improvement of the working frequency of the core may cause loss of certain computing performance due to reduction of the computing correct ratio. Therefore, the frequency setting module 10 shall reasonably control the frequency difference between the adjacent working frequencies, such that when the core 80 is modulated up from the current working frequency to the upper working frequency, benefit of the computing performance of the core 80 shall be greater than loss. Preferably, a frequency difference between the adjacent working frequencies is from 1% to 10%.

The computational performance analysis module 20 analyzes whether the computing correct ratio of the core 80 reaches predetermined first and/or second correct ratio thresholds in a predetermined modulation period, and the first correct ratio threshold is the same as or different from the second correct ratio threshold. If the computing correct ratio of the core 80 reaches the predetermined first correct ratio threshold, it means that the computing performance of the core 80 may have room for improvement. If the computing correct ratio of the core 80 does not reach the predetermined second correct ratio threshold, it means that the computing performance of the core 80 may be insufficient to work at the frequency corresponding to the current working frequency.

The frequency modulation module 30, if the computing correct ratio of the core 80 reaches the first correct ratio threshold, and shows that the core 80 does not reach the best computing performance, modulates the current working frequency of the core 80 up to the upper working frequency; and/or if the computing correct ratio of the core 80 does not reach the second correct ratio threshold, and shows that the computing performance of the core 80 is insufficient to work at the current working frequency, modulates the current working frequency of the core 80 down to the lower working frequency. The frequency modulation module 30 can modulate the frequency of the core 80 through the phase locked loops 70 shown in FIG. 2 or software. That is, according to the frequency modulation mechanism on a level of the cores, the core 80 is modulated to a suitable working frequency according to the actual computing performance of the core 80, the frequency of the core 80 with high computing performance is modulated up, and the frequency of the core 80 with low computing performance is modulated down, thereby fully playing the computing performance of each core 80.

For example, the first correct ratio threshold and the second correct ratio threshold are both 90%. When the core 80 is worked at 600 MHz, if the computing correct ratio of the core 80 within the predetermined modulation period exceeds 90% (it shows that the core 80 does not reach the best computing performance), the current working frequency 600 MHz of the core 80 is modulated up to the upper working frequency, i.e., the working frequency is improved to 650 MHz. If the computing correct ratio of the core 80 is less than 90% (it shows that the computing performance of the core 80 is insufficient to work at the frequency of the current working frequency 600 MHz), the current working frequency of the core 80 is modulated down to the lower working frequency, i.e., the working frequency is reduced to 550 MHz. Those skilled in the art can understand that the upper working frequency is not limited to the upper adjacent working frequency, and one or more upper adjacent working frequencies also can be the upper working frequency; the lower working frequency is not limited to the lower adjacent working frequency, and one or more lower adjacent working frequencies also can be the lower working frequency. That is, the current working frequency 600 MHz of the core 80 is modulated up to the upper working frequency 700 MHz, the current working frequency 600 MHz of the core 80 is modulated down to the lower working frequency 500 MHz, and so on. Here, a spacing between the upper working frequency and the lower working frequency is not limited. Preferably, a frequency difference between the current working frequency and the upper working frequency is from 1% to 10%, and a frequency difference between the current working frequency and the lower working frequency is from 1% to 10%, such that the core 80 is modulated up from the current working frequency to the upper working frequency or the lower working frequency, and benefit of the computing performance of the core 80 shall be greater than loss.

For another example, the first correct ratio threshold is 90%, and the second correct ratio threshold is 80%. When the core 80 is worked at 600 MHz, if the computing correct ratio of the core 80 within the predetermined modulation period exceeds 90% (it shows that the core 80 does not reach the best computing performance), the current working frequency of the core 80 is modulated up to the upper working frequency, i.e., the working frequency is improved to 650 MHz. If the computing correct ratio of the core 80 is less than 90% (it shows that the computing performance of the core 80 is insufficient to work at the frequency of the current working frequency 600 MHz), the current working frequency of the core 80 is modulated down to the lower working frequency, i.e., the working frequency is reduced to 550 MHz.

Preferably, the computing correct ratio can be a computing correct ratio of Nonces (Number once, random numbers) submitted by the cores 80 within the modulation period. That is, during a predetermined time, in all Nonces submitted by the cores 80, the computing correct ratio is a ratio occupied by correct Nonces. A block header in a blockchain comprises the Nonce (four bytes), Nonce is a random value, and the function of miners is actually to guess the value of Nonce, such that a hash of the block header can be less than a target value Target, and can be written into the blockchain. Specifically, this attribute starts from 0 to $2^{32}$ to compute the hash of the block header, and if the obtained hash result conforms to conditions, mining is successful.

Preferably, the computational performance analysis module 20 in FIG. 3 further comprises:

a first analysis sub-module 21 for analyzing whether the Nonces submitted by the core 80 are correct within the predetermined modulation period;

a counting sub-module 22 for counting the number of correct Nonces and the number of wrong Nonces submitted by the core 80 within the modulation period;

a first judgment module 23 for computing a computing correct ratio of Nonces of the core 80 within the modulation period according to the number of correct Nonces and the number of wrong Nonces, and judging whether the computing correct ratio of Nonces reaches the predetermined first and/or second correct ratio thresholds.

The frequency modulation module 30, if the computing correct ratio of Nonces of the core 80 reaches the first correct ratio threshold, modulates the current working frequency of the core 80 up to the upper working frequency; and/or if the computing correct ratio of Nonces of the core 80 does not reach the second correct ratio threshold, modulates the current working frequency of the core 80 down to the lower working frequency.

Most preferably, the first analysis sub-module 21 further comprises:

a first computing unit 211 for computing a first result from the Nonce through a predetermined algorithm every time when the core 80 submits one Nonce within the modulation period, the first result including a first feature, the first computing unit 211 preferably provided in the core 80. The Nonce submitted by each core 80 includes identification information (ID) of the Nonce, thereby counting the computing result of each core 80.

a first verification unit 212 for computing a second result from the Nonce submitted by the core 80 through the same algorithm, the second result including a second feature, if the first feature is the same as the second feature, judging that the Nonce is the correct Nonce, or the Nonce is the wrong Nonce. The first verification unit 212 is preferably provided in the operational chip.

For example, after the core 80 computes and submits one Nonce, the Nonce is embedded into the block header to compute a first hash result, and value of front twenty bits of the first hash result is 0 (the first feature). The first verification unit 212 also embeds the Nonce into the block header to compute a second hash result, and if value of front twenty bits of the second hash result is also 0 (the second feature), it is considered that the Nonce is one correct submission.

It shall be noted that in order to improve probability of the Nonce values satisfied for writing into the blockchain computed by the single core 80, the hash also can be judged using Target_Lite easier than the "target value Target", and each core can submit the Nonces more frequently. The first verification unit 212 verifies the Nonces submitted by the core 80, and if the hash computed by the Nonces submitted by the core 80 also passes judgment of the Target_Lite, it is considered that the core 80 submits correctly, or submits wrongly. The invention is not limited to use the Nonces capable of writing into the final blockchain. The interactive Nonce between the first verification unit 212 and the core 80 satisfies a lower threshold, has a higher submission density, and facilitates frequency modulation.

Preferably, the computational performance analysis module 20 real-time analyzes whether the computing correct ratio of the core 80 within the modulation period reaches the first correct ratio threshold and/or the second correct ratio threshold according to a preset real-time modulating instruction, and the first correct ratio threshold is the same as or different from the second correct ratio threshold.

If the computing correct ratio of the core 80 within the modulation period reaches the first correct ratio threshold, the frequency modulation module 30 real-time modulates the current working frequency of the core 80 up to the upper working frequency. If the computing correct ratio of the core 80 within the modulation period does not reach the second correct ratio threshold, the frequency modulation module 30 real-time modulates the current working frequency of the core 80 down to the lower working frequency, such that the working frequency of the core 80 is real-time modulated dynamically.

Preferably, the computational performance analysis module 20 analyzes whether the computing correct ratio of the core 80 within the modulation period reaches the first correct ratio threshold and/or the second correct ratio threshold according to a preset timed modulating instruction within a modulation time period set by the timed modulating instruction, and the first correct ratio threshold is the same as or different from the second correct ratio threshold.

If the computing correct ratio of the core 80 within the modulation period reaches the first correct ratio threshold in the modulation time period, the frequency modulation module 30 modulates the current working frequency of the core 80 up to the upper working frequency. If the computing correct ratio of the core 80 within the modulation period does not reach the second correct ratio threshold in the modulation time period, the frequency modulation module 30 modulates the current working frequency of the core 80 down to the lower working frequency, such that the working frequency of the core 80 is timed modulated. If only Saturday (24 hours) per week is set to count the computing correct ratio of the core 80, frequency is modulated according to the computing correct ratio.

Preferably, the computational performance analysis module 20 analyzes whether the computing correct ratio of the core 80 within the modulation period reaches the first correct ratio threshold and/or the second correct ratio threshold according to a received immediate modulating instruction, and the first correct ratio threshold is the same as or different from the second correct ratio threshold.

According to the received immediate modulating instruction, if the computing correct ratio of the core 80 within the modulation period reaches the first correct ratio threshold, the frequency modulation module 30 modulates the current working frequency of the core 80 up to the upper working frequency, and if the computing correct ratio of the core 80 within the modulation period does not reach the second correct ratio threshold, the frequency modulation module 30 modulates the current working frequency of the core 80 down to the lower working frequency. According to a received stop modulating instruction, the frequency modulation module 30 stops modulating the current working frequency of the core 80.

For example, users can timely send the immediate modulating instruction to the computing device according to needs, and the computing device immediately starts analyzing the computing correct ratio of the cores 80 according to the immediate modulating instruction. If the computing correct ratio of the cores 80 exceeds the first correct ratio threshold (e.g., over 99%) within the modulation period (e.g., 10 minutes), the working frequency of the cores 80 is modulated up, and if the computing correct ratio of the cores 80 is less than the second correct ratio threshold (e.g., below 99%) within the modulation period (e.g., 10 minutes), the working frequency of the cores 80 is modulated down. In addition, users can timely send stop modulating instruction to the computing device according to needs, and after receiving the stop modulating instruction, the computing device immediately stops modulating the frequency of the core 80.

Figure 4:
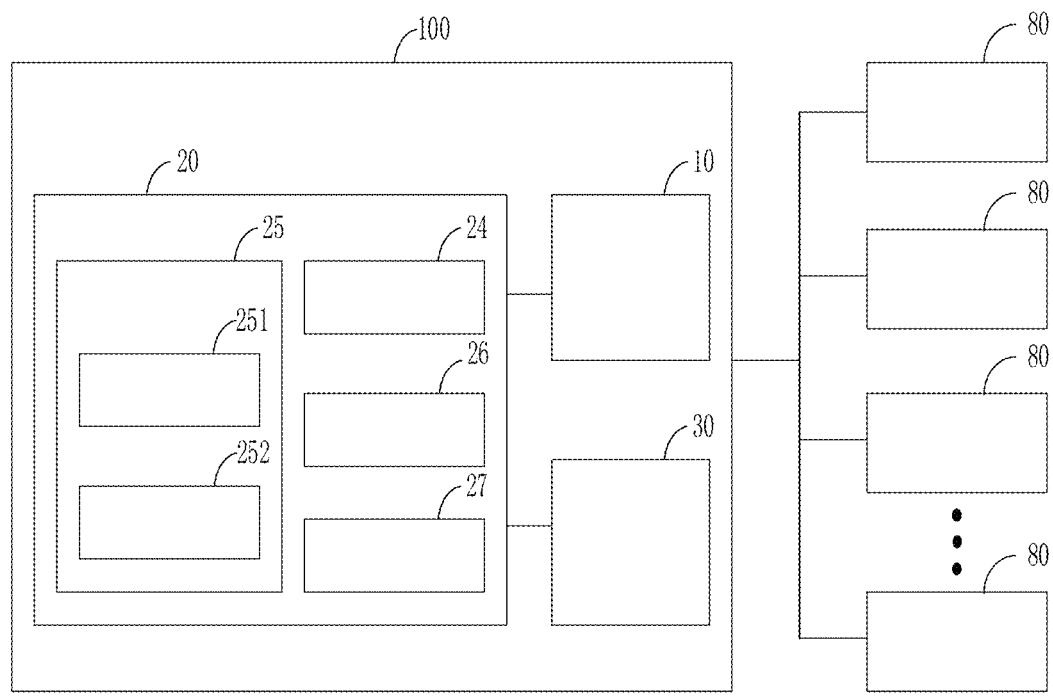
FIG. 4 is a structural diagram of a chip frequency modulation apparatus of a computing device in a third embodiment of the invention.

FIG. 4 is a structural diagram of a chip frequency modulation apparatus of a computing device in a third embodiment of the invention. The computing device is preferably for mass operation, such as, operation of mining virtual digital currency. Preferably, the computing device comprises a control board, and a hash board connected to the control board, the hash board is provided with at least one operational chip, and the operational chip is provided with a plurality of cores 80. Of course, the computing device also can comprise a radiator, a connection plate, a power module, and the like. The chip frequency modulation apparatus 100 comprises a frequency setting module 10, a computational performance analysis module 20 and a frequency modulation module 30.

The frequency setting module 10 sets a plurality of working frequencies for the operational chip of the computing device, and causes the plurality of cores 80 in the operational chip to work at the respective working frequencies, wherein frequencies at each working frequency are different. That is, according to the frequency modulation mechanism of the operational chip, the plurality of different working frequencies are set for each operational chip, and the respective cores 80 of the operational chip are caused to work at the respective working frequencies. For example, six working frequencies 500 MHz, 550 MHz, 600 MHz, 650 MHz, 700 MHz and 750 MHz are set. The number of working frequencies and a distance between the frequencies in the invention can be set according to actual needs, and the more the working frequencies are, the most likely the computing performance of the respective cores 80 will be fully played. When a frequency modulation switch is turned on (without modulating the frequencies of the cores 80), the cores 80 can be evenly distributed, unevenly distributed or randomly distributed to work at the working frequencies depending on a predetermined rule. Preferably, the frequency setting module 10 can set the plurality of working frequencies for the operational chip through a plurality of phase locked loops 70 shown in FIG. 2. Of course, the frequency setting module 10 also can set the plurality of working frequencies for the operational chip through other hardware or software.

It shall be noticed that a frequency difference between the working frequencies in the invention shall be controlled within a reasonable range, because when the core 80 is improved by one working frequency, the working frequency of the core is improved by one frequency difference, thereby improving certain computing performance due to improvement of the computing speed. Meanwhile, improvement of the working frequency of the core may cause loss of certain computing performance due to reduction of the computing correct ratio. Therefore, the frequency setting module 10 shall reasonably control the frequency difference between the adjacent working frequencies, such that when the core 80 is modulated up from the current working frequency to the upper working frequency, benefit of the computing performance of the core 80 shall be greater than loss. Preferably, a frequency difference between the adjacent working frequencies is from 1% to 10%.

The computational performance analysis module 20 analyzes a computing performance indicator of each core 80 at its current working frequency. The computational performance analysis module 20 further comprises:

a setting sub-module 24 for presetting a reference node value, a computing correct weight value, a computing wrong weight value, a computing correct threshold and a computing wrong threshold of the core 80. The computing correct weight value can be the same as or different from the computing wrong weight value, and the computing correct threshold can be the same as or different from the computing wrong threshold. The reference node value, the computing correct weight value, the computing wrong weight value, the computing correct threshold and the computing wrong threshold are all adjustable parameters, and can be optimized according to actual needs such as frequency modulation speed.

a second analysis sub-module 25 for analyzing whether each computation of the core 80 is correct. The core 80 can make various different computations to analyze whether each or few computations of the core 80 are correct. Preferably, whether the Nonces computed by the cores 80 are correct is analyzed.

a counting sub-module 26 for adding one computing correct weight value to the reference node value every time when the core 80 computes correctly at least once, and reducing one computing wrong weight value from the reference node value every time when the core 80 computes wrongly at least once. Preferably, one computing correct weight value is added to the reference node value every time when the core 80 computes correctly once. Of course, it can be set that one computing correct weight value is added to the reference node value every time when the core 80 computes correctly N (N is a natural number greater than 1) times. One computing wrong weight value is reduced from the reference node value every time when the core 80 computes wrongly once. Of course, it can be set that one computing wrong weight value is reduced from the reference node value every time when the core 80 computes wrongly N (N is a natural number greater than 1) times.

a second judgment sub-module 27 for judging whether the current reference node value of the core 80 reaches the computing correct threshold or the computing wrong threshold. If the current reference node value reaches the computing correct threshold, it means that the computing performance of the core 80 is high, and may have room for improvement. If the current reference node value reaches the computing wrong threshold, it means that the computing performance of the core 80 is poor, and may be insufficient to work at the frequency corresponding to the current working frequency.

The frequency modulation module 30, if the current reference node value of the core 80 reaches the computing correct threshold, and shows that the core 80 does not reach the best computing performance, modulates the current working frequency of the core 80 up to the upper working frequency; and if the current reference node value of the core 80 reaches the computing wrong threshold, and shows that the computing performance of the core 80 is insufficient to work at its current working frequency, modulates the current working frequency of the core 80 down to the lower working frequency. The frequency modulation module 30 can modulate the frequency of the core 80 through the phase locked loops 70 shown in FIG. 2 or software. That is, according to the frequency modulation mechanism on a level of the cores, the core 80 is modulated to the suitable working frequency according to the actual computing performance of the core 80, the frequency of the core 80 with high computing performance is modulated up, and the frequency of the core 80 with low computing performance is modulated down, thereby fully playing the computing performance of each core 80. Those skilled in the art can understand that the upper working frequency is not limited to the upper adjacent working frequency, and one or more upper adjacent working frequencies also can be the upper working frequency; the lower working frequency is not limited to the lower adjacent working frequency, and one or more lower adjacent working frequencies also can be the lower working frequency. That is, the current working frequency 600 MHz of the core 80 is modulated up to the upper working frequency 700 MHz, the current working frequency 600 MHz of the core 80 is modulated down to the lower working frequency 500 MHz, and so on. Here, a spacing between the upper working frequency and the lower working frequency is not limited. Preferably, a frequency difference between the current working frequency and the upper working frequency is from 1% to 10%, and a frequency difference between the current working frequency and the lower working frequency is from 1% to 10%, such that the core 80 is modulated up from the current working frequency to the upper working frequency or the lower working frequency, and benefit of the computing performance of the core 80 shall be greater than loss.

Figure 5:
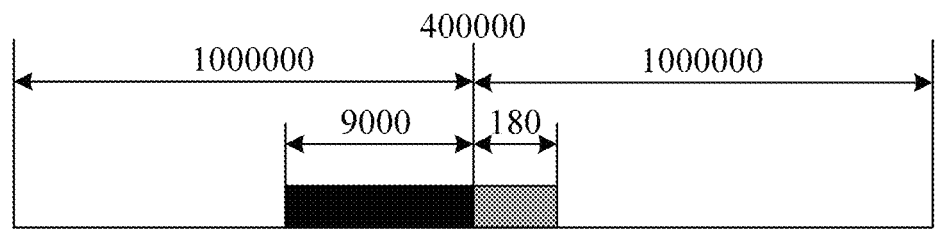
FIG. 5 is an exemplary diagram of parameter settings in the third embodiment of the invention.

For example, as shown in FIG. 5, the reference node value is set to be 400,000, the computing correct weight value is set to be 180, the computing wrong weight value is set to be 9,000, and the computing correct threshold and the computing wrong threshold are both set to be 100,000.

180 (the computing correct weight value) is added to the reference node value every time when the core 80 computes correctly once, 9,000 (the computing wrong weight value) is reduced from the reference node value every time when the core 80 computes wrongly once, and taking the reference node value for reference, the upper frequency or the lower frequency is stepped upward or downward every time when 100,000 (the computing correct threshold and the computing wrong threshold) is added or reduced.

The current mechanism is similar with wrong or correct tug-of-war mechanism, and correct and wrong mechanisms may have different weights. The reference node value is set. One computing correct weight value is added every time when one correct result is received, one computing wrong weight value is reduced every time when one wrong result is received, and if reward or punishment exceeds a corresponding threshold, the frequency is modulated up or down. It can be understood that the system has a marker, the reference node value is an initial value of the marker, maker +180 for correct submission, and maker −9,000 for each wrong submission. After Nth (N is a natural number greater than or equal to 1) corrects and Mth (M is a natural number greater than or equal to 1) errors, the marker shall be at a position of 400000+N*180−M*9000, and if the marker exceeds one threshold, the frequency is modulated correspondingly (i.e., modulating up or down). Then, every time when the frequency is modulated to a new frequency, the value is initialized, i.e., the current reference node value is reset to an initial reference node value.

Preferably, the setting sub-module 24 sets and adjusts the reference node value, the computing correct weight value, the computing wrong weight value, the computing correct threshold and/or the computing wrong threshold of the core 80 according to actual requirements, the computing correct weight value is the same as or different from the computing wrong weight value, and the computing correct threshold is the same as or different from the computing wrong threshold.

Preferably, the setting sub-module 24 controls an expected tolerant resident error ratio S of the core 80 by controlling a ratio of the computing correct weight value to the computing wrong weight value. A computing formula of the resident error ratio S is: the resident error ratio S=the computing correct weight value divided by the computing correct weight value and the computing wrong weight value.

Preferably, the setting sub-module 24 controls a modulation period by controlling an absolute value of the computing correct weight value and the computing wrong weight value.

Preferably, the setting sub-module controls the modulation period by controlling an absolute value of the computing correct threshold and the computing wrong threshold.

Preferably, the correct computation can be that the core 80 correctly computes the Nonce.

The second analysis sub-module 25 analyzes whether the Nonce submitted every time by the core 80 is correct.

The counting sub-module 26 adds one computing correct weight value to the reference node value every time when the core 80 submits at least one correct Nonce, and reduces one computing wrong weight value from the reference node value every time when the core 80 submits at least one wrong Nonce. Preferably, one computing correct weight value is added to the reference node value every time when the core 80 submits one correct Nonce. Of course, it also can be set that one computing correct weight value is added to the reference node value every time when the core 80 submits Nth (N is a natural number greater than 1) correct Nonces. One computing wrong weight value is reduced from the reference node value every time when the core 80 submits one wrong Nonce. Of course, it also can be set that one computing wrong weight value is reduced from the reference node value every time when the core 80 submits Nth (N is a natural number greater than 1) wrong Nonces.

More preferably, the second analysis sub-module 25 further comprises:

a second computing unit 251 for computing, via the core 80, a first result from the Nonce through a predetermined algorithm after the core 80 submits one Nonce, the first result including a first feature;

a second verification unit 252 for computing a second result from the Nonce through the same algorithm, the second result including a second feature. If the first feature is the same as the second feature, it is judged that the Nonce is the correct Nonce, or the Nonce is the wrong Nonce.

For example, after the core 80 computes and submits one Nonce, the Nonce is embedded into the block header to compute a first hash result, and value of front twenty bits of the first hash result is 0 (the first feature). The second verification unit 252 also embeds the Nonce into the block header to compute a second hash result, and if value of front twenty bits of the second hash result is also 0 (the second feature), it is considered that the Nonce is one correct submission.

It shall be noted that in order to improve probability of the Nonce values satisfied for writing into the blockchain computed by the single core 80, the hash also can be judged using Target_Lite easier than the "target value Target", and each core can submit the Nonces more frequently. The first verification unit 212 verifies the Nonces submitted by the core 80, and if the hash computed by the Nonces submitted by the core 80 also passes judgment of the Target_Lite, it is considered that the core 80 submits correctly, or submits wrongly. The invention is not limited to use the Nonces capable of writing into the final blockchain. The interactive Nonce between the first verification unit 212 and the core 80 satisfies a lower threshold, has a higher submission density, and facilitates frequency modulation.

In one specific application embodiment of the invention, six phase locked loops 70 are used, and six working frequencies 500 MHz, 550 MHz, 600 MHz, 650 MHz, 700 MHz and 750 MHz are set. As shown in FIG. 5, the reference node value is set to be 400,000, the computing correct weight value is set to be 180, the computing wrong weight value is set to be 9,000, and the computing correct threshold and the computing wrong threshold are both set to be 100,000.

The number of cores distributed at the respective corresponding frequencies as counted by four hash boards is as follows:

Hash board 0: [294 26 96 224 1023 1665]
Hash board 1: [274 47 111 212 963 1721]
Hash board 2: [350 25 153 369 1381 1050]
Hash board 3: [488 33 184 367 1342 950]

Firstly, the mechanism is further explained with reference to data. According to the resident error ratio S=the computing correct weight value divided by the computing correct weight value and the computing wrong weight value, the resident error ratio S (which is understood to long-term reside on one frequency) of the core 80 can be inferred to be 180/(180+9000)=1.29% through the given data. Accordingly, the core 80 is worked at one frequency for a long time (because a desired step is 0), and the working frequency is not modulated up or down. It can be inferred that if a computing error ratio of the core 80 is greater than 1.29% (the resident error ratio S), the working frequency is modulated up, and if a computing error ratio of the core 80 is less than 1.29% (the resident error ratio S), the working frequency is modulated down.

According to difficulty of settings (the difficulty is associated with a verification reference, and has influence on the computing correct ratio of the core 80, and the larger a coefficient of difficulty is, the lower the correct ratio will be; in contrast, the higher the correct ratio will be), a substantial period of modulation when error rises can be inferred. Assuming that an error ratio is e, the desired step of each Nonce is: (1-e)*180-e*9000=180-9180e. Taking e=0.5% for example, the desired step equals to 134.1, taking e=1% for example, the desired step equals to 88.2, and taking e=2% for example, the desired step equals to −3.6.

Computation is made using 650 MHz, and an expectation of the single Nonce submitted by the core 80 is 1.3 per second (i.e., 1.3 Nonce is submitted within one second). Explanations are made using a scene where e is 0.5%, i.e., after 746 Nonces are submitted, the expectation can be modulated up once. When e is 1.0%, 1134 Nonces are submitted, and the expectation is modulated up once; if the error ratio is 2.0%, 27,778 Nonces are submitted, the expectation is modulated down once, and so on.

Preferably, the computational performance analysis module 20 real-time judges whether the current reference node value of the core 80 reaches the computing correct threshold or the computing wrong threshold according to a preset real-time modulating instruction, and the computing correct threshold is the same as or different from the computing wrong threshold.

The frequency modulation module 30, if the current reference node value of the core 80 reaches the computing correct threshold, real-time modulates the current working frequency of the core 80 up to the upper working frequency; if the current reference node value of the core 80 reaches the computing wrong threshold, real-time modulates the current working frequency of the core 80 down to the lower working frequency, such that the working frequency of the core 80 is real-time modulated dynamically.

Preferably, the computational performance analysis module 20 judges whether the current reference node value of the core 80 reaches the computing correct threshold or the computing wrong threshold according to a preset timed modulating instruction within a modulation time period set by the timed modulating instruction.

The frequency modulation module 30, if the current reference node value of the core 80 reaches the computing correct threshold in the modulation time period, modulates the current working frequency of the core 80 up to the upper working frequency; if the current reference node value of the core 80 reaches the computing wrong threshold in the modulation time period, modulates the current working frequency of the core 80 down to the lower working frequency, such that the working frequency of the core 80 is timed modulated. If only Saturday (24 hours) per week is set to count the number of the correct Nonces of the cores 80, the frequency is modulated according to the computing correct ratio.

Preferably, the computational performance analysis module 20 analyzes whether the current reference node value of the core 80 reaches the computing correct threshold or the computing wrong threshold according to a received immediate modulating instruction, and the computing correct threshold is the same as or different from the computing wrong threshold.

The frequency modulation module 30, according to the received immediate modulating instruction, if the current reference node value of the core 80 reaches the computing correct threshold, modulates the current working frequency of the core 80 up to the upper working frequency; if the current reference node value of the core 80 reaches the computing wrong threshold, modulates the current working frequency of the core 80 down to the lower working frequency. According to a received stop modulating instruction, the frequency modulation module 30 stops modulating the current working frequency of the core 80.

For example, users can timely send the immediate modulating instruction to the computing device according to needs, and users add a weight A to the reference node every time when the core 80 computes the correct Nonce once, and reduce a weight B from the reference node every time when the core 80 computes the wrong Nonce once. When the currently added value reaches the computing correct number threshold C, the core 80 steps upward to the upper frequency. When the currently reduced value reaches the computing wrong number threshold D, the core 80 steps downward to the lower frequency. In addition, users can timely send stop modulating instruction to the computing device according to needs, and after receiving the stop modulating instruction, the computing device immediately stops modulating the frequency of the core 80.

Figure 6:
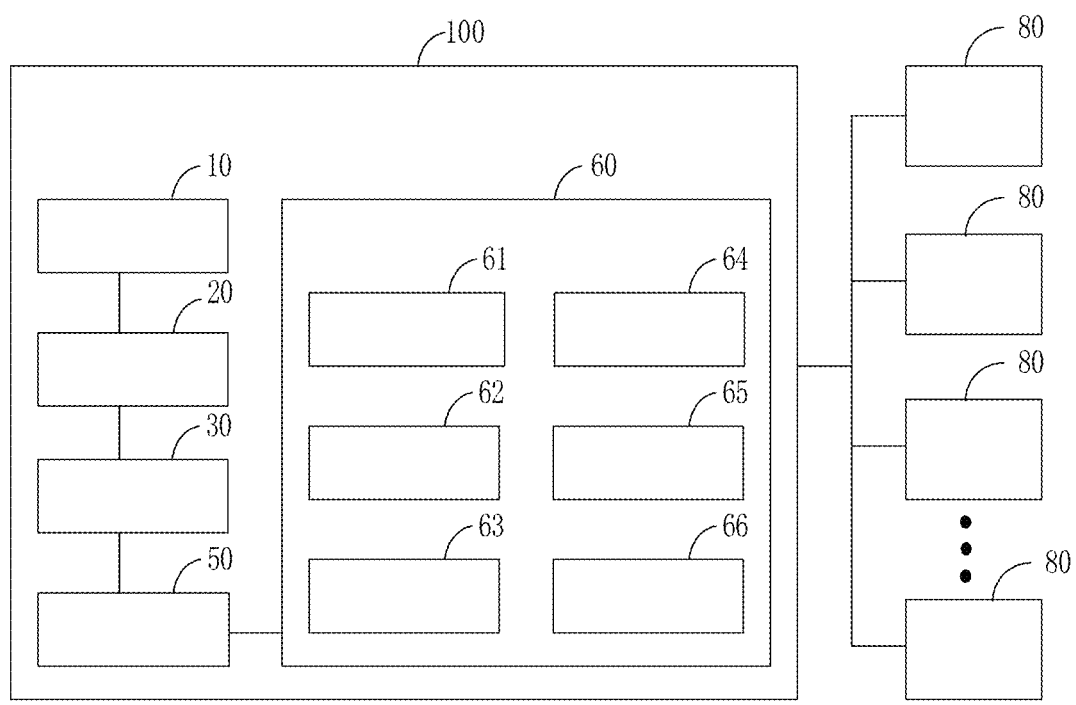
FIG. 6 is a structural diagram of a chip frequency modulation apparatus of a computing device in a fourth embodiment of the invention.

FIG. 6 is a structural diagram of a chip frequency modulation apparatus of a computing device in a fourth embodiment of the invention. The computing device is preferably for mass operation, such as, operation of mining virtual digital currency. Preferably, the computing device comprises a control board, and a hash board connected to the control board, the hash board is provided with at least one operational chip, and the operational chip is provided with a plurality of cores 80. Of course, the computing device also can comprise a radiator, a connection plate, a power module, and the like. The chip frequency modulation apparatus 100 comprises a frequency setting module 10, a computational performance analysis module 20, a frequency modulation module 30, a frequency counting module 50 and a frequency modulation module 60.

The frequency setting module 10 sets a plurality of working frequencies for the operational chip of the computing device, and causes the plurality of cores 80 in the operational chip to work at the respective working frequencies. That is, according to the frequency modulation mechanism on a level of the operational chip, the plurality of different working frequencies are set for each operational chip, and the cores 80 of the operational chip are caused to work at the respective working frequencies. For example, six working frequencies 500 MHz, 550 MHz, 600 MHz, 650 MHz, 700 MHz and 750 MHz are set. The number of working frequencies and a distance between the frequencies in the invention can be set according to actual needs, and the more the working frequencies are, the most likely the computing performance of the respective cores 80 will be fully played. When a frequency modulation switch is turned on (without modulating the frequencies of the cores 80), the cores 80 can be evenly distributed, unevenly distributed or randomly distributed to work at the working frequencies depending on a predetermined rule. Preferably, the frequency setting module 10 can set the plurality of working frequencies for the operational chip through a plurality of phase locked loops (PPLs) 70 shown in FIG. 2. Of course, the frequency setting module 10 also can set the plurality of working frequencies for the operational chip through other hardware or software.

It shall be noticed that a frequency difference between the working frequencies in the invention shall be controlled within a reasonable range, because when the core 80 is improved by one working frequency, the working frequency of the core is improved by one frequency difference, thereby improving certain computing performance due to improvement of the computing speed. Meanwhile, improvement of the working frequency of the core may cause loss of certain computing performance due to reduction of the computing correct ratio. Therefore, the frequency setting module 10 shall reasonably control the frequency difference between the adjacent working frequencies, such that when the core 80 is modulated up from the current working frequency to the upper working frequency, benefit of the computing performance of the core 80 shall be greater than loss. Preferably, a frequency difference between the adjacent working frequencies is from 1% to 10%.

The computational performance analysis module 20 analyzes a computing performance indicator of each core 80 at its current working frequency. The computing performance indicator represents the actual computing performance of the core 80 at the current working frequency, and includes, but is not limited to a computing correct ratio, a computing correct number, a computing speed and the like. If the computing performance indicator of the core 80 is high, it means that the computing performance of the core 80 may have room for improvement, and if the computing performance indicator of the core 80 is low, it means that the computing performance of the core 80 may be insufficient to work at the frequency corresponding to the current working frequency.

The frequency modulation module 30 modulates the current working frequency of the core 80 up or down according to the computing performance indicator of the core 80. That is, according to the frequency modulation mechanism on a level of the cores, the core 80 is modulated to the suitable working frequency according to the computing performance of the core 80, the frequency of the core 80 with high computing performance is modulated up, and the frequency of the core 80 with low computing performance is modulated down, thereby fully playing the computing performance of each core 80. The frequency modulation module 30 can modulate the frequency of the core 80 through the phase locked loops 70 shown in FIG. 2 or software. Preferably, if the computing correct ratio of the core 80 within the modulation period reaches the first correct ratio threshold, it shows that the core 80 does not reach the best computing performance, so the current working frequency of the core 80 is modulated up to the upper working frequency. If the computing correct ratio of the core 80 within the modulation period reaches the second correct ratio threshold, it shows that the computing performance of the core 80 is insufficient to work at the current working frequency, so the current working frequency of the core 80 is modulated down to the lower working frequency. Those skilled in the art can understand that the upper working frequency is not limited to the upper adjacent working frequency, and one or more upper adjacent working frequencies also can be the upper working frequency; the lower working frequency is not limited to the lower adjacent working frequency, and one or more lower adjacent working frequencies also can be the lower working frequency. That is, the current working frequency 600 MHz of the core 80 is modulated up to the upper working frequency 700 MHz, the current working frequency 600 MHz of the core 80 is modulated down to the lower working frequency 500 MHz, and so on. Here, a spacing between the upper working frequency and the lower working frequency is not limited. Preferably, a frequency difference between the current working frequency and the upper working frequency is from 1% to 10%, and a frequency difference between the current working frequency and the lower working frequency is from 1% to 10%, such that the core 80 is modulated up from the current working frequency to the upper working frequency or the lower working frequency, and benefit of the computing performance of the core 80 shall be greater than loss.

The frequency counting module 50 counts current distribution state of the cores 80 after frequency modulation at the respective working frequencies. After the working frequency is automatically modulated according to the computing performance itself, the cores 80 are distributed to work at the respective working frequencies, and the frequency counting module 50 counts the distributed number of the cores 80 after frequency modulation at the respective working frequencies, and can obtain the current distribution state. Preferably, the working frequency can be divided to comprise at least one high-frequency working frequency, at least one middle working frequency and at least one low-frequency working frequency, the maximum frequency in the high-frequency working frequency is a maximum working frequency, and the minimum frequency in the low-frequency working frequency is a minimum working frequency. For example, there are totally one thousand cores 80, six working frequencies 500 MHz, 550 MHz, 600 MHz, 650 MHz, 700 MHz and 750 MHz are set, and the number of cores 80 sequentially distributed at the six working frequencies is 100, 200, 100, 100, 200 and 300, respectively. 500 MHz and 550 MHz are low-frequency working frequencies, 600 MHz and 650 MHz are middle working frequencies, and 700 MHz and 750 MHz are high-frequency working frequency. 500 MHz is the minimum working frequency, and 750 MHz is the maximum working frequency.

The frequency modulation module 60 modulates a frequency in the working frequency according to the current distribution state and a predetermined frequency modulation mechanism of the cores 80. The frequency modulation mechanism is a correspondence relationship between the distribution state and the frequency modulation of the cores. The distribution state of the cores refers to a distribution state of the cores 80 worked at the respective working frequencies. Modulating a frequency in the working frequency refers to directly modulate the frequency in the working frequency. Preferably, the frequency modulation module 60 modulates the frequency in the working frequency through the phase locked loops 70 shown in FIG. 2. Those skilled in the art can understand that the modulation way of the frequency counting module 50 modulating the working frequency is not limited thereto. An ideal state of the invention is to hope that over a predetermined ratio (e.g., 50%) or the maximum number of cores 80 falls into the middle working frequencies, such that the frequencies of the cores 80 have a large room for modulation up.

For example, if over a predetermined ratio (e.g., 30%) of cores 80 are worked at the high working frequency (750 MHz), it may cause that the cores 80 do not play the maximum computing performance (which may be higher), so one working frequency (600 MHz) is modified to at least one optimized high-frequency working frequency (800 MHz), and the cores 80 originally worked at the working frequency (600 MHz) are all transferred to work at the maximum working frequency (750 MHz). The frequency in the optimized high-frequency working frequency is higher than the frequency in the maximum working frequency, thereby fully playing the computing performance of the respective cores 80.

In one specific embodiment of the invention, the frequency modulation module 60 further comprises a first frequency modulation sub-module 61 and/or a second frequency modulation sub-module 62.

If the cores 80 exceeding a predetermined second ratio are worked at the at least one high-frequency working frequency, and may cause that the cores 80 do not play the maximum computing performance (which may be higher), the first frequency modulation sub-module 61 modifies the at least one working frequency to at least one optimized high-frequency working frequency, and a frequency in the optimized high-frequency working frequency is higher than a frequency in the maximum working frequency. The modified working frequency can be a low-frequency working frequency, a middle working frequency and/or a high-frequency working frequency.

For example, six working frequencies 500 MHz, 550 MHz, 600 MHz, 650 MHz, 700 MHz and 750 MHz are set, and if over 30% (the second ratio) of the cores 80 are worked at the two high-frequency working frequencies (700 MHz and 750 MHz), the two low-frequency working frequencies (500 MHz and 550 MHz) are modified to two optimized high-frequency working frequencies (800 MHz and 850 MHz), or one low-frequency working frequency (500 MHz) and one middle working frequency (600 MHz) are modified to two optimized high-frequency working frequencies (800 MHz and 850 MHz).

Preferably, if the cores 80 exceeding the second ratio are worked at the maximum working frequency, and may cause that the cores 80 do not play the maximum computing performance (which may be higher), the first frequency modulation sub-module 61 modifies the one working frequency to the one optimized high-frequency working frequency, and a frequency in the optimized high-frequency working frequency is higher than a frequency in the maximum working frequency. The modified working frequency can be a low-frequency working frequency, a middle working frequency and/or a high-frequency working frequency.

For example, if over 30% (the second ratio) of the cores 80 are worked at the maximum working frequency (750 MHz), one low-frequency working frequency (500 MHz) is modified to an optimized high-frequency working frequency (800 MHz), or one middle working frequency (600 MHz) is modified to an optimized high-frequency working frequency (800 MHz), or the maximum working frequency (750 MHz) is modified to an optimized high-frequency working frequency (800 MHz).

If the cores 80 exceeding a predetermined third ratio are worked at the at least one low-frequency working frequency, and means that the computing capability of the cores 80 is too poor to be insufficient to work at the low-frequency working frequency, the second frequency modulation sub-module 62 modifies the at least one working frequency to at least one optimized low-frequency working frequency, and a frequency in the optimized low-frequency working frequency is lower than a frequency in the minimum working frequency, thereby avoiding the cores 80 with poor computing performance from influencing on overall computing performance of the operational chip. The modified working frequency can be a low-frequency working frequency, a middle working frequency and/or a high-frequency working frequency.

For example, six working frequencies 500 MHz, 550 MHz, 600 MHz, 650 MHz, 700 MHz and 750 MHz are set, and if over 30% (the third ratio) of the cores 80 are worked at the two low-frequency working frequencies (500 MHz and 550 MHz), the two low-frequency working frequencies (500 MHz and 550 MHz) are modified to two optimized low-frequency working frequencies (400 MHz and 450 MHz), or one low-frequency working frequency (500 MHz) and one middle working frequency (600 MHz) are modified to two optimized low-frequency working frequencies (400 MHz and 450 MHz).

Preferably, if the cores 80 exceeding the third ratio are worked at the minimum working frequency, and means that the computing capability of the cores 80 is too poor to be insufficient to work at the minimum working frequency, the second frequency modulation sub-module 62 modifies the one working frequency to the one optimized low-frequency working frequency, and a frequency in the optimized low-frequency working frequency is lower than a frequency in the minimum working frequency. The modified working frequency can be a low-frequency working frequency, a middle working frequency and/or a high-frequency working frequency.

For example, if over 30% (the third ratio) of the cores 80 are worked at the minimum working frequency (500 MHz), one low-frequency working frequency (500 MHz) is modified to an optimized low-frequency working frequency (450 MHz), or one middle working frequency (600 MHz) is modified to an optimized low-frequency working frequency (450 MHz), or the maximum working frequency (750 MHz) is modified to an optimized low-frequency working frequency (450 MHz).

In one specific application embodiment of the invention, six phase locked loops 70 are used, and six working frequencies 500 MHz, 550 MHz, 600 MHz, 650 MHz, 700 MHz and 750 MHz are set.

The number of cores distributed at the respective corresponding frequencies as counted by four hash boards is as follows:

Hash board 0: [294 26 96 224 1023 1665]
Hash board 1: [274 47 111 212 963 1721]
Hash board 2: [350 25 153 369 1381 1050]
Hash board 3: [488 33 184 367 1342 950]

Figure 7:
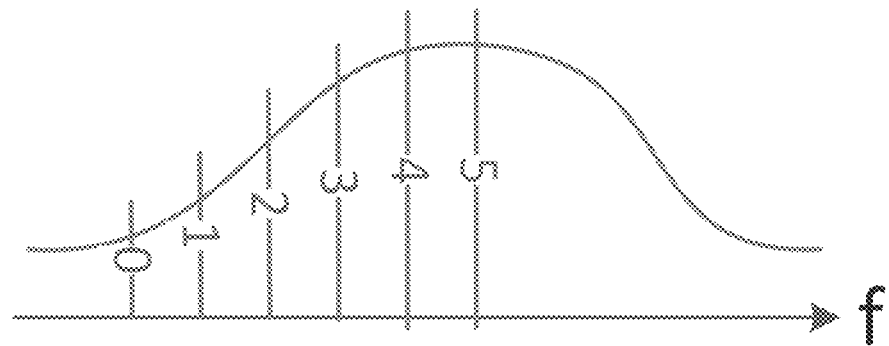
FIG. 7 is a distribution state diagram of cores worked at respective working frequencies in the fourth embodiment of the invention.

Taking the four hash boards 0-3 for example, as shown in FIG. 7, data substantially conform to a normal distribution, and the minimum working frequency (500 MHz) is the minimum frequency where the single core 80 is worked, and is unable to be modulated down (if the error ratio is too high, it can consider closing the minimum frequency). If over the predetermined ratio (e.g., 50%) of the cores 80 are accumulated at the maximum working frequency (750 MHz), it means not playing the maximum efficiency (which may be higher), and the entire operational chip has further room for improvement. A relative ideal state is that over the predetermined ratio (e.g., 50%) or the maximum number of cores 80 falls into one or more middle working frequencies, such as, the third working frequency (600 MHz). To fully use the computing performance of the cores 80, a long tail at the high performance side, rather than a long tail at the low frequency, shall be considered.

Taking the hash boards 0-1 for example, it can be seen that if the frequency 600 MHz is removed, and if left shift as a whole is used, generally, one hundred cores 80 fall at the frequency 550 MHz, and the current frequency is obviously in a left low-frequency region, which does not facilitate fully playing the computing performance of the cores 80. Therefore, right shift as a whole is more suitable, i.e., a whole shifting way. If the frequency 550 MHz is set to right as a whole to above the frequency 800 MHz through the phase locked loops 70 shown in FIG. 2, it is expected that several hundreds of the cores 80 are improved over 800 MHz, thereby improving the overall computing performance.

In another specific embodiment of the invention, the frequency modulation module 60 further comprises a third frequency modulation sub-module 63 and/or a fourth frequency modulation sub-module 64.

If the number of cores 80 worked at the at least one high-frequency working frequency is maximum, and may cause that the cores 80 do not play the maximum computing performance (which may be higher), the third frequency modulation sub-module 63 modifies the at least one working frequency to at least one optimized high-frequency working frequency, and a frequency in the optimized high-frequency working frequency is higher than a frequency in the maximum working frequency. The modified working frequency can be a low-frequency working frequency, a middle working frequency and/or a high-frequency working frequency.

For example, six working frequencies 500 MHz, 550 MHz, 600 MHz, 650 MHz, 700 MHz and 750 MHz are set, and the maximum number of the cores 80 is worked at the two high-frequency working frequencies (700 MHz and 750 MHz), so the two low-frequency working frequencies (500 MHz and 550 MHz) are modified to two optimized high-frequency working frequencies (800 MHz and 850 MHz), or one low-frequency working frequency (500 MHz) and one middle working frequency (600 MHz) are modified to two optimized high-frequency working frequencies (800 MHz and 850 MHz).

Preferably, if the number of cores 80 worked at the maximum working frequency is maximum, and may cause that the cores 80 do not play the maximum computing performance (which may be higher), the third frequency modulation sub-module 63 modifies one working frequency to one optimized high-frequency working frequency, and a frequency in the optimized high-frequency working frequency is higher than a frequency in the maximum working frequency. The modified working frequency can be a low-frequency working frequency, a middle working frequency and/or a high-frequency working frequency.

For example, when the maximum number of the cores 80 are worked at the maximum working frequency (750 MHz), one low-frequency working frequency (500 MHz) is modified to an optimized high-frequency working frequency (800 MHz), or one middle working frequency (600 MHz) is modified to an optimized high-frequency working frequency (800 MHz), or the maximum working frequency (750 MHz) is modified to an optimized high-frequency working frequency (800 MHz).

If the number of cores 80 worked at the at least one low-frequency working frequency is maximum, and means that the computing capability of the cores 80 is too poor to be insufficient to work at the low-frequency working frequency, the fourth frequency modulation sub-module 64 modifies the at least one working frequency to at least one optimized low-frequency working frequency, and a frequency in the optimized low-frequency working frequency is lower than a frequency in the minimum working frequency, thereby avoiding the cores 80 with poor computing capability from influencing on the overall computing performance of the operational chip. The modified working frequency can be a low-frequency working frequency, a middle working frequency and/or a high-frequency working frequency.

For example, six working frequencies 500 MHz, 550 MHz, 600 MHz, 650 MHz, 700 MHz and 750 MHz are set, and the maximum number of the cores 80 is worked at the two low-frequency working frequencies (500 MHz and 550 MHz), so the two low-frequency working frequencies (500 MHz and 550 MHz) are modified to two optimized low-frequency working frequencies (400 MHz and 450 MHz), or one low-frequency working frequency (500 MHz) and one middle working frequency (600 MHz) are modified to two optimized low-frequency working frequencies (400 MHz and 450 MHz).

Preferably, if the number of cores 80 worked at the minimum working frequency is maximum, and means that the computing capability of the cores 80 is too poor to be insufficient to work at the minimum working frequency, the fourth frequency modulation sub-module 64 modifies one working frequency to one optimized low-frequency working frequency, and a frequency in the optimized low-frequency working frequency is lower than a frequency in the minimum working frequency. The modified working frequency can be a low-frequency working frequency, a middle working frequency and/or a high-frequency working frequency.

For example, when the maximum number of the cores 80 are worked at the minimum working frequency (500 MHz), one low-frequency working frequency (500 MHz) is modified to an optimized low-frequency working frequency (450 MHz), or one middle working frequency (600 MHz) is modified to an optimized low-frequency working frequency (450 MHz), or the maximum working frequency (750 MHz) is modified to an optimized low-frequency working frequency (450 MHz).

In one specific application embodiment of the invention, six phase locked loops 70 are used, and six working frequencies 500 MHz, 550 MHz, 600 MHz, 650 MHz, 700 MHz and 750 MHz are set.

The number of cores distributed at the respective corresponding frequencies as counted by four hash boards is as follows:

Hash board 0: [294 26 96 224 1023 1665]
Hash board 1: [274 47 111 212 963 1721]
Hash board 2: [350 25 153 369 1381 1050]
Hash board 3: [488 33 184 367 1342 950]

Taking the four hash boards 0-3 for example, as shown in FIG. 7, data substantially conforms to a normal distribution, and the minimum working frequency (500 MHz) is the minimum frequency where the single core 80 is worked, and is unable to be modulated down (if the error ratio is too high, it can consider closing the minimum frequency). If the number of cores 80 accumulated at the maximum working frequency (750 MHz) is maximum, it means not playing the maximum efficiency (which may be higher), and the entire operational chip has further room for improvement. A relative ideal state is that over the predetermined ratio (e.g., 50%) or the maximum number of cores 80 falls into one or more middle working frequencies, such as, the third working frequency (600 MHz). To fully use the computing performance of the cores 80, a long tail at the high performance side, rather than a long tail at the low frequency, shall be considered.

Taking the hash boards 0-1 for example, it can be seen that if the frequency 600 MHz is removed, generally, one hundred cores 80 fall at the frequency 550 MHz, and the current frequency is obviously in a left low-frequency region. Therefore, right shift as a whole is more suitable, i.e., a whole shifting way. If the frequency 550 MHz is set to right as a whole to above the frequency 800 MHz through the phase locked loops 70 shown in FIG. 2, it is expected that several hundreds of the cores 80 are improved over 800 MHz, thereby improving the overall performance.

In still another specific embodiment of the invention, the frequency modulation module 60 further comprises a first stop modulation module 65 or a second stop modulation module 66.

If the cores 80 exceeding a predetermined fourth ratio are worked at the at least one middle working frequency, the first stop modulation module 65 stops modulating the frequency in the working frequency, because a relative ideal state is that over the predetermined fourth ratio (e.g., 50%) of the cores 80 falls into one or more middle working frequencies, such as, the third working frequency (600 MHz), which can fully play the working performance of the cores 80, so frequency modulation of the cores 80 is unnecessary.

If the number of cores 80 worked at the at least one middle working frequency is maximum, the second stop modulation module 66 stops modulating the frequency in the working frequency, because a relative ideal state is that the maximum number of the cores 80 falls into one or more middle working frequencies, such as, the third working frequency (600 MHz), which can fully play the working performance of the cores 80, so frequency modulation of the cores 80 is unnecessary.

The invention further provides a hash board comprising the chip frequency modulation apparatus 100.

The invention further provides a computing device comprising the chip frequency modulation apparatus 100.

Figure 8:
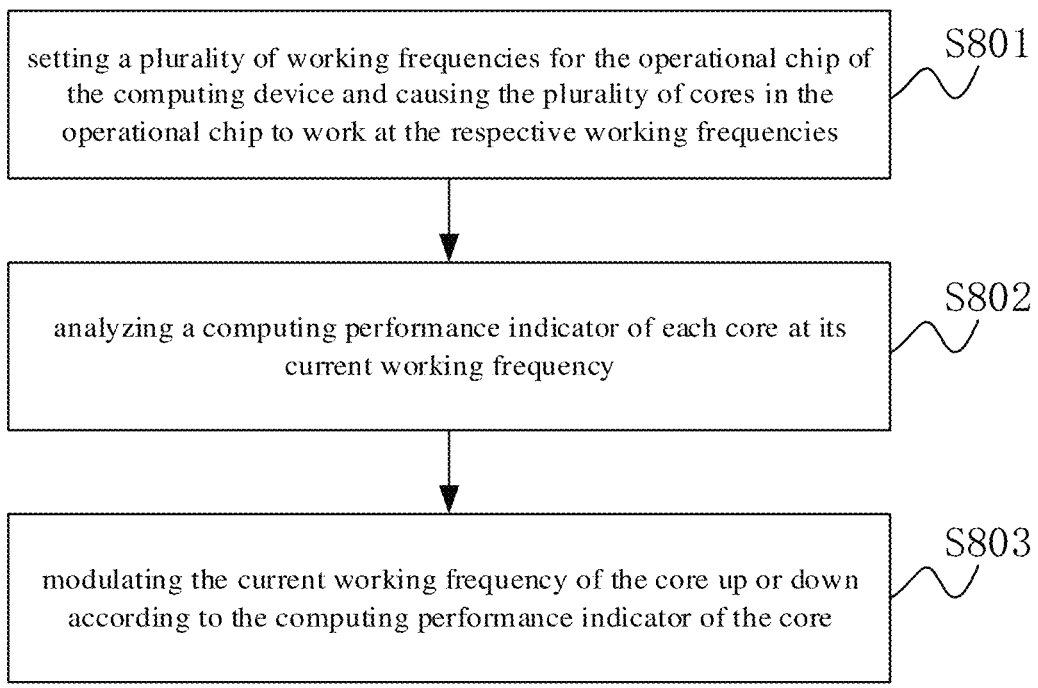
FIG. 8 is a flow diagram of a chip frequency modulation method of a computing device according to the invention.

FIG. 8 is a flow diagram of a chip frequency modulation method of a computing device according to the invention, which can be implemented by the chip frequency modulation apparatus 100 of the computing device. The computing device comprises at least one operational chip, and the operational chip is provided with a plurality of cores. The computing device is preferably for mass operation, such as, operation of mining virtual digital currency. It shall be noted that chip frequency modulation technique of the invention actually relates to two levels of frequency modulation mechanism, i.e., a frequency modulation mechanism on a level of the operational chip, and a frequency modulation mechanism on a level of the cores. The frequency modulation mechanism on a level of the operational chip refers to setting a plurality of suitable working frequencies for each operational chip, and causing the respective cores 80 of the operational chip to work at the respective working frequencies, thereby fully play working performance of each core 80. The frequency modulation mechanism on a level of the cores refers to modulating the core 80 to suitable working frequencies according to the actual computing performance of the core 80, modulating the frequency of the core 80 with high computing performance up, and modulating the frequency of the core 80 with low computing performance down, thereby playing the computing performance of each core 80. The method comprises steps of:

Step S801, setting a plurality of working frequencies for the operational chip of the computing device and causing the plurality of cores 80 in the operational chip to work at the respective working frequencies.

The step sets a plurality of working frequencies for each operational chip, and causes the respective cores 80 in the operational chip to work at the respective working frequencies according to the frequency modulation mechanism of the operational chip. For example, six working frequencies 500 MHz, 550 MHz, 600 MHz, 650 MHz, 700 MHz and 750 MHz are set. The number of working frequencies and a distance between the frequencies in the invention can be set according to actual needs, and the more the working frequencies are, the most likely the computing performance of the respective cores 80 will be fully played. When a frequency modulation switch is turned on (without modulating the frequencies of the cores 80), the cores 80 can be evenly distributed, unevenly distributed or randomly distributed to work at the working frequencies depending on a predetermined rule. Preferably, the step can set a plurality of working frequencies for the operational chip through a plurality of phase locked loops 70 shown in FIG. 2. Of course, the method also can set a plurality of working frequencies for the operational chip through other hardware or software.

Step S802, analyzing a computing performance indicator of each core 80 at its current working frequency.

The computing performance indicator represents the actual computing performance of the core 80 at the current working frequency, and includes, but is not limited to a computing correct ratio, a computing correct number, a computing speed and the like. If the computing performance indicator of the core 80 is high, it means that the computing performance of the core 80 may have room for improvement, and if the computing performance indicator of the core 80 is low, it means that the computing performance of the core 80 may be insufficient to work at the frequency corresponding to the current working frequency.

Step S803, modulating the current working frequency of the core 80 up or down according to the computing performance indicator of the core 80.

According to the frequency modulation mechanism of the cores, the step modulates the core 80 to the suitable working frequency according to the actual computing performance of the core 80, modulates the frequency of the core 80 with high computing performance up, and modulates the frequency of the core 80 with low computing performance down, thereby fully playing the computing performance of each core 80. Preferably, if the computing correct ratio of the core 80 within the modulation period reaches a first correct ratio threshold, it shows that the core 80 does not reach the best computing performance, so the current working frequency of the core 80 is modulated up to the upper working frequency, and if the computing correct ratio of the core 80 within the modulation period does not reach a second correct ratio threshold, it shows that the computing performance of the core 80 is insufficient to work at the current working frequency, so the current working frequency of the core 80 is modulated down to the lower working frequency.

The invention evaluates the working frequency of the core 80, modulates the corresponding frequency of the core 80, fully plays computing advantages of the core 80 with good performance, avoids the core with poor performance from influencing on the operating performance of the operational chip, and maximized the computing performance of the respective cores 80 according to the actual computing performance of the respective cores 80 in the operational chip, thereby improving the computing speed and the computing correct ratio of the operational chip and the overall computing device. Moreover, the core 80 of the operational chip in the invention does not change among frequencies, and the working frequency is relatively stable.

Figure 9:
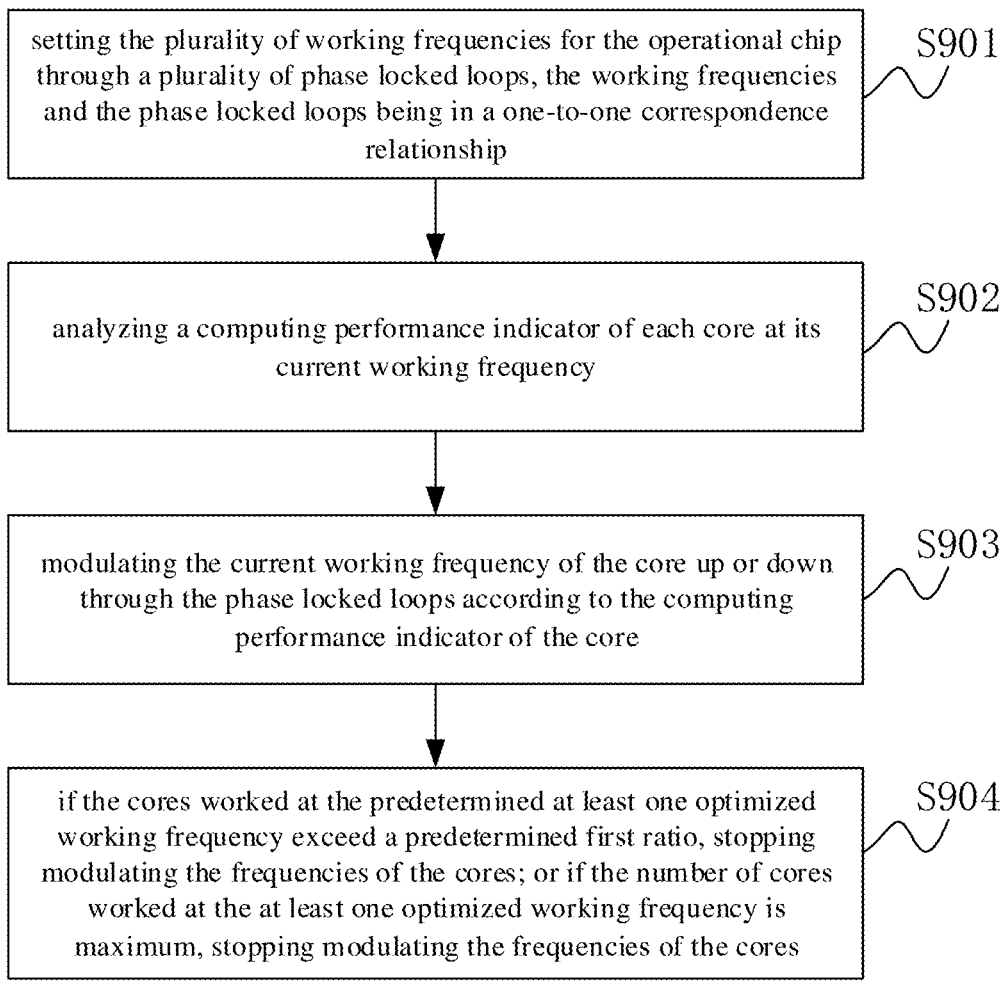
FIG. 9 is a flow diagram of a chip frequency modulation method of a computing device in the first embodiment of the invention.

FIG. 9 is a flow diagram of a chip frequency modulation method of a computing device in the first embodiment of the invention, which can be implemented by the chip frequency modulation apparatus 100 of the computing device shown in FIG. 2. The computing device comprises at least one operational chip, and the operational chip is provided with a plurality of cores. The computing device is preferably for mass operation, such as, operation of mining virtual digital currency. The method comprises steps of:

Step S901, setting the plurality of working frequencies for the operational chip through a plurality of phase locked loops 70, the working frequencies and the phase locked loops 70 being in a one-to-one correspondence relationship.

Preferably, the phase locked loops 70 shown in FIG. 2 are provided inside or outside the operational chip. The number of working frequencies and a distance between the frequencies in the invention can be set according to actual needs, and the more the working frequencies are, the most likely the computing performance of the respective cores 80 will be fully played. For example, six working frequencies 500 MHz, 550 MHz, 600 MHz, 650 MHz, 700 MHz and 750 MHz are set. Therefore, the invention can set more phase locked loops 70 to provide more working frequencies, thereby fully playing the computing performance of the respective cores 80.

It shall be noticed that a frequency difference between the working frequencies in the invention shall be controlled within a reasonable range, because when the core 80 is improved by one working frequency, the working frequency of the core is improved by one frequency difference, thereby improving certain computing performance due to improvement of the computing speed. Meanwhile, improvement of the working frequency of the core may cause loss of certain computing performance due to reduction of the computing correct ratio. Therefore, the frequency setting module 10 shall reasonably control the frequency difference between the adjacent working frequencies, such that when the core 80 is modulated up from the current working frequency to the upper working frequency, benefit of the computing performance of the core 80 shall be greater than loss. Preferably, a frequency difference between the adjacent working frequencies is from 1% to 10%.

Step S902, analyzing a computing performance indicator of each core 80 at its current working frequency.

The computing performance indicator represents the actual computing performance of the core 80 at the current working frequency, and includes, but is not limited to a computing correct ratio, a computing correct number, a computing speed and the like. If the computing performance indicator of the core 80 is high, it means that the computing performance of the core 80 may have room for improvement, and if the computing performance indicator of the core 80 is low, it means that the computing performance of the core 80 may be insufficient to work at the frequency corresponding to the current working frequency.

Preferably, the step analyzes whether the computing performance indicator of the core 80 reaches predetermined first, second and/or third indicator thresholds within a predetermined modulation period, the first indicator threshold being the same as or different from the second indicator threshold.

Step S903, modulating the current working frequency of the core 80 up or down through the phase locked loops 70 shown in FIG. 2 according to the computing performance indicator of the core 80. Of course, the step also can modulate the current working frequency of the core 80 up or down through other hardware or software.

Preferably, the Step Further Comprises:

(1) if the computing performance indicator of the core 80 reaches the first indicator threshold, modulating the current working frequency of the core 80 up to the upper working frequency;

(2) if the computing performance indicator of the core 80 does not reach the second indicator threshold, modulating the current working frequency of the core 80 down to the lower working frequency; and/or (3) if the computing performance indicator of the core 80 reaches the third indicator threshold, modulating the current working frequency of the core 80 down to the lower working frequency.

For example, taking "for example, six working frequencies 500 MHz, 550 MHz, 600 MHz, 650 MHz, 700 MHz and 750 MHz are set", and the current working frequency of the core 80 to be 600 MHz for example, the computing performance indicator is the computing correct ratio of the core 80 within the modulation period, and the first indicator threshold and the second indicator threshold are both 90%. If the computing correct ratio of the core 80 within the modulation period reaches 90%, it means that the computing performance of the core 80 is good, so the current working frequency 600 MHz of the core 80 is modulated up to the upper working frequency 650 MHz. If the computing correct ratio of the core 80 within the modulation period does not reach 90%, it means that the computing performance of the core 80 is poor, so the current working frequency 600 MHz of the core 80 is modulated down to the lower working frequency 550 MHz. Those skilled in the art can understand that the upper working frequency is not limited to the upper adjacent working frequency, and one or more upper adjacent working frequencies also can be the upper working frequency; the lower working frequency is not limited to the lower adjacent working frequency, and one or more lower adjacent working frequencies also can be the lower working frequency. Preferably, a frequency difference between the current working frequency and the upper working frequency is from 1% to 10%, and a frequency difference between the current working frequency and the lower working frequency is from 1% to 10%, such that the core 80 is modulated up from the current working frequency to the upper working frequency or the lower working frequency, and benefit of the computing performance of the core 80 shall be greater than loss. That is, the current working frequency 600 MHz of the core 80 is modulated up to the upper working frequency 700 MHz, the current working frequency 600 MHz of the core 80 is modulated down to the lower working frequency 500 MHz, and so on. Here, a spacing between the upper working frequency and the lower working frequency is not limited.

For another example, the computing performance indicator is the computing correct ratio of the core 80 within the modulation period, the first indicator threshold is 90%, and the second indicator threshold is 80%. If the computing correct ratio of the core 80 within the modulation period reaches 90%, it means that the computing performance of the core 80 is good, so the current working frequency 600 MHz of the core 80 is modulated up to the upper working frequency 650 MHz. If the computing correct ratio of the core 80 within the modulation period does not reach 80%, it means that the computing performance of the core 80 is poor, so the current working frequency 600 MHz of the core 80 is modulated down to the lower working frequency 550 MHz.

For still another example, the computing performance indicator is the number of correct computations and the number of wrong computations of the core 80 within the modulation period, the first indicator threshold is 100, and the second indicator threshold is 10. If the number of correct computations of the core 80 within the modulation period reaches 100, it means that the computing performance of the core 80 is good, so the current working frequency 600 MHz of the core 80 is modulated up to the upper working frequency 650 MHz. If the number of wrong computations of the core 80 within the modulation period reaches 10, it means that the computing performance of the core 80 is poor, so the current working frequency 600 MHz of the core 80 is modulated down to the lower working frequency 550 MHz.

Step S904, if the cores 80 worked at the predetermined at least one optimized working frequency exceed a predetermined first ratio, stopping modulating the frequencies of the cores 80; or if the number of cores 80 worked at the at least one optimized working frequency is maximum, stopping modulating the frequencies of the cores 80.

For example, one or more optimized working frequencies can be selected and preset from the plurality of working frequencies, and if the working frequencies of most cores 80 have reached the optimized working frequencies, it shows that the working frequencies of the respective cores 80 in the operational chip have been in an optimized state, thereby fully playing the computing performance of the respective cores 80 without further frequency modulation, so the working frequencies of the cores 80 are stopped modulation. For example, six working frequencies 500 MHz, 550 MHz, 600 MHz, 650 MHz, 700 MHz and 750 MHz are set, two optimized working frequencies 600 MHz and 650 MHz are selected as optimized working frequencies, and if over 50% of the cores 80 are worked at the working frequencies 600 MHz and 650 MHz, the frequencies of the cores 80 are stopped modulation.

Figure 10:
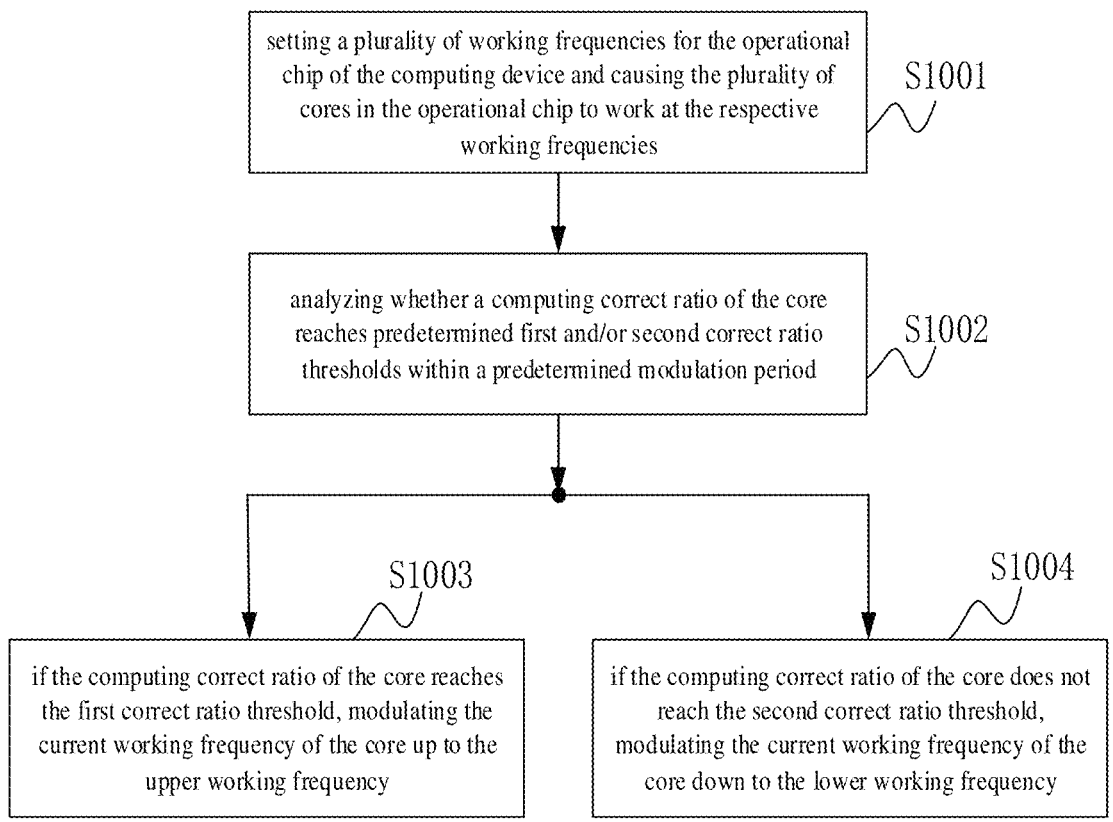
FIG. 10 is a flow diagram of a chip frequency modulation method of a computing device in the second embodiment of the invention.

FIG. 10 is a flow diagram of a chip frequency modulation method of a computing device in the second embodiment of the invention, which can be implemented by the chip frequency modulation apparatus 100 of the computing device shown in FIG. 3. The computing device comprises at least one operational chip, and the operational chip is provided with a plurality of cores. The computing device is preferably for mass operation, such as, operation of mining virtual digital currency. The method comprises steps of:

Step S1001, setting a plurality of working frequencies for the operational chip of the computing device and causing the plurality of cores 80 in the operational chip to work at the respective working frequencies.

The step sets a plurality of working frequencies for each operational chip, and causes the plurality of cores 80 in the operational chip to work at the respective working frequencies according to the frequency modulation mechanism on a level of the operational chip. For example, six working frequencies 500 MHz, 550 MHz, 600 MHz, 650 MHz, 700 MHz and 750 MHz are set. The number of working frequencies and a distance between the frequencies in the invention can be set according to actual needs, and the more the working frequencies are, the most likely the computing performance of the respective cores 80 will be fully played. When a frequency modulation switch is turned on (without modulating the frequencies of the cores 80), the cores 80 can be evenly distributed, unevenly distributed or randomly distributed to work at the working frequencies depending on a predetermined rule.

Preferably, the step sets the plurality of working frequencies for the operational chip through a plurality of phase locked loops 70 shown in FIG. 2, and causes the plurality of cores 80 in the operational chip to work at the respective working frequencies, and the working frequencies and the phase locked loops 70 are in a one-to-one correspondence relationship. The invention can set more phase locked loops 70 to provide more working frequencies, such that the computing performance of the respective cores 80 are fully played. Of course, the method also can set the plurality of working frequencies for the operational chip through other hardware or software.

It shall be noticed that a frequency difference between the working frequencies in the invention shall be controlled within a reasonable range, because when the core 80 is improved by one working frequency, the working frequency of the core is improved by one frequency difference, thereby improving certain computing performance due to improvement of the computing speed. Meanwhile, improvement of the working frequency of the core may cause loss of certain computing performance due to reduction of the computing correct ratio. Therefore, a frequency difference between the adjacent working frequencies shall be reasonably controlled, such that when the core 80 is modulated up from the current working frequency to the upper working frequency, benefit of the computing performance of the core 80 shall be greater than loss. Preferably, a frequency difference between the adjacent working frequencies is from 1% to 10%.

Step S1002, analyzing whether a computing correct ratio of the core 80 reaches predetermined first and/or second correct ratio thresholds within a predetermined modulation period. The first correct ratio threshold is the same or different from the second correct ratio threshold. If the computing correct ratio of the core 80 reaches the predetermined first correct ratio threshold, it means that the computing performance of the core 80 may have room for improvement. If the computing correct ratio of the core 80 does not reach the predetermined second correct ratio threshold, it means that the computing performance of the core 80 may be insufficient to work at the frequency corresponding to the current working frequency.

Preferably, the Step S1002 Further Comprises:

(1) real-time analyzing whether the computing correct ratio of the core 80 within the modulation period reaches the first correct ratio threshold and/or the second correct ratio threshold according to a preset real-time modulating instruction;

(2) analyzing whether the computing correct ratio of the core 80 within the modulation period reaches the first correct ratio threshold and/or the second correct ratio threshold according to a preset timed modulating instruction within a modulation time period set by the timed modulating instruction; or (3) analyzing whether the computing correct ratio of the core 80 within the modulation period reaches the first correct ratio threshold and/or the second correct ratio threshold according to a received immediate modulating instruction.

Step S1003, if the computing correct ratio of the core 80 reaches the first correct ratio threshold, and shows that the core 80 does not reach the best computing performance, modulating the current working frequency of the core 80 up to the upper working frequency.

Preferably, the Step Further Comprises:

(1) if the computing correct ratio of the core 80 within the modulation period reaches the first correct ratio threshold, real-time modulating the current working frequency of the core 80 up to the upper working frequency;

(2) if the computing correct ratio of the core 80 within the modulation period reaches the first correct ratio threshold in the modulation time period, modulating the current working frequency of the core 80 up to the upper working frequency; or (3) according to the received immediate modulating instruction, if the computing correct ratio of the core 80 within the modulation period reaches the first correct ratio threshold, modulating the current working frequency of the core 80 up to the upper working frequency; according to a received stop modulating instruction, stopping modulating the current working frequency of the core 80.

For example, users can timely send the immediate modulating instruction to the computing device according to needs, and the computing device immediately starts analyzing the computing correct ratio of the core 80 according to the immediate modulating instruction. If the computing correct ratio of the core 80 exceeds the first correct ratio threshold (e.g., over 99%) within the modulation period (e.g., 10 minutes), the working frequency of the core 80 is modulated up, and if the computing correct ratio of the core 80 is less than the second correct ratio threshold (e.g., below 99%) within the modulation period (e.g., 10 minutes), the working frequency of the core 80 is modulated down. In addition, users can timely send stop modulating instruction to the computing device according to needs, and after receiving the stop modulating instruction, the computing device immediately stops modulating the frequency of the core 80.

Step S1004, if the computing correct ratio of the core 80 does not reach the second correct ratio threshold, and shows that the computing performance of the core 80 is insufficient to work at the current working frequency, modulating the current working frequency of the core 80 down to the lower working frequency.

Preferably, the Step Further Comprises:

(1) if the computing correct ratio of the core 80 within the modulation period does not reach the second correct ratio threshold, real-time modulating the current working frequency of the core 80 down to the lower working frequency;

(2) if the computing correct ratio of the core 80 within the modulation period does not reach the second correct ratio threshold in the modulation time period, modulating the current working frequency of the core 80 down to the lower working frequency; or (3) if the computing correct ratio of the core 80 within the modulation period does not reach the second correct ratio threshold, modulating the current working frequency of the core 80 down to the lower working frequency; according to a received stop modulating instruction, stopping modulating the current working frequency of the core 80.

The invention can modulate the frequency of the core 80 through the phase locked loops 70 shown in FIG. 2 or software. That is, according to the frequency modulation mechanism on a level of the cores, the core 80 is modulated to the suitable working frequency according to the actual computing performance of the core 80, the frequency of the core 80 with high computing performance is modulated up, and the frequency of the core 80 with low computing performance is modulated down, thereby fully playing the computing performance of each core 80.

For example, the first correct ratio threshold and the second correct ratio threshold are both 90%. When the core 80 is worked at 600 MHz, if the computing correct ratio of the core 80 within the predetermined modulation period exceeds 90% (it shows that the core 80 does not reach the best computing performance), the current working frequency 600 MHz of the core 80 is modulated up to the upper working frequency, i.e., the working frequency is improved to 650 MHz. If the computing correct ratio of the core 80 is less than 90% (it shows that the computing performance of the core 80 is insufficient to work at the frequency of the current working frequency 600 MHz), the current working frequency of the core 80 is modulated down to the lower working frequency, i.e., the working frequency is reduced to 550 MHz. Those skilled in the art can understand that the upper working frequency is not limited to the upper adjacent working frequency, and one or more upper adjacent working frequencies also can be the upper working frequency; the lower working frequency is not limited to the lower adjacent working frequency, and one or more lower adjacent working frequencies also can be the lower working frequency. Preferably, a frequency difference between the current working frequency and the upper working frequency is from 1% to 10%, and a frequency difference between the current working frequency and the lower working frequency is from 1% to 10%, such that the core 80 is modulated up from the current working frequency to the upper working frequency or the lower working frequency, and benefit of the computing performance of the core 80 shall be greater than loss. That is, the current working frequency 600 MHz of the core 80 is modulated up to the upper working frequency 700 MHz, the current working frequency 600 MHz of the core 80 is modulated down to the lower working frequency 500 MHz, and so on. Here, a spacing between the upper working frequency and the lower working frequency is not limited.

For another example, the first correct ratio threshold is 90%, and the second correct ratio threshold is 80%. If the core 80 is worked at 600 MHz, if the computing correct ratio of the core 80 within the predetermined modulation period exceeds 90% (it shows that the core 80 does not reach the best computing performance), the current working frequency of the core 80 is modulated up to the upper working frequency, i.e., the working frequency is improved to 650 MHz. If the computing correct ratio of the core 80 is less than 80% (it shows that the computing performance of the core 80 is insufficient to work at the frequency of the current working frequency 600 MHz), the current working frequency of the core 80 is modulated down to the lower working frequency, i.e., the working frequency is reduced to 550 MHz.

Figure 11:
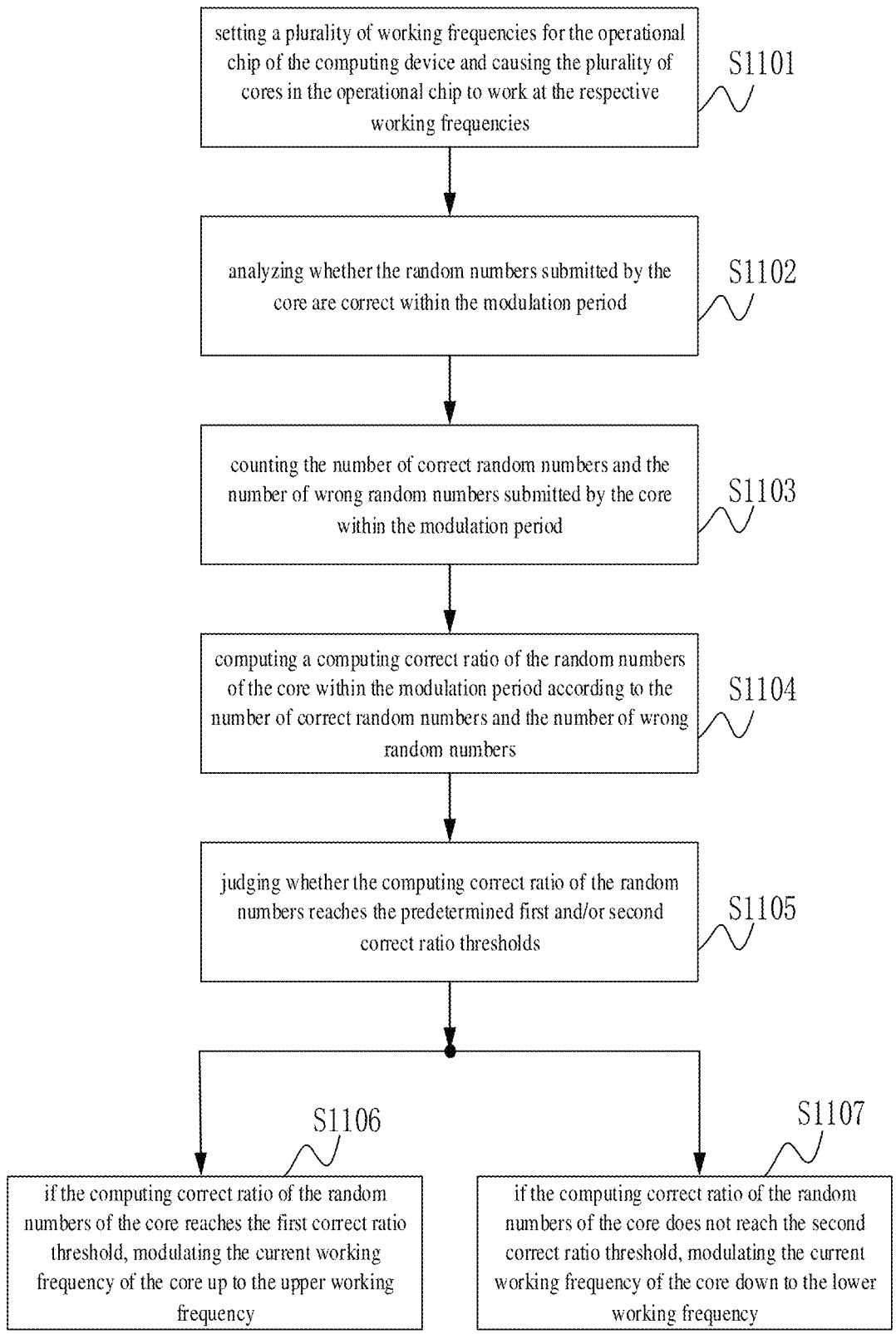
FIG. 11 is a flow diagram of a preferable chip frequency modulation method of a computing device in the second embodiment of the invention.

FIG. 11 is a flow diagram of a preferable chip frequency modulation method of a computing device in the second embodiment of the invention, which can be implemented by the chip frequency modulation apparatus 100 of the computing device shown in FIG. 3. The computing device comprises at least one operational chip, and the operational chip is provided with a plurality of cores. The computing device is preferably for mass operation, such as, operation of mining virtual digital currency. Preferably, the computing correct ratio can be a computing correct ratio of Nonces submitted by the core 80 within the modulation period. That is, during a predetermined time, in all Nonces submitted by the core 80, the computing correct ratio is a ratio occupied by correct Nonces. A block header in a blockchain comprises the Nonce (four bytes), Nonce is a random value, and the function of miners is actually to guess the value of Nonce, such that a hash of the block header can be less than a target value, and can be written into the blockchain. Specifically, this attribute starts from 0 to $2^{32}$ to compute the hash of the block header, and if the obtained hash result conforms to conditions, mining is successful. The method comprises steps of:

Step S1101, setting a plurality of working frequencies for the operational chip of the computing device and causing the plurality of cores 80 in the operational chip to work at the respective working frequencies.

Step S1102, analyzing whether the Nonces submitted by the core 80 are correct within the modulation period.

Preferably, the Step Comprises:

(1) computing, via the core 80, a first result from the Nonce through a predetermined algorithm every time when the core 80 submits one Nonce within the modulation period, the first result including a first feature. The Nonce submitted by each core 80 includes identification information (ID) of Nonce, thereby counting the computing result of each core 80.

(2) computing, via a verification unit of the operational chip, a second result from the Nonce through the same algorithm, the second result including a second feature.

(3) if the first feature is the same as the second feature, judging, via the verification unit, that the Nonce is the correct Nonce, or the Nonce is the wrong Nonce.

For example, after the core 80 computes and submits one Nonce, the Nonce is embedded into the block header to compute a first hash result, and value of front twenty bits of the first hash result is 0 (the first feature). The first verification unit 212 also embeds the Nonce into the block header to compute a second hash result, and if value of front twenty bits of the second hash result is also 0 (the second feature), it is considered that the Nonce is one correct submission.

Step S1103, counting the number of correct Nonces and the number of wrong Nonces submitted by the core 80 within the modulation period;

Step S1104, computing a computing correct ratio of Nonces of the core 80 within the modulation period according to the number of correct Nonces and the number of wrong Nonces;

Step S1105, judging whether the computing correct ratio of Nonces reaches the predetermined first and/or second correct ratio thresholds, if the computing correct ratio of Nonces of the core 80 reaches the first correct ratio threshold, executing step S1106, and if the computing correct ratio of Nonces of the core 80 does not reach the second correct ratio threshold, executing step S1107;

Step S1106, if the computing correct ratio of Nonces of the core 80 reaches the first correct ratio threshold, modulating the current working frequency of the core 80 up to the upper working frequency;

Step S1107, if the computing correct ratio of Nonces of the core 80 does not reach the second correct ratio threshold, modulating the current working frequency of the core 80 down to the lower working frequency.

Figure 12:
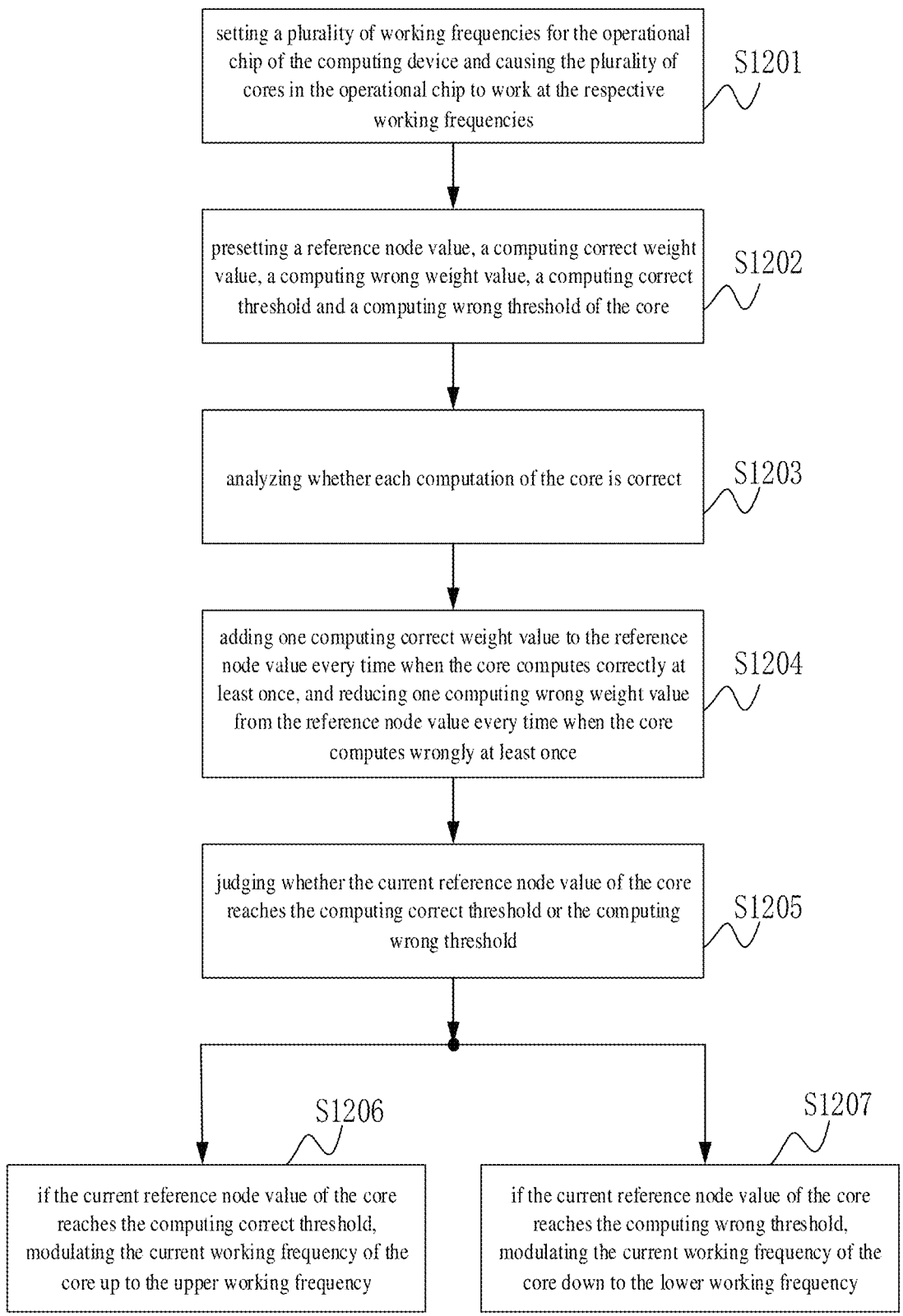
FIG. 12 is a flow diagram of a chip frequency modulation method of a computing device in the third embodiment of the invention.

FIG. 12 is a flow diagram of a chip frequency modulation method of a computing device in the third embodiment of the invention, which can be implemented by the chip frequency modulation apparatus 100 of the computing device shown in FIG. 4. The computing device comprises at least one operational chip, and the operational chip is provided with a plurality of cores. The computing device is preferably for mass operation, such as, operation of mining virtual digital currency. The method comprises steps of:

Step S1201, setting a plurality of working frequencies for the operational chip of the computing device and causing the plurality of cores 80 in the operational chip to work at the respective working frequencies.

The step sets a plurality of working frequencies for each operational chip, and causes the plurality of cores 80 in the operational chip to work at the respective working frequencies according to the frequency modulation mechanism on a level of the operational chip. For example, six working frequencies 500 MHz, 550 MHz, 600 MHz, 650 MHz, 700 MHz and 750 MHz are set. The number of working frequencies and a distance between the frequencies in the invention can be set according to actual needs, and the more the working frequencies are, the most likely the computing performance of the respective cores 80 will be fully played. When a frequency modulation switch is turned on (without modulating the frequencies of the cores 80), the cores 80 can be evenly distributed, unevenly distributed or randomly distributed to work at the working frequencies depending on a predetermined rule. Preferably, the plurality of working frequencies can be set for the operational chip through a plurality of phase locked loops 70 shown in FIG. 2. Of course, the plurality of working frequencies also can be set for the operational chip through other hardware or software.

It shall be noticed that a frequency difference between the working frequencies in the invention shall be controlled within a reasonable range, because when the core 80 is improved by one working frequency, the working frequency of the core is improved by one frequency difference, thereby improving certain computing performance due to improvement of the computing speed. Meanwhile, improvement of the working frequency of the core may cause loss of certain computing performance due to reduction of the computing correct ratio. Therefore, the frequency setting module 10 shall reasonably control the frequency difference between the adjacent working frequencies, such that when the core 80 is modulated up from the current working frequency to the upper working frequency, benefit of the computing performance of the core 80 shall be greater than loss. Preferably, a frequency difference between the adjacent working frequencies is from 1% to 10%.

Step S1202, presetting a reference node value, a computing correct weight value, a computing wrong weight value, a computing correct threshold and a computing wrong threshold of the core 80.

Preferably, the computing correct weight value can be the same as or different from the computing wrong weight value, and the computing correct threshold can be the same as or different from the computing wrong threshold. The reference node value, the computing correct weight value, the computing wrong weight value, the computing correct threshold and the computing wrong threshold are all adjustable parameters, and can be optimized according to actual needs such as frequency modulation speed.

Preferably, the reference node value, the computing correct weight value, the computing wrong weight value, the computing correct threshold and/or the computing wrong threshold of the core 80 are set and adjusted according to actual requirements, the computing correct weight value is the same as or different from the computing wrong weight value, and the computing correct threshold is the same as or different from the computing wrong threshold.

An expected tolerant resident error ratio of the core 80 is controlled by controlling a ratio of the computing correct weight value to the computing wrong weight value. A computing formula of the resident error ratio is: the resident error ratio=the computing correct weight value divided by the computing correct weight value and the computing wrong weight value.

A modulation period is controlled by controlling an absolute value of the computing correct weight value and the computing wrong weight value.

The modulation period is controlled by controlling an absolute value of the computing correct threshold and the computing wrong threshold.

Step S1203, analyzing whether each computation of the core 80 is correct.

The core 80 can make various different computations to analyze whether one or more computations of the core 80 each time are correct. Preferably, whether the Nonces computed by the core 80 are correct is analyzed.

Step S1204, adding one computing correct weight value to the reference node value every time when the core 80 computes correctly at least once, and reducing one computing wrong weight value from the reference node value every time when the core 80 computes wrongly at least once. Preferably, one computing correct weight value is added to the reference node value every time when the core 80 computes correctly once. Of course, it can be set that one computing correct weight value is added to the reference node value every time when the core 80 computes correctly N (N is a natural number greater than 1) times. One computing wrong weight value is reduced from the reference node value every time when the core 80 computes wrongly once. Of course, it can be set that one computing wrong weight value is reduced from the reference node value every time when the core 80 computes wrongly N (N is a natural number greater than 1) times.

Step S1205, judging whether the current reference node value of the core 80 reaches the computing correct threshold or the computing wrong threshold, if the current reference node value of the core 80 reaches the computing correct threshold, executing step S1206, and if the current reference node value of the core 80 reaches the computing wrong threshold, executing step S1207.

Preferably, the Step Comprises:

(1) real-time judging whether the current reference node value of the core 80 reaches the computing correct threshold or the computing wrong threshold according to a preset real-time modulating instruction; or (2) judging whether the current reference node value of the core 80 reaches the computing correct threshold or the computing wrong threshold according to a preset timed modulating instruction within a modulation time period set by the timed modulating instruction; or (3) analyzing whether the current reference node value of the core 80 reaches the computing correct threshold or the computing wrong threshold according to a received immediate modulating instruction.

Step S1206, if the current reference node value of the core 80 reaches the computing correct threshold, and shows that the core 80 does not reach the best computing performance, modulating the current working frequency of the core 80 up to the upper working frequency.

Preferably, the Step Comprises:

(1) if the current reference node value of the core 80 reaches the computing correct threshold, real-time modulating the current working frequency of the core 80 up to the upper working frequency; or (2) if the current reference node value of the core 80 reaches the computing correct threshold in the modulation time period, modulating the current working frequency of the core 80 up to the upper working frequency; or (3) according to the received immediate modulating instruction, if the current reference node value of the core 80 reaches the computing correct threshold, modulating the current working frequency of the core 80 up to the upper working frequency; according to a received stop modulating instruction, stopping modulating the current working frequency of the core 80.

Step S1207, if the current reference node value of the core 80 reaches the computing wrong threshold, and shows that the computing performance of the core 80 is insufficient to work at the current working frequency, modulating the current working frequency of the core 80 down to the lower working frequency.

Preferably, the Step Comprises:

(1) if the current reference node value of the core 80 reaches the computing wrong threshold, real-time modulating the current working frequency of the core 80 down to the lower working frequency; or (2) if the current reference node value of the core 80 reaches the computing wrong threshold in the modulation time period, modulating the current working frequency of the core 80 down to the lower working frequency; or (3) if the current reference node value of the core 80 reaches the computing wrong threshold, modulating the current working frequency of the core 80 down to the lower working frequency; according to a received stop modulating instruction, stopping modulating the current working frequency of the core 80.

For example, users can timely send the immediate modulating instruction to the computing device according to needs, and users add a weight A to the reference node every time when the core 80 computes the correct Nonce once, and reduce a weight B from the reference node every time when the core 80 computes the wrong Nonce once. When the currently added value reaches the computing correct number threshold C, the core 80 steps upward to the upper frequency. When the currently reduced value reaches the computing wrong number threshold D, the core 80 steps downward to the lower frequency. In addition, users can timely send stop modulating instruction to the computing device according to needs, and after receiving the stop modulating instruction, the computing device immediately stops modulating the frequency of the core 80.

Those skilled in the art can understand that the upper working frequency is not limited to the upper adjacent working frequency, and one or more upper adjacent working frequencies also can be the upper working frequency; the lower working frequency is not limited to the lower adjacent working frequency, and one or more lower adjacent working frequencies also can be the lower working frequency. Preferably, a frequency difference between the current working frequency and the upper working frequency is from 1% to 10%, and a frequency difference between the current working frequency and the lower working frequency is from 1% to 10%, such that the core 80 is modulated up from the current working frequency to the upper working frequency or the lower working frequency, and benefit of the computing performance of the core 80 shall be greater than loss. That is, the current working frequency 600 MHz of the core 80 is modulated up to the upper working frequency 700 MHz, the current working frequency 600 MHz of the core 80 is modulated down to the lower working frequency 500 MHz, and so on. Here, a spacing between the upper working frequency and the lower working frequency is not limited.

Preferably, the step can modulate the frequency of the core 80 through the phase locked loops 70 shown in FIG. 2 or software. That is, according to the frequency modulation mechanism on a level of the cores, the core 80 is modulated to the suitable working frequency according to the actual computing performance of the core 80, the frequency of the core 80 with high computing performance is modulated up, and the frequency of the core 80 with low computing performance is modulated down, thereby fully playing the computing performance of each core 80.

For example, as shown in FIG. 5, the reference node value is set to be 400,000, the computing correct weight value is set to be 180, the computing wrong weight value is set to be 9,000, and the computing correct threshold and the computing wrong threshold are both set to be 100,000.

180 (the computing correct weight value) is added to the reference node value every time when the core 80 computes correctly at least once, 9,000 (the computing wrong weight value) is reduced from the reference node value every time when the core 80 computes wrongly at least once, and taking the reference node value for reference, the upper frequency or the lower frequency is stepped upward or downward every time when 100,000 (the computing correct threshold and the computing wrong threshold) is added or reduced.

The current mechanism is similar with wrong or correct tug-of-war mechanism, correct and wrong mechanisms may have different weights. The reference node value is set. One computing correct weight value is added every time when one correct result is received, one computing wrong weight value is reduced every time when one wrong result is received, and if reward or punishment exceeds a corresponding threshold, the frequency is modulated up or down. It can be understood that the system has a marker, the reference node value is an initial value of the marker, maker +180 for correct submission, and maker-9000 for each wrong submission. After Nth (N is a natural number greater than or equal to 1) corrects and Mth (M is a natural number greater than or equal to 1) errors, the marker shall be at a position of 400000+N*180-M*9000, and if the marker exceeds one threshold, the frequency is modulated correspondingly (modulating up or down). Then, every time when the frequency is modulated to a new frequency, the value is initialized, i.e., the current reference node value is reset to an initial reference node value.

Figure 13:
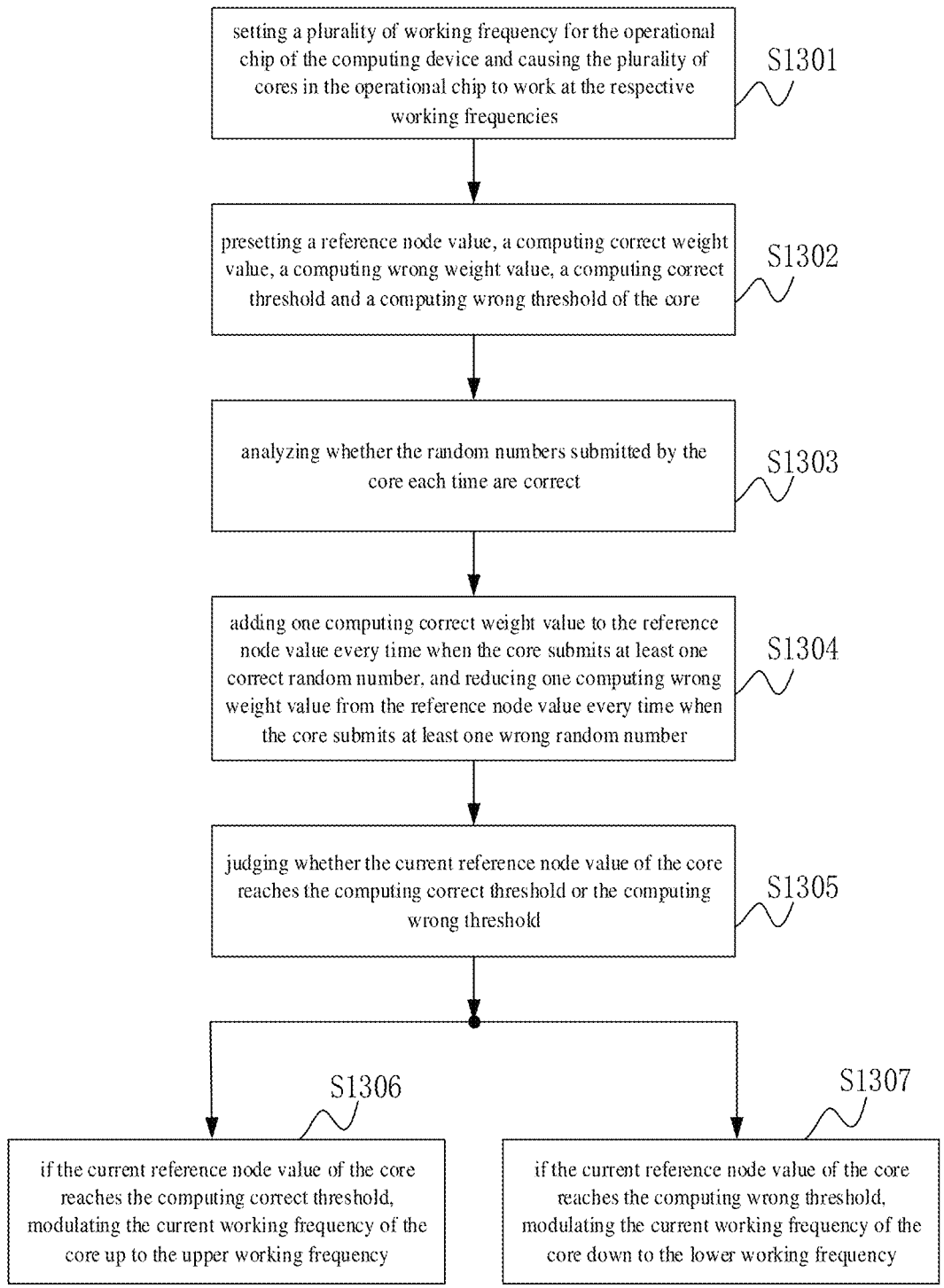
FIG. 13 is a flow diagram of a preferable chip frequency modulation method of a computing device in the third embodiment of the invention.

FIG. 13 is a flow diagram of a preferable chip frequency modulation method of a computing device in the third embodiment of the invention, which can be implemented by the chip frequency modulation apparatus 100 of the computing device shown in FIG. 4. The computing device comprises at least one operational chip, and the operational chip is provided with a plurality of cores. The computing device is preferably for mass operation, such as, operation of mining virtual digital currency. The method comprises steps of:

Step S1301, setting a plurality of working frequency for the operational chip of the computing device and causing the plurality of cores 80 in the operational chip to work at the respective working frequencies;

Step S1302, presetting a reference node value, a computing correct weight value, a computing wrong weight value, a computing correct threshold and a computing wrong threshold of the core 80;

Step S1303, analyzing whether the Nonces submitted by the core 80 each time are correct.

Preferably, the Step Further Comprises:

(1) computing, via the core 80, a first result from the Nonce through a predetermined algorithm after the core 80 submits one Nonce, the first result including a first feature;

(2) computing, via a verification unit of the operational chip, a second result from the Nonce through the same algorithm, the second result including a second feature.

(3) if the first feature is the same as the second feature, judging, via the verification unit, that the Nonce is the correct Nonce, or the Nonce is the wrong Nonce.

For example, after the core 80 computes and submits one Nonce, the Nonce is embedded into the block header to compute a first hash result, and value of front twenty bits of the first hash result is 0 (the first feature). The second verification unit 252 also embeds the Nonce into the block header to compute a second hash result, and if value of front twenty bits of the second hash result is also 0 (the second feature), it is considered that the Nonce is one correct submission.

Step S1304, adding one computing correct weight value to the reference node value every time when the core 80 submits at least one correct Nonce, and reducing one computing wrong weight value from the reference node value every time when the core 80 submits at least one wrong Nonce. Preferably, one computing correct weight value is added to the reference node value every time when the core 80 submits one correct Nonce. Of course, it also can be set that one computing correct weight value is added to the reference node value every time when the core 80 submits Nth (N is a natural number greater than 1) correct Nonces. One computing wrong weight value is reduced from the reference node value every time when the core 80 submits one wrong Nonce. Of course, it also can be set that one computing wrong weight value is reduced from the reference node value every time when the core 80 submits Nth (N is a natural number greater than 1) wrong Nonces.

Step S1305, judging whether the current reference node value of the core 80 reaches the computing correct threshold or the computing wrong threshold, if the current reference node value of the core 80 reaches the computing correct threshold, executing step S1306, and if the current reference node value of the core 80 reaches the computing wrong threshold, executing step S1307.

Step S1306, if the current reference node value of the core 80 reaches the computing correct threshold, modulating the current working frequency of the core 80 up to the upper working frequency.

Step S1307, if the current reference node value of the core 80 reaches the computing wrong threshold, modulating the current working frequency of the core 80 down to the lower working frequency.

In one specific application embodiment of the invention, six phase locked loops 70 are used, and six working frequencies 500 MHz, 550 MHz, 600 MHz, 650 MHz, 700 MHz and 750 MHz are set. As shown in FIG. 5, the reference node value is set to be 400,000, the computing correct weight value is set to be 180, the computing wrong weight value is set to be 9,000, and the computing correct threshold and the computing wrong threshold are both set to be 100,000.

The number of cores distributed at the respective corresponding frequencies as counted by four hash boards is as follows:

Hash board 0: [294 26 96 224 1023 1665]
Hash board 1: [274 47 111 212 963 1721]
Hash board 2: [350 25 153 369 1381 1050]
Hash board 3: [488 33 184 367 1342 950]

Firstly, the mechanism is further explained with reference to data. According to the resident error ratio S=the computing correct weight value divided by the computing correct weight value and the computing wrong weight value, the resident error ratio S (which is understood to long-term reside on one frequency) of the core 80 can be inferred to be 180/(180+9000)=1.29% through the given data. Accordingly, the core 80 is worked at one frequency for a long time (because a desired step is 0), and the working frequency is not modulated up or down. It can be inferred that if a computing error ratio of the core 80 is greater than 1.29% (the resident error ratio S), the working frequency is modulated up, and if a computing error ratio of the core 80 is less than 1.29% (the resident error ratio S), the working frequency is modulated down.

According to difficulty of settings (the difficulty is associated with a verification reference, and has influence on the computing correct ratio of the core 80, and the larger a coefficient of difficulty is, the lower the correct ratio will be; in contrast, the higher the correct ratio will be), a substantial period of modulation when error rises can be inferred. Assuming that an error ratio is e, the desired step of each Nonce is: (1-e)*180-e*9000=180-9180e. Taking e=0.5% for example, the desired step equals to 134.1, taking e=1% for example, the desired step equals to 88.2, and taking e=2% for example, the desired step equals to −3.6.

Computation is made using 650 MHz, and an expectation of the single Nonce submitted by the core 80 is 1.3 per second (i.e., 1.3 Nonce is submitted within one second). Explanations are made using a scene where e is 0.5%, i.e., after 746 Nonces are submitted, the expectation can be modulated up once. When e is 1.0%, 1134 Nonces are submitted, and the expectation is modulated up once; if the error ratio is 2.0%, 27,778 Nonces are submitted, the expectation is modulated down once, and so on.

Figure 14:
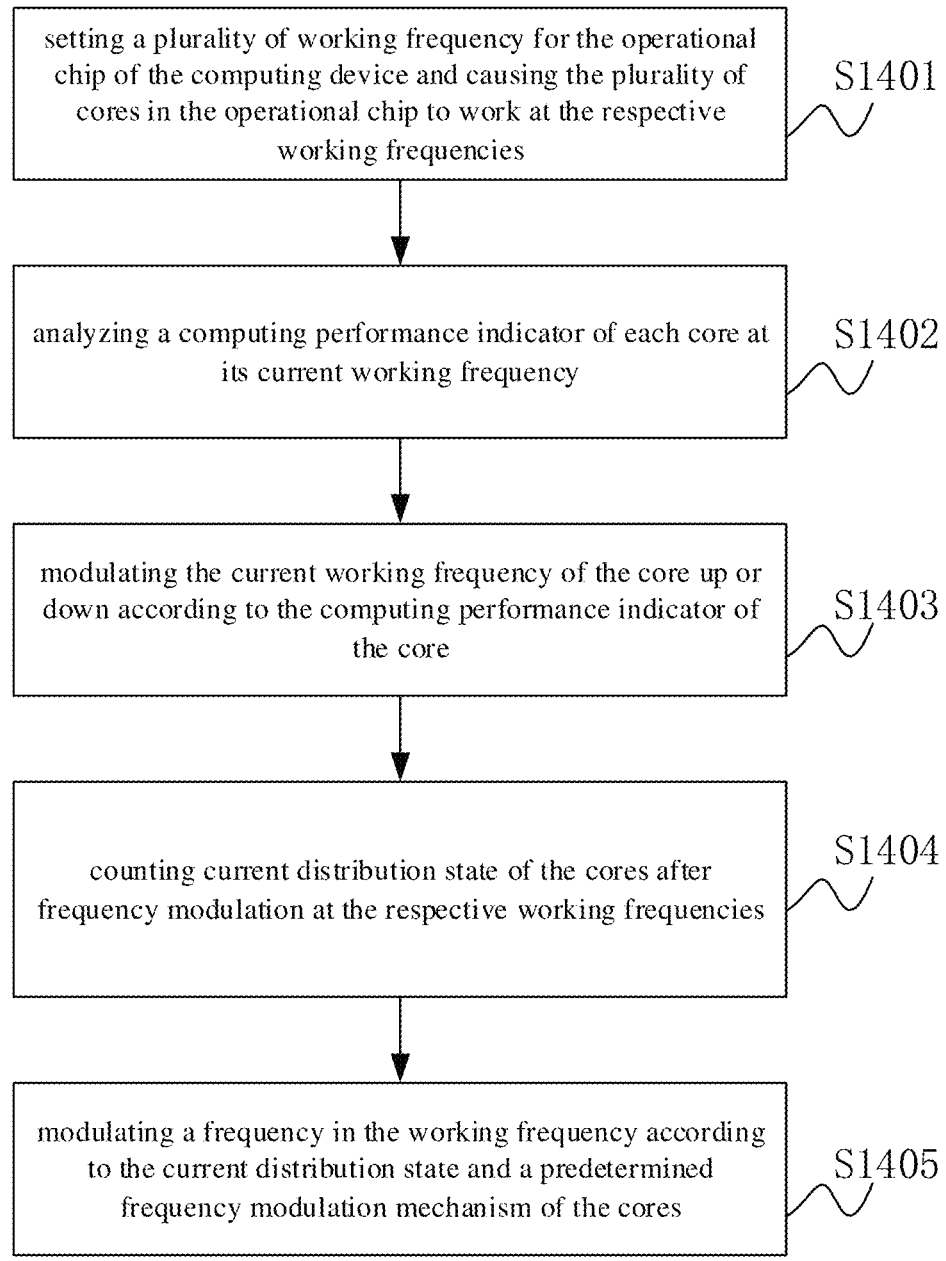
FIG. 14 is a flow diagram of a chip frequency modulation method of a computing device in the fourth embodiment of the invention.

FIG. 14 is a flow diagram of a chip frequency modulation method of a computing device in the fourth embodiment of the invention, which can be implemented by the chip frequency modulation apparatus 100 of the computing device. The computing device comprises at least one operational chip, and the operational chip is provided with a plurality of cores. The computing device is preferably for mass operation, such as, operation of mining virtual digital currency. The method comprises steps of:

Step S1401, setting a plurality of working frequency for the operational chip of the computing device and causing the plurality of cores 80 in the operational chip to work at the respective working frequencies.

The step sets a plurality of working frequencies for each operational chip, and causes the plurality of cores 80 in the operational chip to work at the respective working frequencies according to the frequency modulation mechanism on a level of the operational chip. For example, six working frequencies 500 MHz, 550 MHz, 600 MHz, 650 MHz, 700 MHz and 750 MHz are set. The number of working frequencies and a distance between the frequencies in the invention can be set according to actual needs, and the more the working frequencies are, the most likely the computing performance of the respective cores 80 will be fully played. When a frequency modulation switch is turned on (without modulating the frequencies of the cores 80), the cores 80 can be evenly distributed, unevenly distributed or randomly distributed to work at the working frequencies depending on a predetermined rule. The step can set the plurality of working frequencies for the operational chip through a plurality of phase locked loops 70 shown in FIG. 2. Of course, the method also can set the plurality of working frequencies for the operational chip through other hardware or software.

It shall be noticed that a frequency difference between the working frequencies in the invention shall be controlled within a reasonable range, because when the core 80 is improved by one working frequency, the working frequency of the core is improved by one frequency difference, thereby improving certain computing performance due to improvement of the computing speed. Meanwhile, improvement of the working frequency of the core may cause loss of certain computing performance due to reduction of the computing correct ratio. Therefore, the frequency setting module 10 shall reasonably control the frequency difference between the adjacent working frequencies, such that when the core 80 is modulated up from the current working frequency to the upper working frequency, benefit of the computing performance of the core 80 shall be greater than loss. Preferably, a frequency difference between the adjacent working frequencies is from 1% to 10%.

Step S1402, analyzing a computing performance indicator of each core 80 at its current working frequency.

The computing performance indicator represents the actual computing performance of the core 80 at the current working frequency, and includes, but is not limited to a computing correct ratio, a computing correct number, a computing speed and the like. If the computing performance indicator of the core 80 is high, it means that the computing performance of the core 80 may have room for improvement, and if the computing performance indicator of the core 80 is low, it means that the computing performance of the core 80 may be insufficient to work at the frequency corresponding to the current working frequency.

Step S1403, modulating the current working frequency of the core 80 up or down according to the computing performance indicator of the core 80.

According to the frequency modulation mechanism on a level of the cores, the step modulates the core 80 to the suitable working frequency according to the actual computing performance of the core 80, the frequency of the core 80 with high computing performance is modulated up, and the frequency of the core 80 with low computing performance is modulated down, thereby fully playing the computing performance of each core 80. The step can modulate the frequency of the core 80 through the phase locked loops 70 shown in FIG. 2 or software. Preferably, if the computing correct ratio of the core 80 within the modulation period reaches the first correct ratio threshold, it shows that the core 80 does not reach the best computing performance, so the current working frequency of the core 80 is modulated up to the upper working frequency. If the computing correct ratio of the core 80 within the modulation period does not reach the second correct ratio threshold, it shows that the computing performance of the core 80 is insufficient to work at the current working frequency, so the current working frequency of the core 80 is modulated down to the lower working frequency.

Those skilled in the art can understand that the upper working frequency is not limited to the upper adjacent working frequency, and one or more upper adjacent working frequencies also can be the upper working frequency; the lower working frequency is not limited to the lower adjacent working frequency, and one or more lower adjacent working frequencies also can be the lower working frequency. Preferably, a frequency difference between the current working frequency and the upper working frequency is from 1% to 10%, and a frequency difference between the current working frequency and the lower working frequency is from 1% to 10%, such that the core 80 is modulated up from the current working frequency to the upper working frequency or the lower working frequency, and benefit of the computing performance of the core 80 shall be greater than loss. That is, the current working frequency 600 MHz of the core 80 is modulated up to the upper working frequency 700 MHz, the current working frequency 600 MHz of the core 80 is modulated down to the lower working frequency 500 MHz, and so on. Here, a spacing between the upper working frequency and the lower working frequency is not limited.

Step S1404, counting current distribution state of the cores 80 after frequency modulation at the respective working frequencies.

After the working frequency is automatically modulated according to the computing performance itself, the cores 80 are distributed to work at the respective working frequencies, and counting the distributed number of the cores 80 after frequency modulation at the respective working frequencies can obtain the current distribution state. Preferably, the working frequency can be divided to comprise at least one high-frequency working frequency, at least one middle working frequency and at least one low-frequency working frequency, the maximum frequency in the high-frequency working frequency is a maximum working frequency, and the minimum frequency in the low-frequency working frequency is a minimum working frequency. For example, there are totally one thousand cores 80, six working frequencies 500 MHz, 550 MHz, 600 MHz, 650 MHz, 700 MHz and 750 MHz are set, and the number of cores 80 sequentially distributed at the six working frequencies is 100, 200, 100, 100, 200 and 300, respectively. 500 MHz and 550 MHz are low-frequency working frequencies, 600 MHz and 650 MHz are middle working frequencies, and 700 MHz and 750 MHz are high-frequency working frequency. 500 MHz is the minimum working frequency, and 750 MHz is the maximum working frequency.

Step S1405, modulating a frequency in the working frequency according to the current distribution state and a predetermined frequency modulation mechanism, the frequency modulation mechanism being a correspondence relationship between the distribution state and the frequency modulation of the cores 80.

The frequency modulation mechanism is a correspondence relationship between the distribution state and the frequency modulation. The distribution state of the cores refers to a distribution state of the cores 80 worked at the respective working frequency. Modulating a frequency in the working frequency refers to directly modulate the frequency in the working frequency. Preferably, the frequency in the working frequency is modulated through the phase locked loops 70 shown in FIG. 2. An ideal state of the invention is to hope that over the predetermined ratio (e.g., 50%) or the maximum number of cores 80 falls into the middle working frequencies, such that the frequencies of the cores 80 have a large room for modulation up.

For example, if over the predetermined ratio (e.g., 30%) of cores 80 are worked at the high working frequency (750 MHz), it may cause that the cores 80 do not play the maximum computing performance (which may be higher), so one working frequency (600 MHz) is modified to at least one optimized high-frequency working frequency (800 MHz), and the cores 80 originally worked at the working frequency (600 MHz) are all transferred to work at the maximum working frequency (750 MHz). The frequency in the optimized high-frequency working frequency is higher than the frequency in the maximum working frequency, thereby fully playing the computing performance of the respective cores 80.

Preferably, after the step S1405, the method may further comprise:

if the cores 80 exceeding a predetermined fourth ratio are worked at the at least one middle working frequency, stopping modulating the frequency in the working frequency; or if the number of cores 80 worked at the at least one middle working frequency is maximum, stopping modulating the frequency in the working frequency. A relative ideal state is that over the predetermined fourth ratio (e.g., 50%) or the maximum number of the cores 80 falls into one or more middle working frequencies, such as, the third working frequency (600 MHz), so frequency modulation of the cores 80 is unnecessary.

Figure 15:
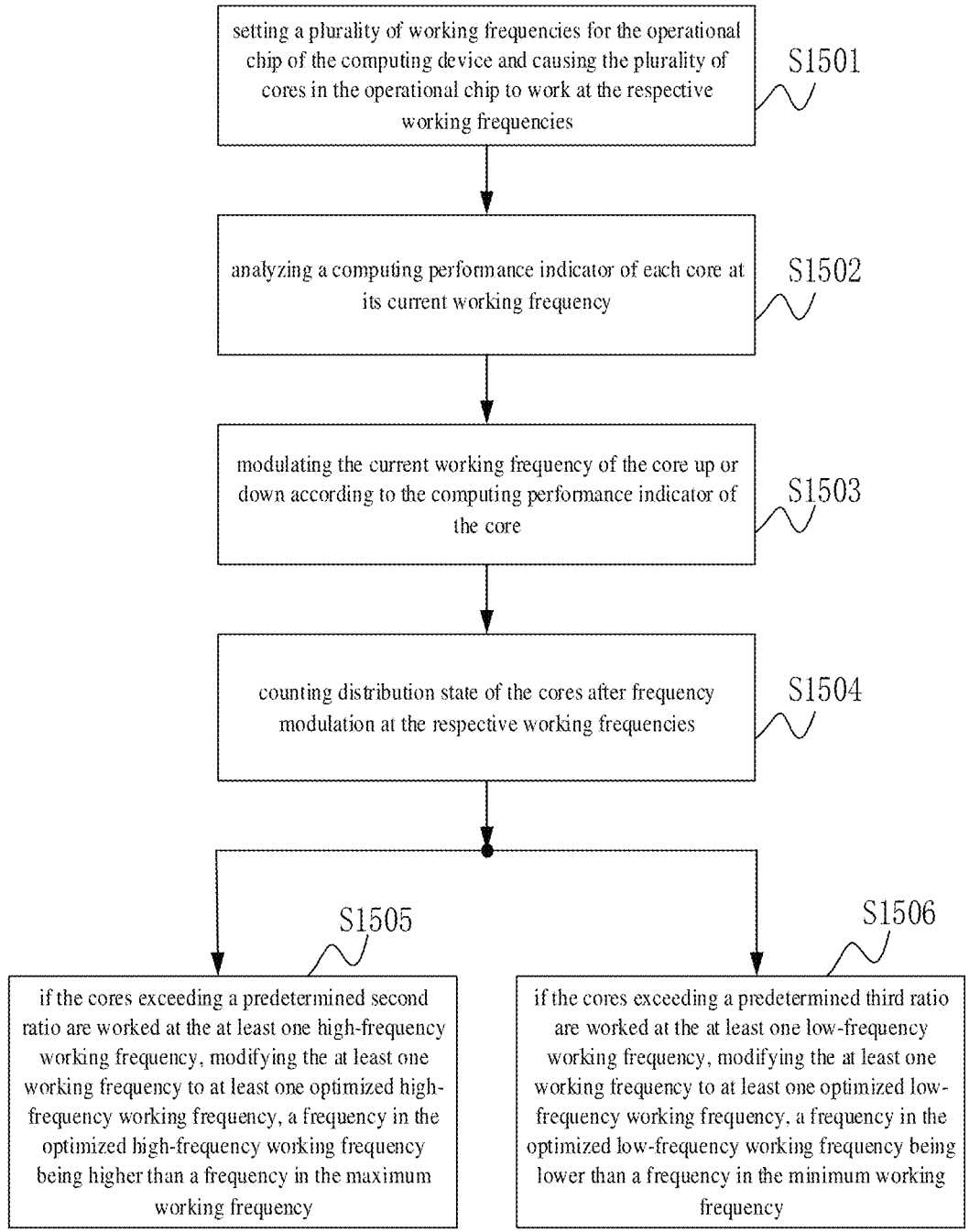
FIG. 15 is a flow diagram one of a preferable chip frequency modulation method of a computing device in the fourth embodiment of the invention.

FIG. 15 is a flow diagram one of a preferable chip frequency modulation method of a computing device in the fourth embodiment of the invention, which can be implemented by the chip frequency modulation apparatus 100 of the computing device. The computing device comprises at least one operational chip, and the operational chip is provided with a plurality of cores. The computing device is preferably for mass operation, such as, operation of mining virtual digital currency. The method comprises steps of:

Step S1501, setting a plurality of working frequencies for the operational chip of the computing device and causing the plurality of cores 80 in the operational chip to work at the respective working frequencies;

Step S1502, analyzing a computing performance indicator of each core 80 at its current working frequency;

Step S1503, modulating the current working frequency of the core 80 up or down according to the computing performance indicator of the core 80;

Step S1504, counting current distribution state of the cores 80 after frequency modulation at the respective working frequencies. The working frequency comprises at least one high-frequency working frequency, at least one middle working frequency and at least one low-frequency working frequency, the maximum frequency in the high-frequency working frequency is a maximum working frequency, the minimum frequency in the low-frequency working frequency is a minimum working frequency.

Step S1505, if the cores 80 exceeding a predetermined second ratio are worked at the at least one high-frequency working frequency, and may cause that the cores 80 do not play the maximum computing performance (which may be higher), modifying the at least one working frequency to at least one optimized high-frequency working frequency, and a frequency in the optimized high-frequency working frequency is higher than a frequency in the maximum working frequency. The modified working frequency can be a low-frequency working frequency, a middle working frequency and/or a high-frequency working frequency.

For example, six working frequencies 500 MHz, 550 MHz, 600 MHz, 650 MHz, 700 MHz and 750 MHz are set, and if over 30% (the second ratio) of the cores 80 are worked at the two high-frequency working frequencies (700 MHz and 750 MHz), the two low-frequency working frequencies (500 MHz and 550 MHz) are modified to two optimized high-frequency working frequencies (800 MHz and 850 MHz), or one low-frequency working frequency (500 MHz) and one middle working frequency (600 MHz) are modified to two optimized high-frequency working frequencies (800 MHz and 850 MHz).

Preferably, if the cores 80 exceeding the second ratio are worked at the maximum working frequency, the step modifies the one working frequency to the one optimized high-frequency working frequency, and a frequency in the optimized high-frequency working frequency is higher than a frequency in the maximum working frequency. The modified working frequency can be a low-frequency working frequency, a middle working frequency and/or a high-frequency working frequency.

For example, if over 30% (the second ratio) of the cores 80 are worked at the maximum working frequency (750 MHz), one low-frequency working frequency (500 MHz) is modified to an optimized high-frequency working frequency (800 MHz), or one middle working frequency (600 MHz) is modified to an optimized high-frequency working frequency (800 MHz), or the maximum working frequency (750 MHz) is modified to an optimized high-frequency working frequency (800 MHz).

Step S1506, if the cores 80 exceeding a predetermined third ratio are worked at the at least one low-frequency working frequency, and means that the computing capability of the cores 80 is too poor to be insufficient to work at the low-frequency working frequency, modifying the at least one working frequency to at least one optimized low-frequency working frequency, and a frequency in the optimized low-frequency working frequency is lower than a frequency in the minimum working frequency. It shall be noticed that the step can be omitted, i.e., the at least one working frequency is not modified to at least one optimized low-frequency working frequency.

The modified working frequency can be a low-frequency working frequency, a middle working frequency and/or a high-frequency working frequency. For example, six working frequencies 500 MHz, 550 MHz, 600 MHz, 650 MHz, 700 MHz and 750 MHz are set, and if over 30% (the third ratio) of the cores 80 are worked at the two low-frequency working frequencies (500 MHz and 550 MHz), the two low-frequency working frequencies (500 MHz and 550 MHz) are modified to two optimized low-frequency working frequencies (400 MHz and 450 MHz), or one low-frequency working frequency (500 MHz) and one middle working frequency (600 MHz) are modified to two optimized low-frequency working frequencies (400 MHz and 450 MHz).

Preferably, if the cores 80 exceeding the third ratio are worked at the minimum working frequency, the step modifies the one working frequency to the one optimized low-frequency working frequency. The modified working frequency can be a low-frequency working frequency, a middle working frequency and/or a high-frequency working frequency. For example, if over 30% (the third ratio) of the cores 80 are worked at the minimum working frequency (500 MHz), one low-frequency working frequency (500 MHz) is modified to an optimized low-frequency working frequency (450 MHz), or one middle working frequency (600 MHz) is modified to an optimized low-frequency working frequency (450 MHz), or the maximum working frequency (750 MHz) is modified to an optimized low-frequency working frequency (450 MHz)

Preferably, after the step S1506, the method further comprises:

if the cores 80 exceeding a predetermined fourth ratio are worked at the at least one middle working frequency, stopping modulating the frequency in the working frequency, because a relative ideal state is that over the predetermined fourth ratio (e.g., 50%) of the cores 80 falls into one or more middle working frequencies, such as, the third working frequency (600 MHz), which can fully play the working performance of the cores 80, so frequency modulation of the cores 80 is unnecessary.

if the number of cores 80 worked at the at least one middle working frequency is maximum, stopping modulating the frequency in the working frequency, because a relative ideal state is that the maximum number of the cores 80 falls into one or more middle working frequencies, such as, the third working frequency (600 MHz), which can fully play the working performance of the cores 80, so frequency modulation of the cores 80 is unnecessary.

In one specific application embodiment of the invention, six phase locked loops 70 are used, and six working frequencies 500 MHz, 550 MHz, 600 MHz, 650 MHz, 700 MHz and 750 MHz are set.

The number of cores distributed at the respective corresponding frequencies as counted by four hash boards is as follows:

Hash board 0: [294 26 96 224 1023 1665]
Hash board 1: [274 47 111 212 963 1721]
Hash board 2: [350 25 153 369 1381 1050]
Hash board 3: [488 33 184 367 1342 950]

Taking the four hash boards 0-3 for example, as shown in FIG. 7, data substantially conforms to a normal distribution, and the minimum working frequency (500 MHz) is the minimum frequency where the single core 80 is worked, and is unable to be modulated down (if the error ratio is too high, it can consider closing the minimum frequency). If over the predetermined ratio (e.g., 50%) of the cores 80 are accumulated at the maximum working frequency (750 MHz), it means not playing the maximum efficiency (which may be higher), and the entire operational chip has further room for improvement. A relative ideal state is that over the predetermined ratio (e.g., 50%) or the maximum number of cores 80 falls into one or more middle working frequencies, such as, the third working frequency (600 MHz). To fully use the computing performance of the cores 80, a long tail at the high performance side, rather than a long tail at the low frequency, shall be considered.

Taking the hash boards 0-1 for example, it can be seen that if the frequency 600 MHz is removed, and if left shift as a whole is used, generally, one hundred cores 80 fall at the frequency 550 MHz, and the current frequency is obviously in a left low-frequency region, which does not facilitate fully playing the computing performance of the cores 80. Therefore, right shift as a whole is more suitable, i.e., a whole shifting way. If the frequency 550 MHz is set to right as a whole to above the frequency 800 MHz through the phase locked loops 70, it is expected that several hundreds of the cores 80 are improved over 800 MHz, thereby improving the overall computing performance.

Figure 16:
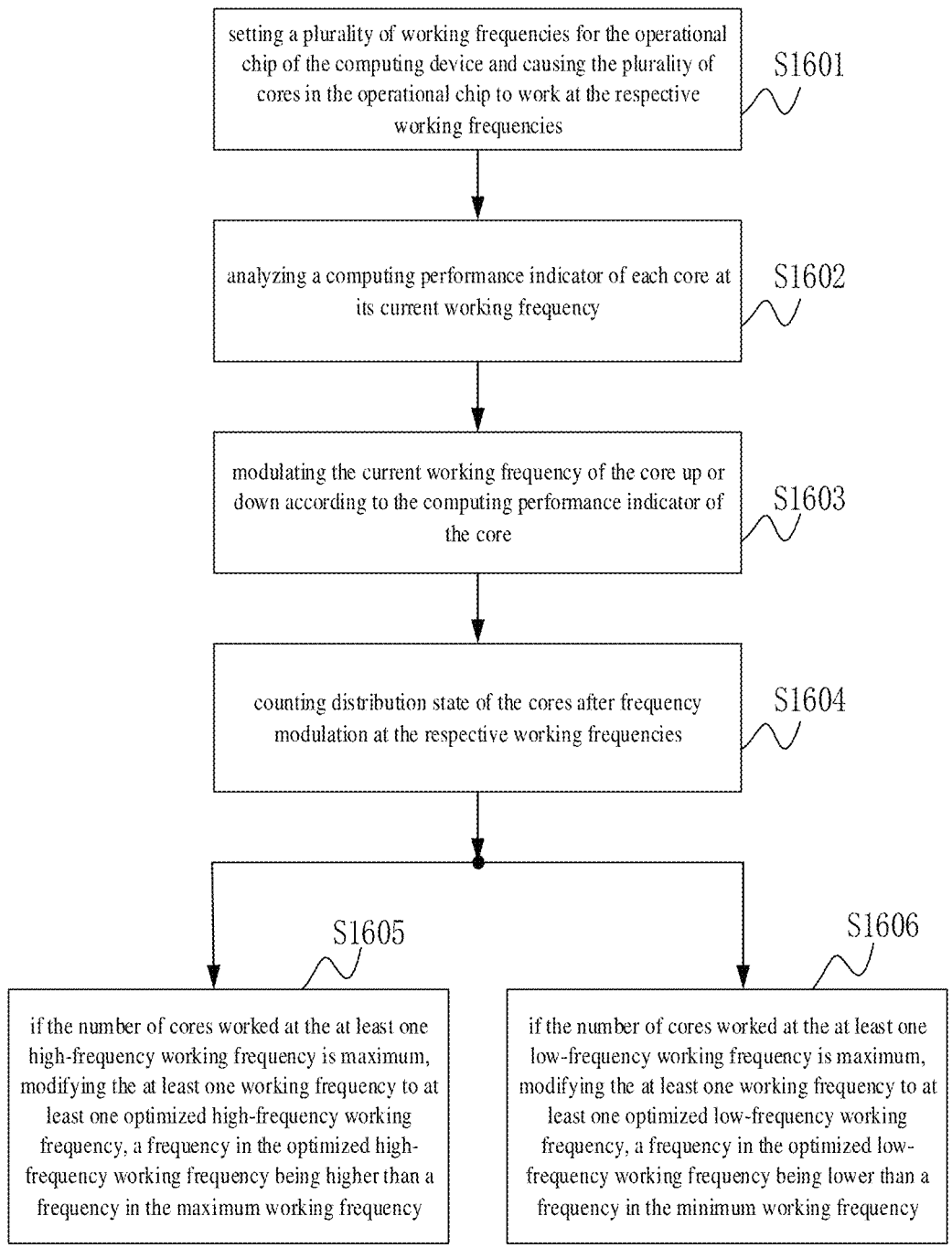
FIG. 16 is a flow diagram two of a preferable chip frequency modulation method of a computing device in the fourth embodiment of the invention.

FIG. 16 is a flow diagram two of a preferable chip frequency modulation method of a computing device in the fourth embodiment of the invention, which can be implemented by the chip frequency modulation apparatus 100 of the computing device. The computing device comprises at least one operational chip, and the operational chip is provided with a plurality of cores. The computing device is preferably for mass operation, such as, operation of mining virtual digital currency. The method comprises steps of:

Step S1601, setting a plurality of working frequencies for the operational chip of the computing device and causing the plurality of cores 80 in the operational chip to work at the respective working frequencies;

Step S1602, analyzing a computing performance indicator of each core 80 at its current working frequency;

Step S1603, modulating the current working frequency of the core 80 up or down according to the computing performance indicator of the core 80;

Step S1604, counting current distribution state of the cores 80 after frequency modulation at the respective working frequencies. The working frequency comprises at least one high-frequency working frequency, at least one middle working frequency and at least one low-frequency working frequency, the maximum frequency in the high-frequency working frequency is a maximum working frequency, the minimum frequency in the low-frequency working frequency is a minimum working frequency.

Step S1605, if the number of cores 80 worked at the at least one high-frequency working frequency is maximum, and may cause that the cores 80 do not play the maximum computing performance (which may be higher), modifying the at least one working frequency to at least one optimized high-frequency working frequency, and a frequency in the optimized high-frequency working frequency is higher than a frequency in the maximum working frequency. The modified working frequency can be a low-frequency working frequency, a middle working frequency and/or a high-frequency working frequency.

For example, six working frequencies 500 MHz, 550 MHz, 600 MHz, 650 MHz, 700 MHz and 750 MHz are set, and the maximum number of the cores 80 is worked at the two high-frequency working frequencies (700 MHz and 750 MHz), so the two low-frequency working frequencies (500 MHz and 550 MHz) are modified to two optimized high-frequency working frequencies (800 MHz and 850 MHz), or one low-frequency working frequency (500 MHz) and one middle working frequency (600 MHz) are modified to two optimized high-frequency working frequencies (800 MHz and 850 MHz).

Preferably, if the number of cores 80 worked at the maximum working frequency is maximum, the step modifies the one working frequency to the one optimized high-frequency working frequency. The modified working frequency can be a low-frequency working frequency, a middle working frequency and/or a high-frequency working frequency.

For example, when the maximum number of the cores 80 are worked at the maximum working frequency (750 MHz), one low-frequency working frequency (500 MHz) is modified to an optimized high-frequency working frequency (800 MHz), or one middle working frequency (600 MHz) is modified to an optimized high-frequency working frequency (800 MHz), or the maximum working frequency (750 MHz) is modified to an optimized high-frequency working frequency (800 MHz).

Step S1606, if the number of cores 80 worked at the at least one low-frequency working frequency is maximum, and means that the computing capability of the cores 80 is too poor to be insufficient to work at the low-frequency working frequency, modifying the at least one working frequency to at least one optimized low-frequency working frequency, and a frequency in the optimized low-frequency working frequency is lower than a frequency in the minimum working frequency, thereby avoiding the cores 80 with poor computing capability from influencing on the overall computing performance of the operational chip. The step can be omitted, i.e., the at least one working frequency is not modified to at least one optimized low-frequency working frequency.

The modified working frequency can be a low-frequency working frequency, a middle working frequency and/or a high-frequency working frequency.

For example, six working frequencies 500 MHz, 550 MHz, 600 MHz, 650 MHz, 700 MHz and 750 MHz are set, and the maximum number of the cores 80 is worked at the two low-frequency working frequencies (500 MHz and 550 MHz), so the two low-frequency working frequencies (500 MHz and 550 MHz) are modified to two optimized low-frequency working frequencies (400 MHz and 450 MHz), or one low-frequency working frequency (500 MHz) and one middle working frequency (600 MHz) are modified to two optimized low-frequency working frequencies (400 MHz and 450 MHz).

Preferably, if the number of cores 80 worked at the minimum working frequency is maximum, the step modifies the one working frequency to the one optimized low-frequency working frequency. The modified working frequency can be a low-frequency working frequency, a middle working frequency and/or a high-frequency working frequency. For example, when the maximum number of the cores 80 are worked at the minimum working frequency (500 MHz), one low-frequency working frequency (500 MHz) is modified to an optimized low-frequency working frequency (450 MHz), or one middle working frequency (600 MHz) is modified to an optimized low-frequency working frequency (450 MHz), or the maximum working frequency (750 MHz) is modified to an optimized low-frequency working frequency (450 MHz).

Preferably, after the Step S1606, the Method Further Comprises:

if the cores 80 exceeding a predetermined fourth ratio are worked at the at least one middle working frequency, stopping modulating the frequency in the working frequency; or if the number of cores 80 worked at the at least one middle working frequency is maximum, stopping modulating the frequency in the working frequency.

In one specific application embodiment of the invention, six phase locked loops 70 are used, and six working frequencies 500 MHz, 550 MHz, 600 MHz, 650 MHz, 700 MHz and 750 MHz are set.

The number of cores distributed at the respective corresponding frequencies as counted by four hash boards is as follows:

Hash board 0: [294 26 96 224 1023 1665]
Hash board 1: [274 47 111 212 963 1721]
Hash board 2: [350 25 153 369 1381 1050]
Hash board 3: [488 33 184 367 1342 950]

Taking the four hash boards 0-3 for example, as shown in FIG. 7, data substantially conforms to a normal distribution, and the minimum working frequency (500 MHz) is the minimum frequency where the single core 80 is worked, and is unable to be modulated down (if the error ratio is too high, it can consider closing the minimum frequency). If the number of cores 80 accumulated at the maximum working frequency (750 MHz) is maximum, it means not playing the maximum efficiency (which may be higher), and the entire operational chip has further room for improvement. A relative ideal state is that over the predetermined ratio (e.g., 50%) or the maximum number of cores 80 falls into one or more middle working frequencies, such as, the third working frequency (600 MHz). To fully use the computing performance of the cores 80, a long tail at the high performance side, rather than a long tail at the low frequency, shall be considered.

Figure 17:
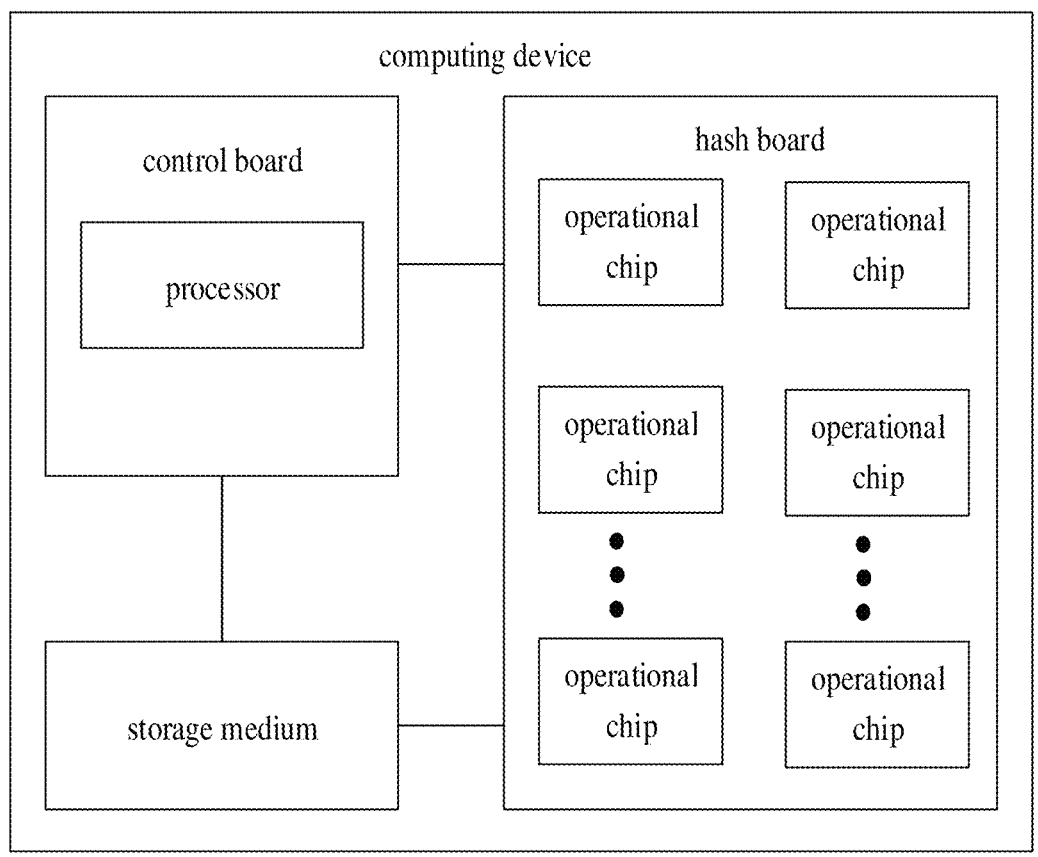
FIG. 17 is a structural diagram of a computing device according to the invention.

Taking the hash boards 0-1 for example, it can be seen that if the frequency 600 MHz is removed, generally, one hundred cores 80 fall at the frequency 550 MHz, and the current frequency is obviously in a left low-frequency region. Therefore, right shift as a whole is more suitable, i.e., a whole shifting way. If the frequency 550 MHz is set to right as a whole to above the frequency 800 MHz through the phase locked loops 70, it is expected that several hundreds of the cores 80 are improved over 800 MHz, thereby improving the overall computing performance The invention further provides a storage medium for storing a computer program executing the chip frequency modulation method of the computing device in any one of FIGS. 8 to 16. For example, when computer program instructions are executed by computers, the method and/or the technical solution of the application can be invoked or provided through operation of the computers. Moreover, the program instructions for invoking the method of the application may be stored in a fixed or removable storage medium, and/or transmitted and/or stored in a storage of the computing device run by the program instructions through broadcast or data flow in other signal carrier media. Herein, according to that one embodiment of the application comprises one computing device shown in FIG. 17, the computing device preferably comprises a control board, and at least one hash board connected to the control board. The control board is provided with a processor, the hash board is provided with a plurality of operational chips for operation, and the operational chips are provided with a plurality of cores. The device comprises a storage medium for storing computer program instructions and a processor for executing the program instructions. When the computer program instructions are executed by the processor, the computing device is triggered to execute the method and/or the technical solution in the foregoing multiple embodiments.

It shall be noticed that the application is implementable in software and/or a combination of software and hardware. For example, the application is implementable in application-specific integrated circuits (ASICs), general-purpose computers or any other similar hardware equipment. In one embodiment, the software program of the application can be executed by the processor to implement the foregoing steps or functions. Similarly, the software program (including relevant data structure) of the application can be stored in a computer readable recording medium, such as, RAM memory, magnetic or optical driver, or floppy disk, or similar equipment. In addition, some steps or functions of the application are implementable using hardware, such as, circuits working together with the processor to execute the respective steps or functions.

The method of the invention can be implemented as a computer implementing method on computers, or special hardware, or a combination thereof. Executable codes or portions according to the method of the invention can be stored on computer program products. Examples of the computer program products include storage devices, optical storage devices, integrated circuits, servers, online software, and the like. Preferably, the computer program products include non-temporary program code units stored on a computer readable medium for executing the method of the invention when the program products are executed on the computers.

In one preferable embodiment, the computer program comprises computer program code units suitable for executing all steps in the method of the invention when the computer program is run on the computers. Preferably, the computer program is embodied on the computer readable medium.

To sum up, the invention automatically modulates frequencies of the cores of the operational chip of the computing device, firstly sets a plurality of suitable working frequencies and causes the plurality of cores in the operational chip to work at the respective working frequencies, and then modulates the current working frequency of the core up or down according to the computing performance indicator of each core at the current working frequency, that is, modulating the core with high computing performance up, and modulating the core with low computing performance down. Therefore, the invention can automatically modulate a frequency corresponding to each core according to the actual computing performance of each core in the operational chip of the computing device, thereby maximizing the computing performance of the cores and improving the operational performance of the operational chip and the overall operational device.

Of course, the invention also may have various other embodiments, and those skilled in the art shall make various corresponding modifications and variations according to the invention without departing from spirit and essence of the invention, but these corresponding modifications and variations shall belong to the scope protected by the appended claims of the invention.

INDUSTRIAL APPLICABILITY

Application of the chip frequency modulation method and apparatus of the computing device, the hash board, the computing device and the storage medium of the invention has the following advantageous effects:

automatically modulating a frequency corresponding to each core according to the actual computing performance of each core in the operational chip of the computing device, thereby maximizing the computing performance of the cores and improving the operational performance of the operational chip and the overall operational device.

What is claimed is:

1. A chip frequency modulation method of a computing device, the computing device provided with at least one operational chip, and the operational chip provided with a plurality of cores, comprising:

setting a plurality of working frequencies of each of the plurality of cores of the operational chip of the computing device and causing each of the plurality of cores in the operational chip to work at a current working frequency to compute one or more Nonces, wherein the current working frequency is one of the plurality of working frequencies;

receiving, from each of the plurality of cores, the one or more Nonces computed at the current working frequency;

for each of the plurality of cores, analyzing a computing performance indicator of correctness of the one or more Nonces computed at the current working frequency; and for at least one of the plurality of cores, modulating the current working frequency of the at least one core up or down to a different working frequency of the plurality of working frequencies that is higher or lower than the current working frequency according to the computing performance indicator.

2. The chip frequency modulation method according to claim 1, wherein:

the setting a plurality of working frequencies of each of the plurality of cores off the operational chip of the computing device and causing each of the plurality of cores in the operational chip to work at a current working frequency comprises:

setting the plurality of working frequencies for the operational chip through a plurality of phase locked loops, the working frequencies and the phase locked loops being in a one-to-one correspondence relationship; and the modulating the current working frequency of the at least one core up or down to a different working frequency of the plurality of working frequencies that is higher or lower than the current working frequency according to the computing performance indicator comprises:

modulating the current working frequency up or down through the phase locked loops according to the computing performance indicator.

3. The chip frequency modulation method according to claim 2, wherein the phase locked loops are provided inside or outside the operational chip.

4. The chip frequency modulation method according to claim 1, wherein:

the analyzing a computing performance indicator of correctness of the one or more Nonces computed at the current working frequency comprises:

analyzing whether the computing performance indicator reaches a first, second, and/or third indicator thresholds within a modulation period, the first indicator threshold being the same as or different from the second indicator threshold; and the modulating the current working frequency of the at least one core up or down to a different working frequency of the plurality of working frequencies that is higher or lower than the current working frequency according to the computing performance indicator comprises:

when the computing performance indicator reaches the first indicator threshold, modulating the current working frequency up to an upper working frequency of the plurality of working frequencies that is higher than the current working frequency;

when the computing performance indicator of the core does not reach the second indicator threshold, modulating the current working frequency of the core down to a lower working frequency of the plurality of working frequencies that is lower than the current working frequency; or when the computing performance indicator reaches the third indicator threshold, modulating the current working frequency down to the lower working frequency.

5. The chip frequency modulation method according to claim 1, further comprising:

when a portion of the cores work at one or more optimized working frequencies exceed a first ratio, stopping modulating frequencies of the cores; or when a portion of the cores worked at the one or more optimized working frequencies is majority, stopping modulating the frequencies of the cores.

6. The chip frequency modulation method according to claim 1, wherein:

the analyzing a computing performance indicator of correctness of the one or more Nonces computed at the current working frequency comprises:

analyzing whether a computing correct ratio reaches a first or second correct ratio thresholds within a modulation period, the first correct ratio threshold being the same or different from the second correct ratio threshold; and the modulating the current working frequency of the at least one core up or down to a different working frequency of the plurality of working frequencies that is higher or lower than the current working frequency according to the computing performance indicator comprises:

when the computing correct ratio reaches the first correct ratio threshold, modulating the current working frequency up to an upper working frequency of the plurality of working frequencies that is higher than the current working frequency; or when the computing correct ratio does not reach the second correct ratio threshold, modulating the current working frequency down to a lower working frequency of the plurality of working frequencies that is lower than the current working frequency.

7. The chip frequency modulation method according to claim 6, wherein:

the analyzing whether a computing correct ratio reaches a first or second correct ratio thresholds within a modulation period further comprises:

analyzing whether random numbers submitted by the at least one core are correct within the modulation period;

counting a number of correct random numbers and a number of wrong random numbers of the core within the modulation period;

computing a computing correct ratio of the random numbers within the modulation period according to the number of correct random numbers and the number of wrong random numbers, and judging whether the computing correct ratio of the random numbers reaches the first or second correct ratio thresholds; and the modulating the current working frequency of the at least one core up or down to a different working frequency of the plurality of working frequencies that is higher or lower than the current working frequency according to the computing performance indicator further comprises:

when the computing correct ratio of the random numbers reaches the first correct ratio threshold, modulating the current working frequency of the core up to the upper working frequency; or when the computing correct ratio of the random numbers does not reach the second correct ratio threshold, modulating the current working frequency of the core down to the lower working frequency.

8. The chip frequency modulation method according to claim 7, wherein the analyzing whether random numbers submitted by the at least one core are correct within the modulation period further comprises:
   computing, via the at least one core, a first result from the random numbers through an algorithm when the core submits one random number within the modulation period, the first result including a first feature;
   computing, via the operational chip, a second result from the random numbers through the algorithm, the second result including a second feature; and
   when the first feature is the same as the second feature, judging, via the operational chip, that the random numbers are the correct random numbers, or when the first feature is not the same as the second feature, judging that the random numbers are the wrong random numbers.

9. The chip frequency modulation method according to claim 6, wherein:
   the analyzing whether a computing correct ratio reaches a first or second correct ratio thresholds within a modulation period further comprises:
      analyzing whether the computing correct ratio within the modulation period reaches the first correct ratio threshold and the second correct ratio threshold according to a modulating instruction;
      analyzing whether the computing correct ratio within the modulation period reaches the first correct ratio threshold and the second correct ratio threshold according to a timed modulating instruction within a modulation time period set by the timed modulating instruction; or
      analyzing whether the computing correct ratio within the modulation period reaches the first correct ratio threshold and the second correct ratio threshold according to a received immediate modulating instruction; and
   the modulating the current working frequency of the at least one core up or down to a different working frequency of the plurality of working frequencies that is higher or lower than the current working frequency according to the computing performance indicator further comprises:
      when the computing correct ratio within the modulation period reaches the first correct ratio threshold, modulating the current working frequency up to the upper working frequency; or when the computing correct ratio within the modulation period does not reach the second correct ratio threshold, modulating the current working frequency down to the lower working frequency; or
      when the computing correct ratio within the modulation period reaches the first correct ratio threshold in the modulation time period, modulating the current working frequency up to the upper working frequency; or when the computing correct ratio within the modulation period does not reach the second correct ratio threshold in the modulation time period, modulating the current working frequency down to the lower working frequency; or
      according to the received immediate modulating instruction, when the computing correct ratio within the modulation period reaches the first correct ratio threshold, modulating the current working frequency up to the upper working frequency; or when the computing correct ratio within the modulation period does not reach the second correct ratio threshold, modulating the current working frequency down to the lower working frequency; or according to a received stop modulating instruction, stopping modulating the current working frequency.

10. The chip frequency modulation method according to claim 1, wherein:
   the analyzing a computing performance indicator of correctness of the one or more Nonces computed at the current working frequency comprises:
      analyzing whether each computation of the at least one core is correct;
      adding a computing correct weight value to a reference node value every time when the at least one core computes correctly at least once, and deducting a computing wrong weight value from the reference node value every time when the at least one core computes wrongly at least once; and
      judging whether a current reference node value of the at least one core reaches a computing correct threshold or a computing wrong threshold; and
   the modulating the current working frequency of the at least one core up or down to a different working frequency of the plurality of working frequencies that is higher or lower than the current working frequency according to the computing performance indicator of the core comprises:
      when the current reference node value reaches the computing correct threshold, modulating the current working frequency of the core up to an upper working frequency of the plurality of working frequencies that is higher than the current working frequency; or
      when the current reference node value reaches the computing wrong threshold, modulating the current working frequency of the core down to a lower working frequency of the plurality of working frequencies that is lower than the current working frequency.

11. A chip frequency modulation apparatus of a computing device, the computing device provided with at least one operational chip, and the operational chip provided with a plurality of cores, wherein the chip frequency modulation apparatus comprises a processor and a non-transitory computer storage medium storing instructions that, when executed by the processor, cause the chip frequency modulation apparatus to perform operations comprising:
   setting a plurality of working frequencies of each of the plurality of cores of the operational chip of the computing device and causing each of the plurality of cores in the operational chip to work at a current working frequency to compute one or more Nonces, wherein the current working frequency is one of the plurality of working frequencies;
   receiving, from each of the plurality of cores, the one or more Nonces computed at the current working frequency;
   for each of the plurality of cores, analyzing a computing performance indicator of correctness of the one or more Nonces computed at the current working frequency; and
   for at least one of the plurality of cores, modulating the current working frequency of the at least one core up or down to a different working frequency of the plurality of working frequencies that is higher or lower than the current working frequency according to the computing performance indicator.

12. The chip frequency modulation apparatus according to claim 11, wherein:
the setting a plurality of working frequencies of each of the plurality of cores of the operational chip of the computing device and causing each of the plurality of cores in the operational chip to work at a current working frequency comprises:
setting the plurality of working frequencies for the operational chip through a plurality of phase locked loops, the working frequencies and the phase locked loops being in a one-to-one correspondence relationship; and
the modulating the current working frequency of the at least one core up or down to a different working frequency of the plurality of working frequencies that is higher or lower than the current working frequency according to the computing performance indicator comprises:
modulating the current working frequency up or down through the phase locked loops according to the computing performance indicator.

13. The chip frequency modulation apparatus according to claim 12, wherein the phase locked loops are provided inside or outside the operational chip.

14. The chip frequency modulation apparatus according to claim 11, wherein:
the analyzing a computing performance indicator of correctness of the one or more Nonces computed at the current working frequency comprises:
analyzing whether the computing performance indicator reaches a first, second, or third indicator thresholds within a modulation period, the first indicator threshold being the same as or different from the second indicator threshold; and
the modulating the current working frequency of the at least one core up or down to a different working frequency of the plurality of working frequencies that is higher or lower than the current working frequency according to the computing performance indicator comprises:
when the computing performance indicator reaches the first indicator threshold, modulating the current working frequency up to an upper working frequency of the plurality of working frequencies that is higher than the current working frequency;
when the computing performance indicator does not reach the second indicator threshold, modulating the current working frequency down to a lower working frequency of the plurality of working frequencies that is lower than the current working frequency; or
when the computing performance indicator reaches the third indicator threshold, modulating the current working frequency down to the lower working frequency.

15. The chip frequency modulation apparatus according to claim 11, wherein the operations further comprises:
when a portion of the cores work at one or more optimized working frequencies exceed a first ratio, stopping modulating frequencies of the cores; or
when a portion of the cores work at the one or more optimized working frequencies is majority, stopping modulating the frequencies of the cores.

16. The chip frequency modulation apparatus according to claim 11, wherein:
the analyzing a computing performance indicator of correctness of the one or more Nonces computed at the current working frequency comprises:
analyzing whether a computing correct ratio reaches a first or second correct ratio thresholds within a modulation period, the first correct ratio threshold being the same or different from the second correct ratio threshold; and
the modulating the current working frequency of the at least one core up or down to a different working frequency of the plurality of working frequencies that is higher or lower than the current working frequency according to the computing performance indicator comprises:
when the computing correct ratio reaches the first correct ratio threshold, modulating the current working frequency up to an upper working frequency of the plurality of working frequencies that is higher than the current working frequency; or
when the computing correct ratio does not reach the second correct ratio threshold, modulating the current working frequency down to a lower working frequency of the plurality of working frequencies that is lower than the current working frequency.

17. The chip frequency modulation apparatus according to claim 16:
the analyzing whether a computing correct ratio reaches a first or second correct ratio threshold within a modulation period further comprises:
analyzing whether random numbers submitted by the at least one core are correct within the modulation period;
counting a number of correct random numbers and a number of wrong random numbers of the core within the modulation period;
computing a computing correct ratio of the random numbers within the modulation period according to the number of correct random numbers and the number of wrong random numbers, and
judging whether the computing correct ratio of the random numbers reaches the first or second correct ratio thresholds; and
the modulating the current working frequency of the at least one core up or down to a different working frequency of the plurality of working frequencies that is higher or lower than the current working frequency according to the computing performance indicator further comprises:
when the computing correct ratio of the random numbers reaches the first correct ratio threshold, modulating the current working frequency of the core up to the upper working frequency; or
when the computing correct ratio of the random numbers does not reach the second correct ratio threshold, modulating the current working frequency down to the lower working frequency.

18. The chip frequency modulation apparatus according to claim 17, wherein the analyzing whether random numbers submitted by the at least one core are correct within the modulation period further comprises:
computing a first result from the random numbers through an algorithm when the core submits one random number within the modulation period, the first result including a first feature; and
computing a second result from the random numbers through the algorithm, the second result including a second feature; and when the first feature is the same as the second feature, judging that the random number is the correct random number, or when the first feature is not the same as the second feature, judging that the random number is the wrong random number.

19. The chip frequency modulation apparatus according to claim 16, wherein:
the analyzing whether a computing correct ratio reaches a first or second correct ratio threshold within a modulation period comprises:
analyzing whether the computing correct ratio within the modulation period reaches the first correct ratio threshold and the second correct ratio threshold according to a modulating instruction;
analyzing whether the computing correct ratio within the modulation period reaches the first correct ratio threshold and the second correct ratio threshold according to a timed modulating instruction within a modulation time period set by the timed modulating instruction; or
analyzing whether the computing correct ratio within the modulation period reaches the first correct ratio threshold and the second correct ratio threshold according to a received immediate modulating instruction; and
the modulating the current working frequency of the at least one core up or down to a different working frequency of the plurality of working frequencies that is higher or lower than the current working frequency according to the computing performance indicator comprises:
when the computing correct ratio within the modulation period reaches the first correct ratio threshold, modulating the current working frequency up to the upper working frequency; or when the computing correct ratio within the modulation period does not reach the second correct ratio threshold, modulating the current working frequency down to the lower working frequency;
when the computing correct ratio within the modulation period reaches the first correct ratio threshold in the modulation time period, modulating the current working frequency up to the upper working frequency; or when the computing correct ratio within the modulation period does not reach the second correct ratio threshold in the modulation time period, modulating the current working frequency down to the lower working frequency; or
according to the received immediate modulating instruction, when the computing correct ratio within the modulation period reaches the first correct ratio threshold, modulating the current working frequency up to the upper working frequency or when the computing correct ratio within the modulation period does not reach the second correct ratio threshold, modulating the current working frequency down to the lower working frequency; or according to a received stop modulating instruction, stopping modulating the current working frequency.

20. The chip frequency modulation apparatus according to claim 11, wherein:
the analyzing a computing performance indicator of correctness of the one or more Nonces computed at the current working frequency comprises:
analyzing whether each computation of the at least one core is correct;
adding a computing correct weight value to a reference node value every time when the at least one core computes correctly at least once, and deducting a computing wrong weight value from the reference node value every time when the at least one core computes wrongly at least once; and
judging whether a current reference node value of the at least one core reaches a computing correct threshold or a computing wrong threshold; and
the modulating the current working frequency of the at least one core up or down to a different working frequency of the plurality of working frequencies that is higher or lower than the current working frequency according to the computing performance indicator of the core comprises:
when the current reference node value reaches the computing correct threshold, modulating the current working frequency of the core up to an upper working frequency of the plurality of working frequencies that is higher than the current working frequency; or
when the current reference node value reaches the computing wrong threshold, modulating the current working frequency of the core down to a lower working frequency of the plurality of working frequencies that is lower than the current working frequency.

21. The chip frequency modulation apparatus according to claim 11, wherein the chip frequency modulation apparatus is disposed in a hash board.

22. The chip frequency modulation apparatus according to claim 11, wherein the chip frequency modulation apparatus is disposed in a computing device.

23. A chip frequency modulation apparatus of a computing device, the computing device provided with at least one operational chip, and the operational chip provided with a plurality of cores, wherein the chip frequency modulation apparatus comprises a processor and a non-transitory computer storage medium storing instructions that, when executed by the processor, cause the chip frequency modulation apparatus to perform operations comprising:
setting a plurality of working frequencies for the operational chip of the computing device and causing the plurality of cores in the operational chip to work at the respective working frequencies;
analyzing whether random numbers submitted by each core within a modulation period are correct;
counting a number of correct random numbers and a number of wrong random numbers within the modulation period;
computing a computing correct ratio of the random numbers of the core within the modulation period according to the number of correct random numbers and the number of wrong random numbers;
judging whether the computing correct ratio of the random numbers reaches a first or second correct ratio threshold within the modulation period to determine a computing performance indicator of the core at a current working frequency, the first correct ratio threshold being the same or different from the second correct ratio threshold; and
when the computing correct ratio reaches the first correct ratio threshold, modulating the current working frequency of the core up to an upper working frequency according to the computing performance indicator; or
when the computing correct ratio of the core does not reach the second correct ratio threshold, modulating the current working frequency of the core down to a lower working frequency according to the computing performance indicator.

24. A chip frequency modulation method of a computing device, the computing device provided with at least one operational chip, and the operational chip provided with a plurality of cores, comprising:
- setting a plurality of working frequencies for the operational chip of the computing device and causing the plurality of cores in the operational chip to work at the respective working frequencies;
- analyzing whether random numbers submitted by each core within a modulation period are correct;
- counting a number of correct random numbers and a number of wrong random numbers within the modulation period;
- computing a computing correct ratio of the random numbers within the modulation period according to the number of correct random numbers and the number of wrong random numbers;
- judging whether the computing correct ratio of the random numbers reaches a first or second correct ratio threshold within the modulation period to determine a computing performance indicator of the core at a current working frequency of the core, the first correct ratio threshold being the same or different from the second correct ratio threshold; and
- when the computing correct ratio of the core reaches the first correct ratio threshold, modulating the current working frequency of the core up to an upper working frequency according to the computing performance indicator; or
- when the computing correct ratio of the core does not reach the second correct ratio threshold, modulating the current working frequency of the core down to a lower working frequency according to the computing performance indicator.

25. A chip frequency modulation apparatus of a computing device, the computing device provided with at least one operational chip, and the operational chip provided with a plurality of cores, wherein the chip frequency modulation apparatus comprises a processor and a non-transitory computer storage medium storing instructions that, when executed by the processor, cause the chip frequency modulation apparatus to perform operations comprising:
- setting a plurality of working frequencies for the operational chip of the computing device and causing the plurality of cores in the operational chip to work at the respective working frequencies;
- analyzing whether each computation of the core is correct;
- adding a computing correct weight value to a reference node value every time when the core computes correctly at least once, and deducting a computing wrong weight value from the reference node value every time when the core computes wrongly at least once; and
- judging whether a current reference node value of the core reaches a computing correct threshold or a computing wrong threshold to determine a computing performance indicator of each core at a current working frequency of the core;
- when the current reference node value of the core reaches the computing correct threshold, modulating the current working frequency of the core up to an upper working frequency according to the computing performance indicator; or
- when the current reference node value of the core reaches the computing wrong threshold, modulating the current working frequency of the core down to a lower working frequency according to the computing performance indicator.

26. A chip frequency modulation method of a computing device, the computing device provided with at least one operational chip, and the operational chip provided with a plurality of cores, comprising:
- setting a plurality of working frequencies for the operational chip of the computing device and causing the plurality of cores in the operational chip to work at the respective working frequencies;
- analyzing whether each computation of the core is correct;
- adding a computing correct weight value to a reference node value every time when the core computes correctly at least once, and deducting a computing wrong weight value from the reference node value every time when the core computes wrongly at least once; and
- judging whether a current reference node value of the core reaches a computing correct threshold or a computing wrong threshold to determine a computing performance indicator of each core at a current working frequency of the core;
- when the current reference node value of the core reaches the computing correct threshold, modulating the current working frequency of the core up to an upper working frequency according to the computing performance indicator; or
- when the current reference node value of the core reaches the computing wrong threshold, modulating the current working frequency of the core down to a lower working frequency according to the computing performance indicator.

* * * * *

UNITED STATES PATENT AND TRADEMARK OFFICE
CERTIFICATE OF CORRECTION

PATENT NO. : 11,502,693 B2
APPLICATION NO. : 17/250071
DATED : November 15, 2022
INVENTOR(S) : Nangeng Zhang et al.

It is certified that error appears in the above-identified patent and that said Letters Patent is hereby corrected as shown below:

In the Claims

Claim 2, Column 61, Line 18:
"the plurality of cores off the operational chip" should read -- the plurality of cores of the operational chip --.

Claim 4, Column 61, Lines 46-47:
"a first, second, and/or third indicator thresholds within a modulation period" should read -- a first, second, or third indicator threshold within a modulation period --.

Claim 5, Column 62, Line 10:
"when a portion of the cores worked at the one or more" should read -- when a portion of the cores work at the one or more --.

Claim 6, Column 62, Line 20:
"first or second correct ratio thresholds within a modulation period" should read -- first or second correct ratio threshold within a modulation period --.

Claim 7, Column 62, Line 43:
"a first or second correct ratio thresholds within a modulation period" should read -- a first or second correct ratio threshold within a modulation period --.

Claim 7, Column 62, Lines 56-57:
"the first or second correct ratio thresholds;" should read -- the first or second correct ratio threshold; --.

Claim 9, Column 63, Lines 25-26:
"a first or second correct ratio thresholds within a modulation period" should read -- a first or second correct ratio threshold within a modulation period --.

Signed and Sealed this
Nineteenth Day of March, 2024

Katherine Kelly Vidal
*Director of the United States Patent and Trademark Office*

CERTIFICATE OF CORRECTION (continued)
U.S. Pat. No. 11,502,693 B2

Claim 14, Column 65, Lines 34-35:
"a first, second, or third indicator thresholds within a modulation period" should read -- a first, second, or third indicator threshold within a modulation period --.

Claim 16, Column 66, Line 5:
"a first or second correct ratio thresholds within a modulation period" should read -- a first or second correct ratio threshold within a modulation period --.

Claim 17, Column 66, Lines 41-42:
"the first or second correct ratio thresholds;" should read -- the first or second correct ratio threshold; --.

Claim 17, Column 66, Lines 55-56:
"modulating the current working frequency down to the lower working frequency." should read -- modulating the current working frequency of the core down to the lower working frequency. --.

Claim 19, Column 67, Line 10:
"a modulation period comprises:" should read -- a modulation period further comprises: --.

Claim 19, Column 67, Line 31:
"the computing performance indicator comprises:" should read -- the computing performance indicator further comprises: --.

Claim 23, Column 68, Line 49:
"wrong random numbers within the modulation period;" should read -- wrong random numbers of the core within the modulation period; --.

Claim 23, Column 68, Line 59:
"the core at a Current working frequency," should read -- the core at a Current working frequency of the core, --.

Claim 23, Column 68, Line 62:
"when the computing correct ratio reaches the first correct ratio threshold" should read -- when the computing correct ratio of the core reaches the first correct ratio threshold --.

Claim 24, Column 69, Line 15:
"wrong random numbers within the modulation period;" should read -- wrong random numbers of the core within the modulation period; --.

Claim 24, Column 69, Line 18:
"the random numbers within the modulation period according to the" should read -- the random numbers of the core within the modulation period according to the --.